US007817117B2

(12) United States Patent
Kimura

(10) Patent No.: US 7,817,117 B2
(45) Date of Patent: Oct. 19, 2010

(54) SEMICONDUCTOR DEVICE, DISPLAY DEVICE, AND ELECTRONIC DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 809 days.

(21) Appl. No.: 11/695,788

(22) Filed: Apr. 3, 2007

(65) Prior Publication Data
US 2007/0236424 A1 Oct. 11, 2007

(30) Foreign Application Priority Data
Apr. 5, 2006 (JP) .............................. 2006-104191

(51) Int. Cl.
*G09G 3/30* (2006.01)
*G09G 3/32* (2006.01)

(52) U.S. Cl. ....................................................... 345/76
(58) Field of Classification Search ............. 345/72–83, 345/204–214, 55–100; 315/169.1–169.3
See application file for complete search history.

(56) References Cited

U.S. PATENT DOCUMENTS

| | | | |
|---|---|---|---|
| 5,684,365 A | 11/1997 | Tang et al. | |
| 5,956,011 A | 9/1999 | Koyama et al. | |
| 6,037,924 A | 3/2000 | Koyama et al. | |
| 6,310,598 B1 | 10/2001 | Koyama et al. | |
| 6,608,613 B2 | 8/2003 | Koyama et al. | |
| 6,839,057 B2 * | 1/2005 | Iguchi ........................ | 345/204 |
| 6,928,136 B2 | 8/2005 | Nagao et al. | |
| 6,958,750 B2 | 10/2005 | Azami et al. | |
| 6,975,142 B2 | 12/2005 | Azami et al. | |
| 7,068,076 B2 | 6/2006 | Azami | |
| 7,129,917 B2 | 10/2006 | Yamazaki et al. | |
| 7,151,278 B2 | 12/2006 | Nagao et al. | |
| 7,327,357 B2 * | 2/2008 | Jeong ......................... | 345/204 |
| 7,502,001 B2 * | 3/2009 | Fish et al. ...................... | 345/81 |
| 7,714,813 B2 | 5/2010 | Uchino et al. | |

(Continued)

FOREIGN PATENT DOCUMENTS

EP     0 717 446 A2     6/1996

(Continued)

OTHER PUBLICATIONS

J.H. Jung et al.; "49.1: A 14.1 inch Full Color AMOLED Display with Top Emission Structure and a-Si TFT Backplane"; *SID 05 Digest*; pp. 1538-1541; 2005.

(Continued)

*Primary Examiner*—David L Lewis
(74) *Attorney, Agent, or Firm*—Fish & Richardson P.C.

(57) ABSTRACT

A pixel includes a load, a transistor which controls a current supplied to the load, a storage capacitor, and first to fourth switches. By inputting a potential in accordance with a video signal into the pixel after the threshold voltage of the transistor is held in the storage capacitor, and holding a voltage of the sum of the threshold voltage and the potential, variations of a current value caused by variations of threshold voltage of a transistor can be suppressed. Consequently, a predetermined current can be supplied to the load such as a light-emitting element. Further, by changing the potential of a power supply line, a display device with a high duty ratio can be provided.

78 Claims, 53 Drawing Sheets

U.S. PATENT DOCUMENTS

| | | |
|---|---|---|
| 2003/0090481 A1 | 5/2003 | Kimura |
| 2003/0117352 A1 | 6/2003 | Kimura |
| 2003/0132931 A1 | 7/2003 | Kimura et al. |
| 2003/0137503 A1 | 7/2003 | Kimura et al. |
| 2004/0080474 A1 | 4/2004 | Kimura |
| 2004/0174349 A1 | 9/2004 | Libsch et al. |
| 2004/0174354 A1 | 9/2004 | Ono et al. |
| 2006/0082528 A1* | 4/2006 | Guo et al. .................... 345/82 |
| 2007/0126664 A1* | 6/2007 | Kimura ....................... 345/76 |
| 2007/0126665 A1* | 6/2007 | Kimura ....................... 345/76 |

FOREIGN PATENT DOCUMENTS

| | | |
|---|---|---|
| EP | 1 632 930 A1 | 3/2006 |
| JP | 08-234683 | 9/1996 |
| JP | 2004-280059 | 10/2004 |
| JP | 2004-295131 | 10/2004 |
| JP | 2005-189643 | 7/2005 |
| JP | 2006-215275 | 8/2006 |
| WO | 2004/109639 A1 | 12/2004 |

OTHER PUBLICATIONS

Office Action, Chinese Application No. 200710089824.0; CN09555) mailed Jun. 10, 2010, 8 pages (with English translation).

* cited by examiner

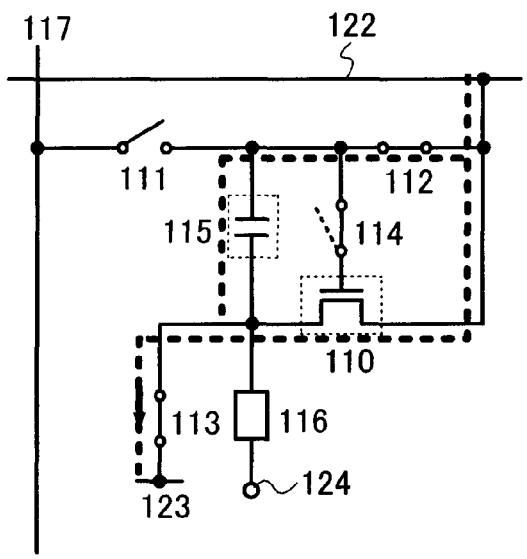
FIG. 3A initialization
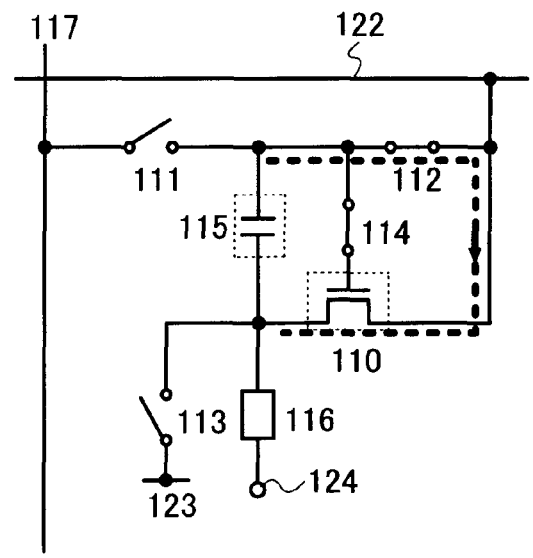
FIG. 3B threshold voltage writing
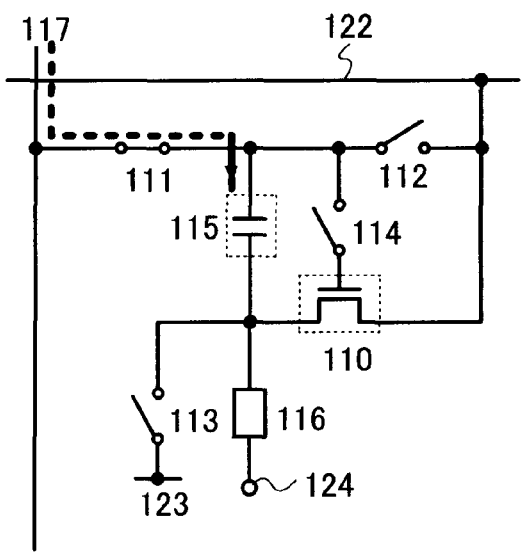
FIG. 3C data writing
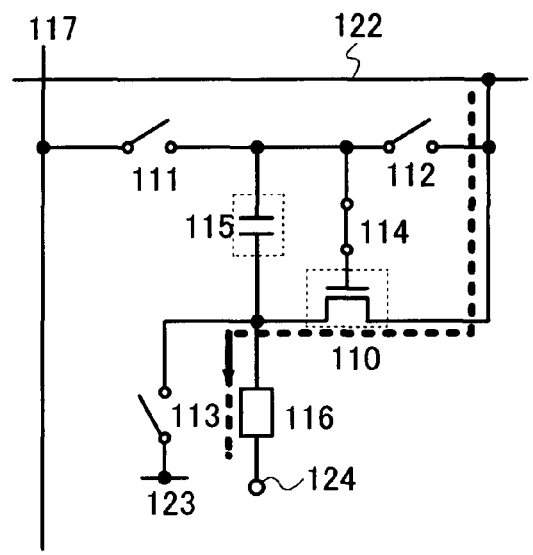
FIG. 3D light-emitting

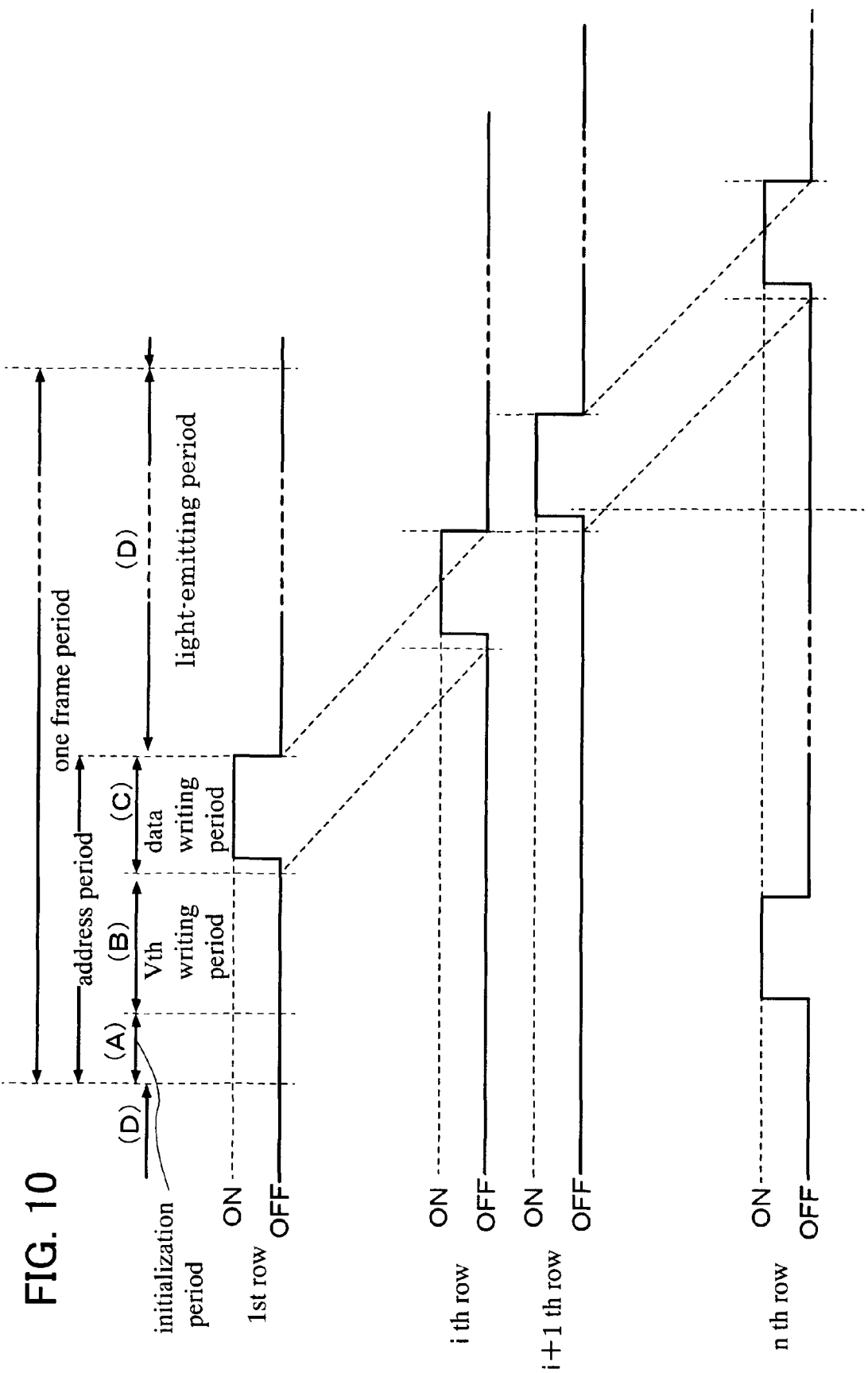

direction of light-emitting direction of light-emitting direction of light-emitting direction of light-emitting

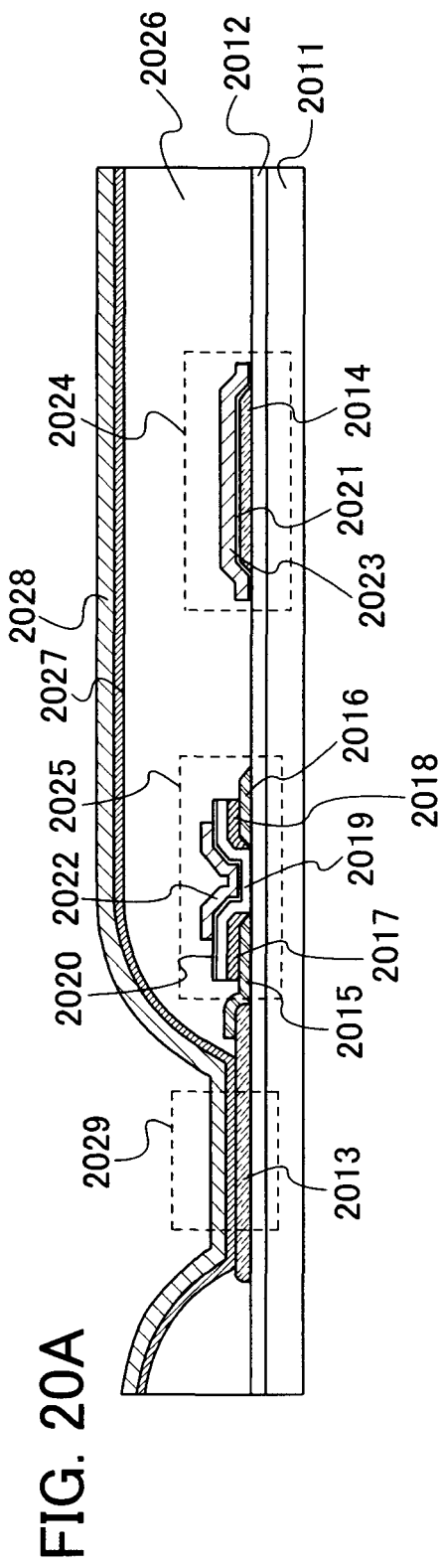
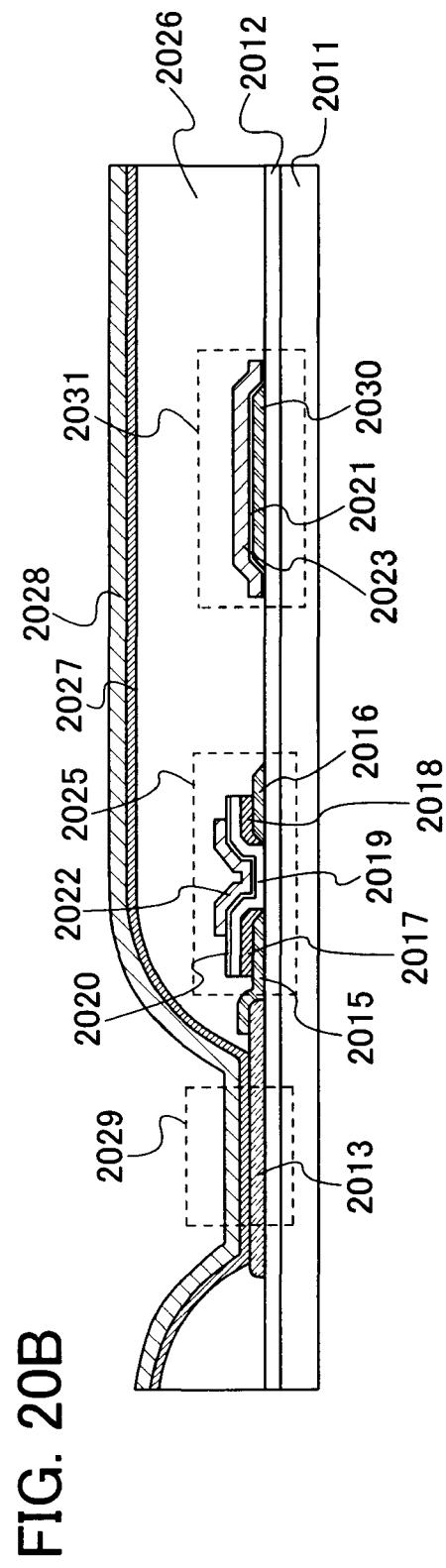

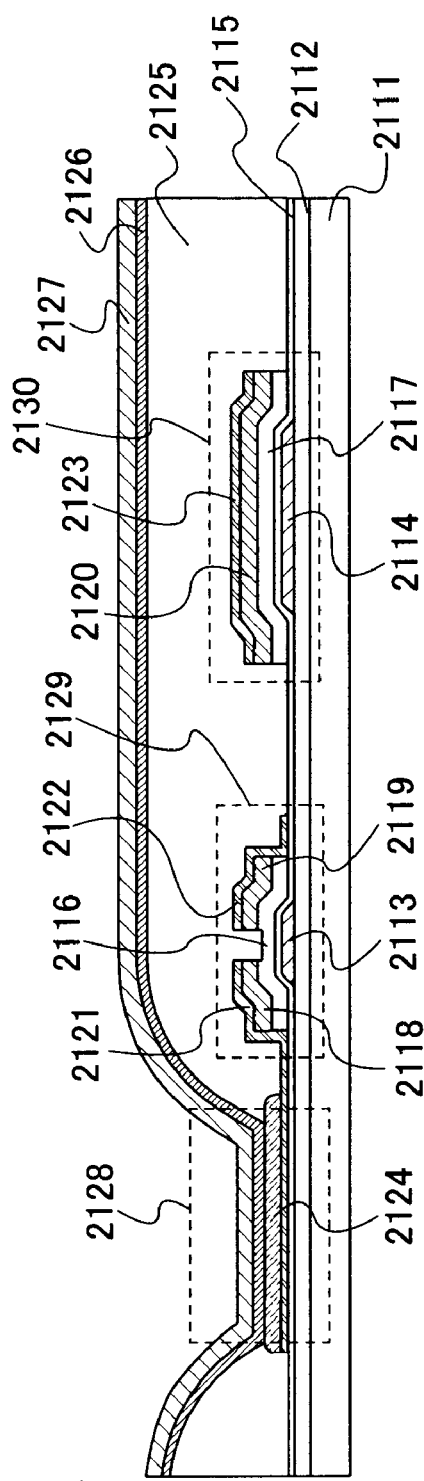
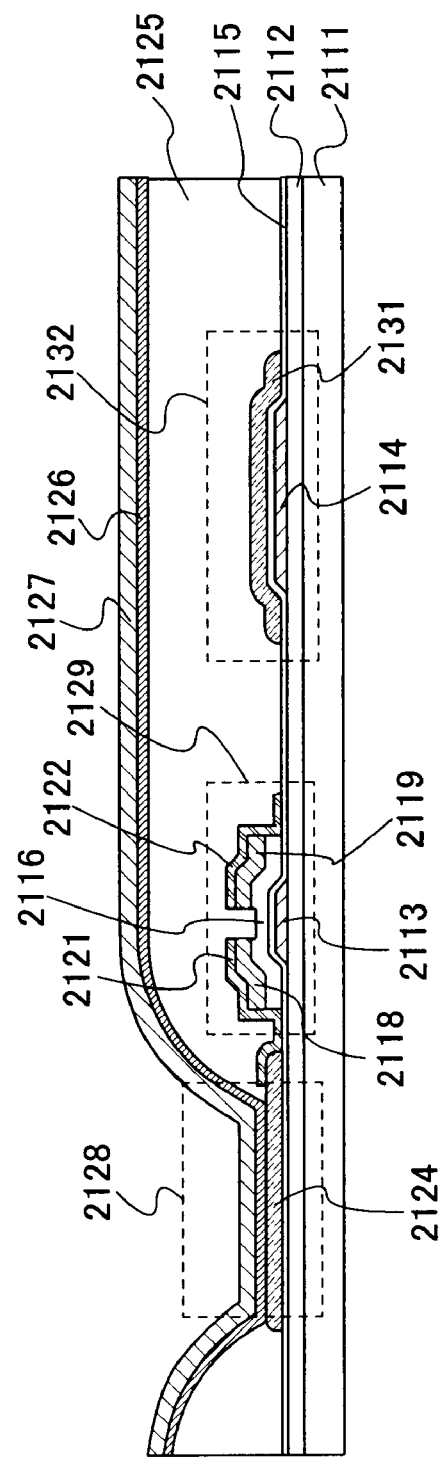
FIG. 21A
FIG. 21B

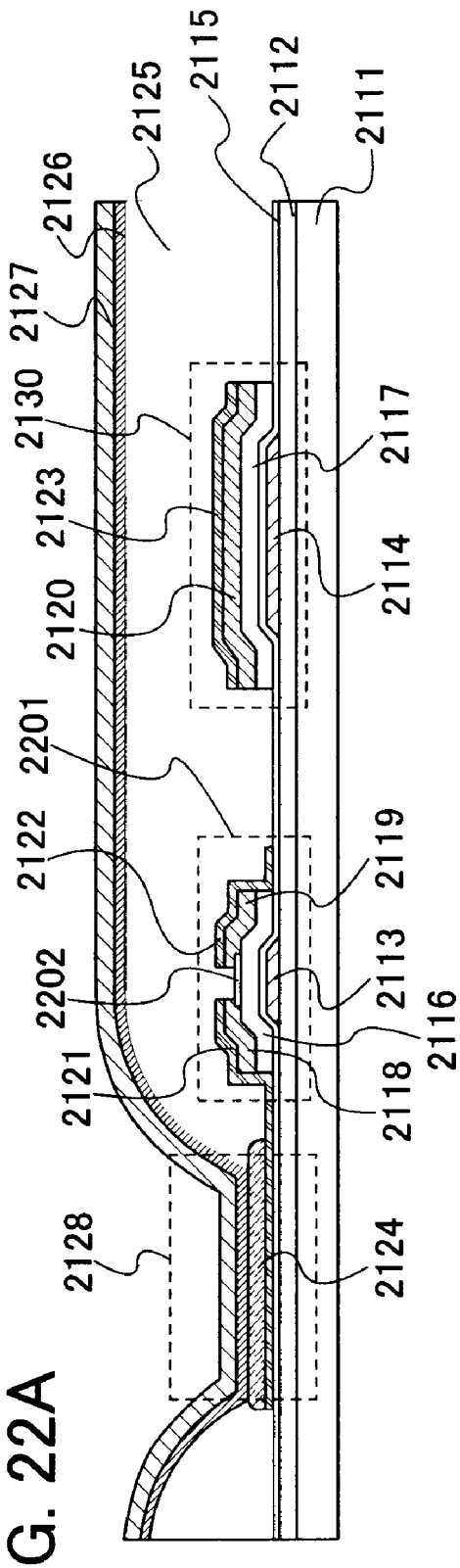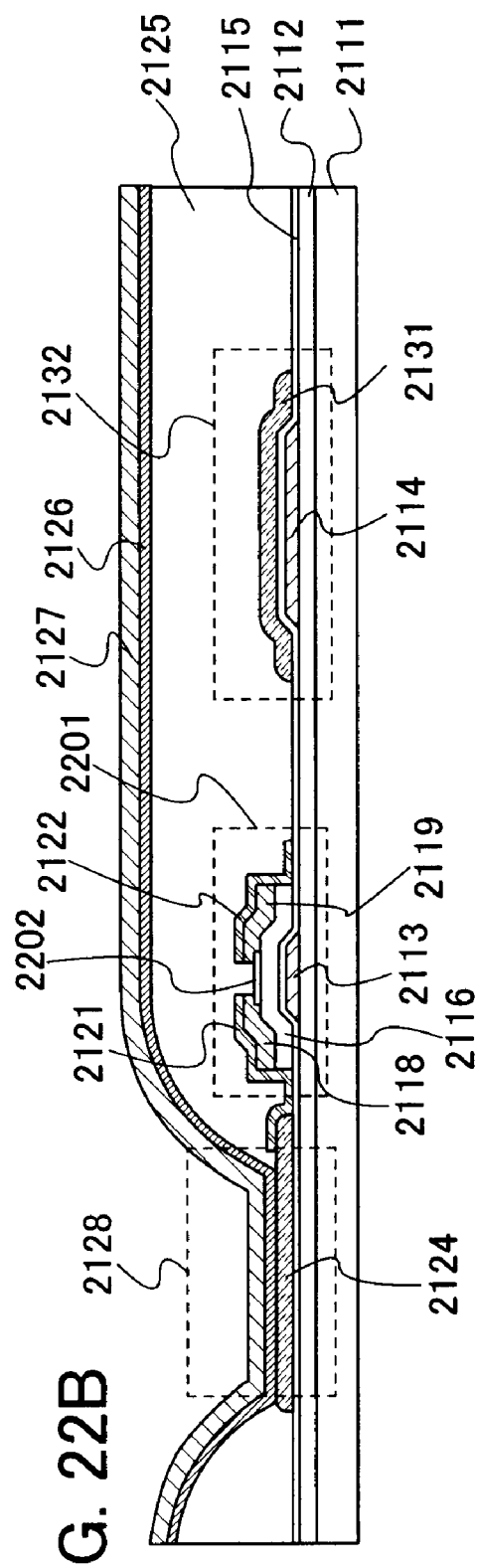

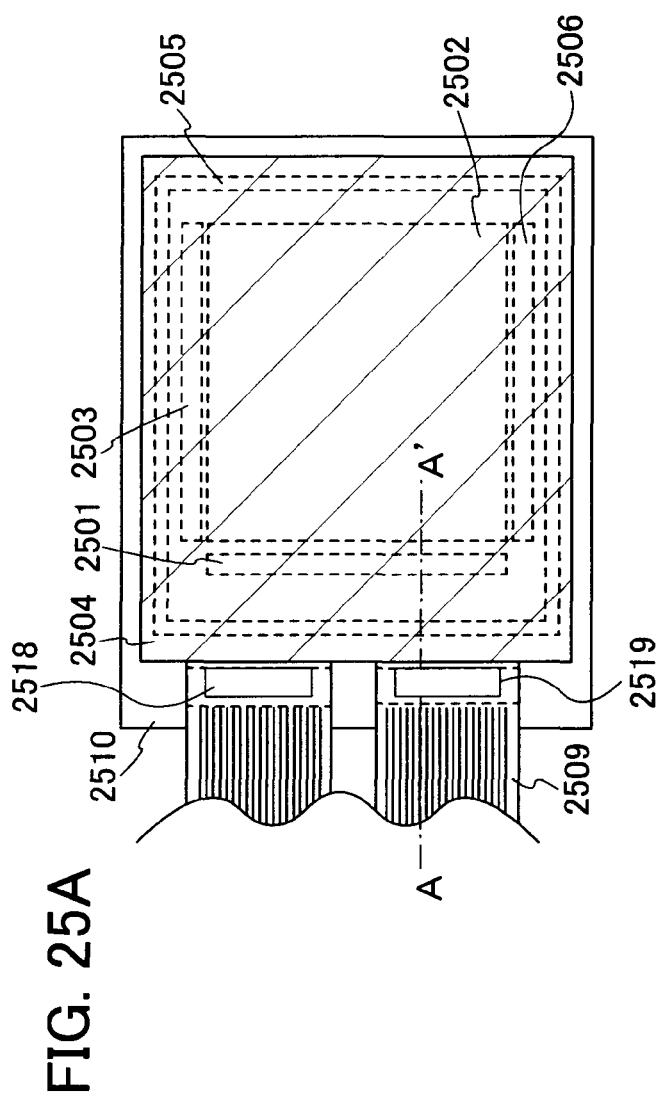
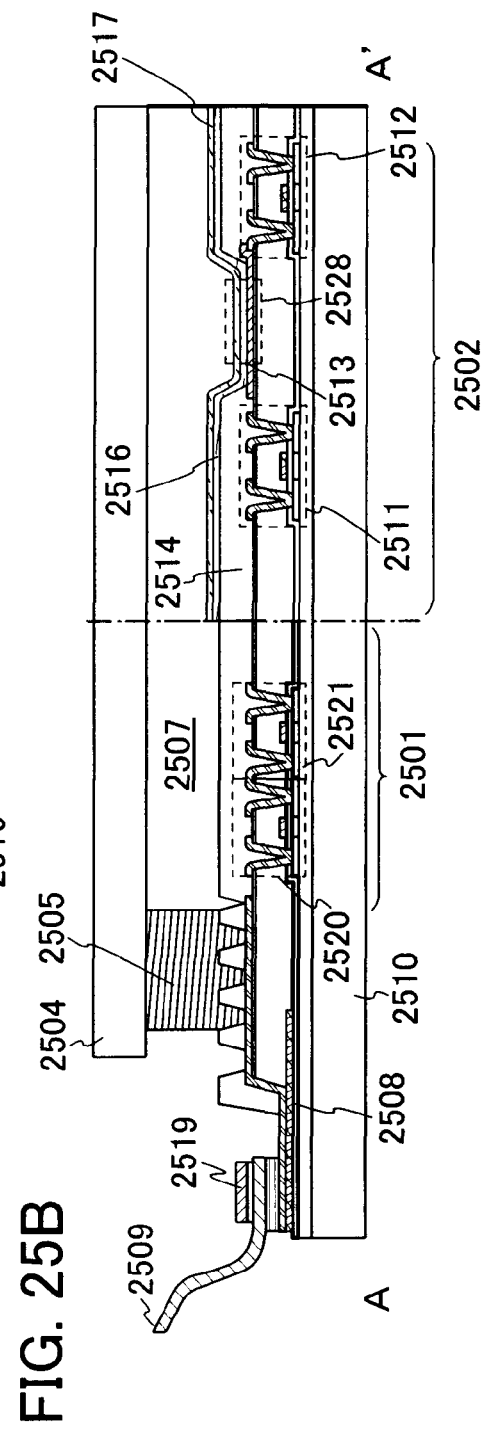
FIG. 25A
FIG. 25B

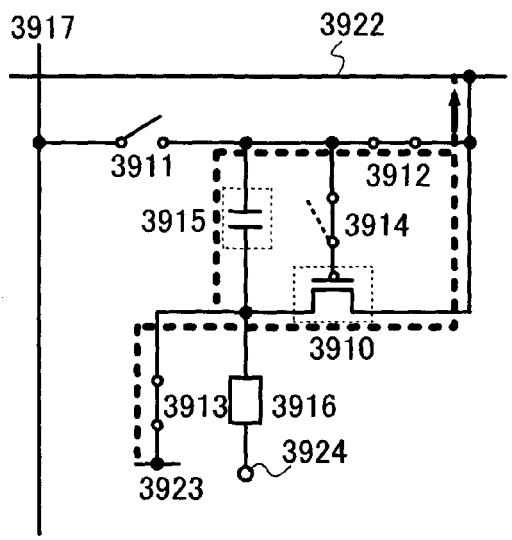
FIG. 41A initialization
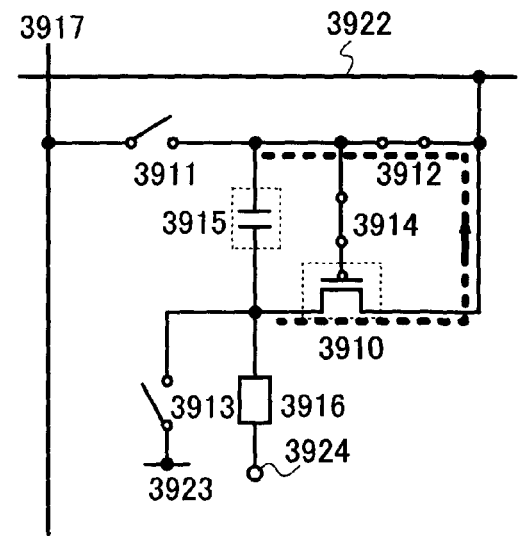
FIG. 41B threshold voltage writing
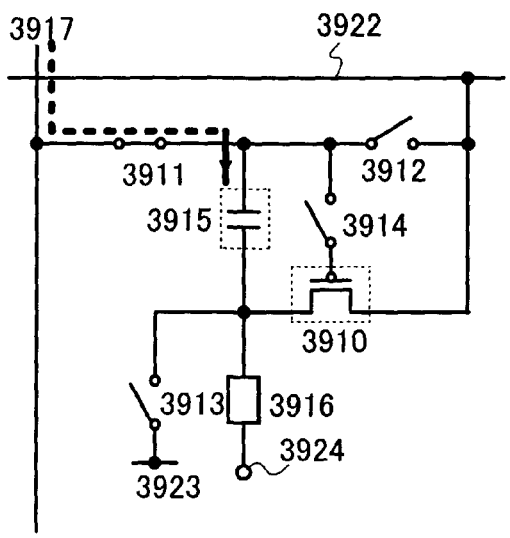
FIG. 41C data writing
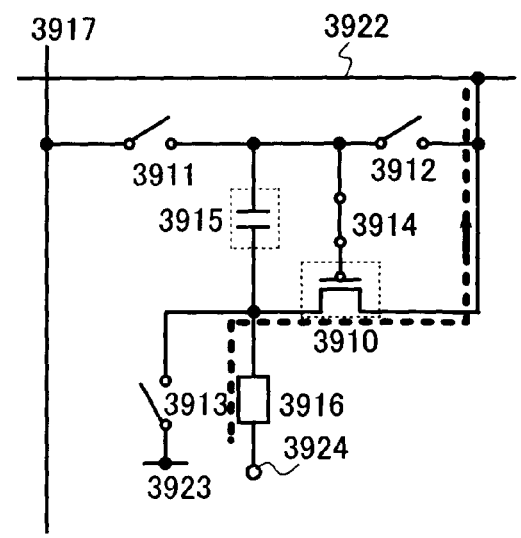
FIG. 41D light-emitting FIG. 44A  initialization
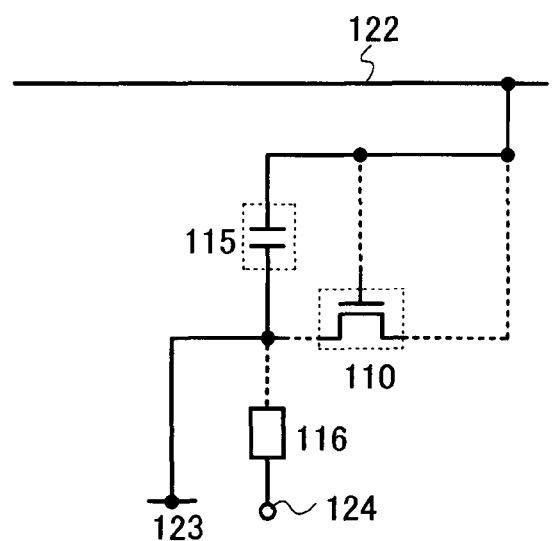
FIG. 44B  threshold voltage writing
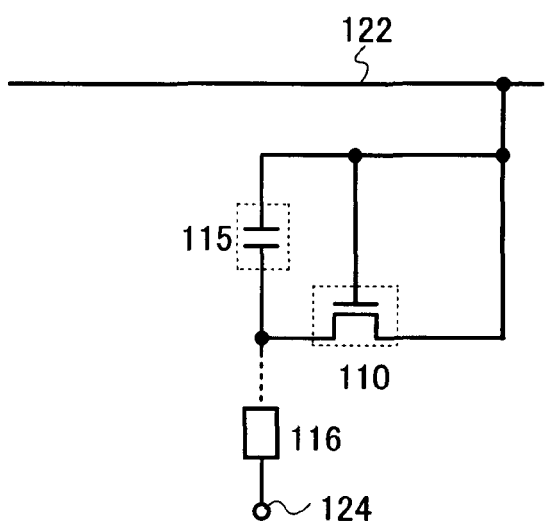
FIG. 44C  data writing
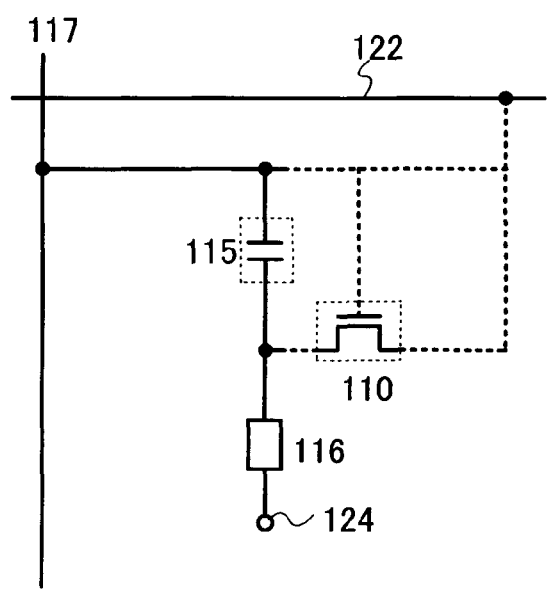
FIG. 44D  light-emitting
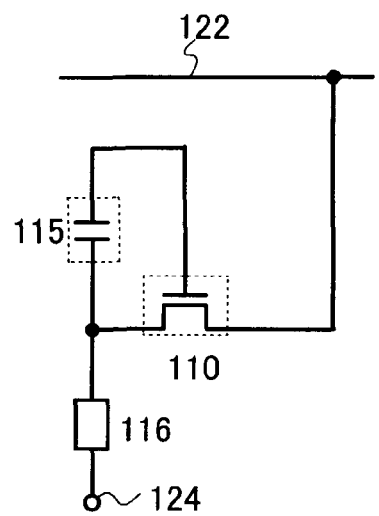

SEMICONDUCTOR DEVICE, DISPLAY DEVICE, AND ELECTRONIC DEVICE

BACKGROUND OF THE INVENTION

1. Field of the Invention

The present invention relates to a semiconductor device having a function for controlling a current supplied to a load with a transistor, and relates to a display device including a pixel which is formed of a current-drive display element, luminance of which is changed in accordance with a signal, and a signal line driver circuit or scan line driver circuit which drives the pixel. In addition, the invention relates to a driving method of such a semiconductor device and a display device. Further, the invention relates to an electronic device having the display device in a display portion.

2. Description of the Related Art

In recent years, a self-luminous display device having a pixel formed by using a light-emitting element such as an electroluminescence (EL) element, that is, a so-called light-emitting device has attracted attention. As a light-emitting element which is used for such a self-luminous display device, an organic light-emitting diode (OLED) and an EL element have attracted attention, and they have been used for an EL display or the like. Since these light-emitting elements emit light by themselves, an EL display or the like has advantages compared to a liquid crystal display such that it has higher pixel visibility, no backlight is required, and response speed is higher. Note that luminance of a light-emitting element is, in many cases, controlled by a current value flowing to the light-emitting element.

In addition, an active matrix display device in which a transistor which controls light emission of a light-emitting element is provided in each pixel has been developed. The active matrix display device has been expected to be put into practical use because not only it can realize high definition and large-screen display which is difficult to realize in a passive matrix display device, but also it can operate with less power consumption than the passive matrix display device.

FIG. 50 shows a pixel configuration of a conventional active matrix display device (Reference 1: Japanese Published Patent Application No. H08-234683). The pixel shown in FIG. 50 includes a thin film transistor (TFT) 11, a TFT 12, a capacitor 13, and a light-emitting element 14, and is connected to a signal line 15 and a scan line 16. Note that a power supply potential Vdd is supplied to either a source electrode or a drain electrode of the TFT 12 and one electrode of the capacitor 13, and a ground potential is supplied to an opposite electrode of the light-emitting element 14.

At this time, in the case of using amorphous silicon for a semiconductor layer of the TFT 12 which controls a current value supplied to the light-emitting element 14, that is, a driving TFT, the threshold voltage (Vth) fluctuates due to deterioration or the like. In that case, although the same potential is applied from the signal line 15 to different pixels, a current flowing to the light-emitting element 14 is different in each pixel, and display luminance becomes ununiform depending on the pixels. Note that also in the case of using polysilicon for the semiconductor layer of the driving TFT, characteristics of the transistor deteriorate or vary.

In order to overcome this problem, an operating method using a pixel in FIG. 51 is proposed in Reference 2 (Reference 2: Japanese Published Patent Application No. 2004-295131). The pixel shown in FIG. 51 includes a transistor 21, a driving transistor 22 which controls a current value supplied to a light-emitting element 24, a capacitor 23, and the light-emitting element 24, and is connected to a signal line 25 and a scan line 26. Note that the driving transistor 22 is an NMOS transistor, and a ground potential is supplied to either a source electrode or a drain electrode of the driving transistor 22 and Vca is supplied to an opposite electrode of the light-emitting element 24.

FIG. 52 shows a timing chart of an operation of this pixel. In FIG. 52, one frame period is divided into an initialization period 31, a threshold voltage (Vth) writing period 32, a data writing period 33, and a light-emitting period 34. Note that one frame period corresponds to a period for displaying an image for one screen, and the initialization period, the threshold voltage (Vth) writing period, and the data writing period are collectively described as an address period.

First, the threshold voltage of the driving transistor 22 is written into the capacitor 23 in the threshold voltage writing period 32. After that, a data voltage (Vdata) showing luminance of the pixel is written into the capacitor 23 and Vdata+Vth is stored in the capacitor 23 in the data writing period 33. Then, the driving transistor 22 is turned on in the light-emitting period 34, so that the light-emitting element 24 emits light with luminance specified by the data voltage by changing Vca. By performing such an operation, variations in luminance caused by fluctuations of the threshold voltage of the driving transistor 22 are reduced.

Reference 3 (Reference 3: Japanese Published Patent Application No. 2004-280059) also discloses that a voltage of the sum of the threshold voltage of a driving TFT and a data potential corresponds to a gate-source voltage of the driving TFT, so that a current flowing to a light-emitting element does not change even when the threshold voltage of the TFT fluctuates.

SUMMARY OF THE INVENTION

As described above, in a display device, suppression of variations of a current value caused by variations in the threshold voltage of a driving TFT has been expected.

In each of the operating methods disclosed in Reference 2 and Reference 3, the initialization, the threshold voltage writing, and the light emission are performed by changing a potential of Vca several times in each one frame period. In each pixel disclosed in Reference 2 and Reference 3, since one electrode of a light-emitting element to which Vca is supplied, that is, an opposite electrode thereof is formed over the entire pixel region, the light-emitting element cannot emit light if there is even one pixel in which a data writing operation is performed other than the initialization and the threshold voltage writing. Therefore, as shown in FIG. 53, a ratio of a light-emitting period in one frame period (i.e., a duty ratio) becomes low.

When the duty ratio is low, the amount of a current supplied to a light-emitting element and a driving transistor is required to be increased, so that a voltage applied to the light-emitting element becomes higher and power consumption also becomes higher. In addition, since the light-emitting element and the driving transistor easily deteriorate, screen burn-in is generated or higher power is required in order to obtain luminance which is almost equal to luminance before deterioration.

In addition, since the opposite electrode is connected to all of the pixels, the light-emitting element functions as an element having large capacitance. Therefore, in order to change a potential of the opposite electrode, high power consumption is required.

In view of the foregoing problems, it is an object of the invention to provide a display device with low power consumption and high brightness. It is another object of the invention to obtain a pixel configuration, a semiconductor device, and a display device in which a deviation from luminance specified by a data potential is small. Note that a target of the invention is not limited to only a display device having a light-emitting element, and it is another object of the invention to suppress variations of a current value caused by variations in the threshold voltage of a transistor.

A display device of the invention is provided with a pixel configuration in which a capacitance portion which can hold a potential of the sum of a potential corresponding to the threshold voltage of a transistor and a potential in accordance with a video signal inputted to the transistor is provided between a gate and a source of the transistor which controls a current supplied to a load (a display medium such as a light-emitting element) which is controlled by the current. By holding the potential of the sum of the potential corresponding to the threshold voltage of the transistor and the potential in accordance with the video signal in the capacitance portion, current fluctuation caused by characteristic variations of a current controlling transistor, that is, distortion of image quality can be suppressed. Note that the current is supplied by changing a potential of a drain of the transistor.

In addition, in the case of inputting the potential in accordance with the video signal in the pixel (a writing period), the transistor is made to be turned off or a current path is made to be interrupted, so that voltage fluctuation of a capacitor caused by a current supplied from the transistor can be suppressed.

Although the display device of the invention includes the transistor which controls a current and the load to which the current controlled by the transistor is supplied, the load is not limited to a light-emitting element typified by an electroluminescence (EL) element (an organic EL element, an inorganic EL element, or an EL element including both an organic material and an inorganic material); thus, a display medium, brightness, a color tone, polarized light, or the like of which is changed by supplying a current therethrough can be applied to the load.

A semiconductor device in accordance with one aspect of the invention includes a pixel having a transistor, a first switch, a second switch, and a third switch. One of a source electrode and a drain electrode of the transistor is electrically connected to a pixel electrode and to a first wiring through the second switch; the other of the source electrode and the drain electrode of the transistor is electrically connected to a second wiring through the third switch; and a gate electrode of the transistor is electrically connected to the second wiring through the first switch. A signal in accordance with a gray scale is inputted to the gate electrode.

A semiconductor device in accordance with one aspect of the invention includes a transistor, a storage capacitor, a first switch, a second switch, a third switch, and a fourth switch. One of a source electrode and a drain electrode of the transistor is electrically connected to a pixel electrode and to a second wiring through the third switch; the other of the source electrode and the drain electrode of the transistor is electrically connected to a first wiring; and a gate electrode of the transistor is electrically connected to the first wiring through the fourth switch and the second switch, to a third wiring through the fourth switch and the first switch, and to one of the source electrode and the drain electrode of the transistor through the fourth switch and the storage capacitor.

A semiconductor device in accordance with one aspect of the invention includes a transistor, a storage capacitor, a first switch, a second switch, a third switch, and a fourth switch. One of a source electrode and a drain electrode of the transistor is electrically connected to a pixel electrode and to a second wiring through the third switch; the other of the source electrode and the drain electrode of the transistor is electrically connected to a first wiring; and a gate electrode of the transistor is electrically connected to the first wiring through the second switch, to a third wiring through the fourth switch and the first switch, and to one of the source electrode and the drain electrode of the transistor through the fourth switch and the storage capacitor.

A semiconductor device in accordance with one aspect of the invention includes a transistor, a storage capacitor, a first switch, a second switch, a third switch, and a fourth switch. One of a source electrode and a drain electrode of the transistor is electrically connected to a pixel electrode and to a second wiring through the third switch; the other of the source electrode and the drain electrode of the transistor is electrically connected to a first wiring through the fourth switch; and a gate electrode of the transistor is electrically connected to the first wiring through the second switch, to a third wiring through the first switch, and to one of the source electrode and the drain electrode of the transistor through the storage capacitor.

A semiconductor device in accordance with one aspect of the invention includes a transistor, a storage capacitor, a first switch, a second switch, a third switch, and a fourth switch. One of a source electrode and a drain electrode of the transistor is electrically connected to a pixel electrode through the fourth switch and to a second wiring through the fourth switch and the third switch; the other of the source electrode and the drain electrode of the transistor is electrically connected to a first wiring; and a gate electrode of the transistor is electrically connected to the first wiring through the second switch, to a third wiring through the first switch, and to one of the source electrode and the drain electrode of the transistor through the storage capacitor and the fourth switch.

The second wiring may be the same as a wiring which controls the third switch.

The second wiring may be any one of scan lines which control the first to fourth switches of a previous row and the following row.

The transistor may be an N-channel transistor. In addition, a semiconductor layer of the transistor may be formed of a non-crystalline semiconductor film. Further, the semiconductor layer of the transistor may also be formed of amorphous silicon.

Alternatively, the semiconductor layer of the transistor may be a crystalline semiconductor film.

In the aforementioned invention, a potential inputted to the first wiring may be a binary value of V1 or V2; the potential inputted to the first wiring may be the value of V2 only when the first to third switches are turned off and the fourth switch is turned on; the potential of V1 may be a potential higher than a potential inputted to the second wiring; the difference between the potential of V1 and the potential inputted to the second wiring may be larger than the threshold voltage of the transistor; and the value of V2 may be larger than the value of V1.

In addition, the transistor may be a P-channel transistor. In that case, in the aforementioned invention, a potential inputted to the first wiring may be a binary value of V1 or V2; the potential inputted to the first wiring may be the value of V2 only when the first to third switches are turned off and the fourth switch is turned on; the potential of V1 may be higher than a potential inputted to the second wiring; the difference between the potential of V1 and the potential inputted to the second wiring may be smaller than the absolute value of the threshold voltage of the transistor; and the value of V2 may be smaller than the value of V1.

A semiconductor device in accordance with one aspect of the invention includes a transistor, one of a source electrode and a drain electrode of which is electrically connected to a first wiring and the other of the source electrode and the drain electrode of which is electrically connected to a second wiring; a storage capacitor which holds a gate-source voltage of the transistor; a means which makes the storage capacitor hold a first voltage by applying a first potential inputted to the first wiring to one of electrodes of the storage capacitor and applying a second potential inputted to the second wiring to the other of the electrodes of the storage capacitor; a means which discharges a voltage of the storage capacitor down to a second voltage; a means which makes the storage capacitor hold a fifth voltage which is the sum of the second voltage and a fourth voltage by applying a potential which is the sum of the first potential and a third voltage to the one of the electrodes of the storage capacitor; and a means which supplies a current set for the transistor to a load by inputting a third potential which is different from the first potential to the first wiring.

A semiconductor device in accordance with one aspect of the invention includes a transistor, one of a source electrode and a drain electrode of which is electrically connected to a first wiring and the other of the source electrode and the drain electrode of which is electrically connected to a second wiring; a storage capacitor which holds a gate-source voltage of the transistor; a means which makes the storage capacitor hold a first voltage by applying a first potential inputted to the first wiring to one of electrodes of the storage capacitor and applying a second potential inputted to the second wiring to the other of the electrodes of the storage capacitor; a means which discharges a voltage of the storage capacitor down to the threshold voltage of the transistor; a means which makes the storage capacitor hold a fourth voltage which is the sum of the threshold voltage of the transistor and a third voltage by applying a potential which is the sum of the first potential and a second voltage to the one of the electrodes of the storage capacitor; and a means which supplies a current set for the transistor to a load by inputting a third potential which is different from the first potential to the first wiring.

The transistor may be an N-channel transistor. In addition, a semiconductor layer of the transistor may be formed of a non-crystalline semiconductor film. Further, the semiconductor layer of the transistor may also be formed of amorphous silicon.

Alternatively, the semiconductor layer of the transistor may be a crystalline semiconductor film.

In the aforementioned invention, the first potential may be higher than the second potential; the difference between the first potential and the second potential may be larger than the threshold voltage of the transistor; and the first potential may be lower than the third potential.

In addition, the transistor may be a P-channel transistor. In this case, the first potential may be lower than the second potential; the difference between the first potential and the second potential may be larger than the absolute value of the threshold voltage of the transistor; and the first potential may be higher than that of the third potential.

Further, a display device including the aforementioned semiconductor device and an electronic device including the display device in a display portion are included in accordance with one aspect of the invention.

Note that various types of switches can be used as a switch described in the specification, and an electrical switch, a mechanical switch, or the like is given as an example. That is, any element can be used as long as it can control a current flow, and thus, a switch is not limited to a certain element. For example, it may be a transistor, a diode (e.g., a PN diode, a PIN diode, a Schottky diode, or a diode-connected transistor), or a logic circuit combining such elements. In the case of using a transistor as a switch, the polarity (a conductivity type) of the transistor is not particularly limited to a certain type because it operates just as a switch. However, a transistor of polarity with smaller off-current is preferably used. A transistor provided with an LDD region, a transistor with a multi-gate structure, or the like is given as an example of a transistor with smaller off-current. In addition, it is preferable that an N-channel transistor be used when a potential of a source electrode of the transistor which is operated as a switch is closer to a low-potential-side power supply (e.g., Vss, GND, or 0 V), while a P-channel transistor is used when the potential of the source electrode is closer to a high-potential-side power supply (e.g., Vdd). This is because the absolute value of a gate-source voltage of the transistor can be increased, so that the transistor can easily function as a switch. Note that a CMOS switch may also be employed by using both N-channel and P-channel transistors. By employing the CMOS switch, an output voltage is easily controlled with respect to various input voltages, so that the switch can be operated appropriately.

Note that in the invention, description "being connected" is synonymous with description "being electrically connected". Accordingly, in the structures disclosed in the invention, another element which enables an electrical connection (e.g., a switch, a transistor, a capacitor, an inductor, a resistor, or a diode) may be interposed between elements having a predetermined connection relation. Needless to say, the elements may be arranged without interposing another element therebetween, and description "being electrically connected" includes the case where elements are directly connected.

Note that the load is not limited to a light-emitting element typified by an electroluminescence (EL) element as described above, and thus, a display medium, brightness, a color tone, polarized light, or the like of which is changed by supplying a current therethrough can be applied to the load. As such a display medium, a display medium, contrast of which changes by an electromagnetic action, such as an electron-emissive element, a liquid crystal element, electronic ink, a grating light valve (GLV), a plasma display panel (PDP), a digital micromirror device (DMD), or the like can be employed, for example. In addition, a carbon nanotube can also be used for the electron-emissive element. Note that display devices using EL elements include an EL display; display devices using electron-emissive elements include a field emission display (FED), an SED-type flat panel display (SED: Surface-conduction Electron-emitter Display), or the like; display devices using liquid crystal elements include a liquid crystal display, a transmissive liquid crystal display, a semi-transmissive liquid crystal display, and a reflective liquid crystal display; and display devices using electronic ink include electronic paper Note that a transistor is an element having at least three terminals of a gate electrode, a drain region, and a source region, and has a channel forming region between the drain region and the source region. Here, since the source region and the drain region of the transistor change depending on the structure, the operating condition, or the like of the transistor, it is difficult to accurately define a range of the source region or the drain region. Therefore, when a connection relation of the transistor is described, one of electrodes connected to two terminals of the drain region and the source region is described as a first electrode and the other electrode is described as a second electrode.

Note that in the invention, various types of transistors can be applied to a transistor without limiting to a certain type. Accordingly, a thin film transistor (TFT) using a non-single crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied. In addition, various types of substrates can be used as a substrate over which a transistor is formed without limiting to a certain type. For example, the transistor can be formed over a single crystalline substrate, an SOI substrate, a glass substrate, a plastic substrate, a paper substrate, a cellophane substrate, a quartz substrate, a stone substrate, a stainless steel substrate, a substrate having stainless steel foil, or the like. In addition, a transistor may be formed over one substrate, and then, the transistor may be transferred to another substrate.

Note that, as described above, the transistor in the invention may be any type of transistor and may be formed over any type of substrate. Accordingly, all of circuits may be formed over a glass substrate, a plastic substrate, a single crystalline substrate, an SOI substrate, or any other substrates. By forming all of the circuits over the same substrate, the number of component parts can be reduced to cut cost, or the number of connections to the circuit components can be reduced to improve reliability. Alternatively, a part of the circuits may be formed over one substrate and another part of the circuits may be formed over another substrate. That is, not all of the circuits are required to be formed over the same substrate. For example, a part of the circuits may be formed with transistors over a glass substrate and another part of the circuits may be formed over a single crystalline substrate or the like, so that an IC chip thereof is provided over the glass substrate by COG (Chip On Glass). Alternatively, the IC chip may be connected to the glass substrate by TAB (Tape Automated Bonding) or a printed wiring board. In this manner, by forming a part of the circuits over the same substrate, the number of component parts can be reduced to cut cost, or the number of connections to the circuit components can be reduced to improve reliability. In addition, by forming a portion with a high driving voltage or a portion with high driving frequency, which consumes large power, over another substrate, increase of power consumption can be prevented.

A structure of a transistor can be various modes without limiting to a certain structure. For example, a multi-gate structure having two or more gate electrodes may be used. By using the multi-gate structure, off-current can be reduced and the withstand voltage of the transistor can be increased to improve reliability, or fluctuation of a drain-source current caused by fluctuation of a drain-source voltage can be reduced when the transistor operates in a saturation region. In addition, a structure where gate electrodes are formed above and below a channel may be used. By using the structure where gate electrodes are formed above and below the channel, a channel region is enlarged to increase the amount of a current flowing therethrough, or a depletion layer can be easily formed to decrease the S value. In addition, a structure where a gate electrode is formed above a channel, a structure where gate electrodes are formed below a channel, a staggered structure, an inversely staggered structure, or a structure where a channel region is divided into a plurality of regions, and the divided regions are connected in parallel or in series may be used. A source electrode or a drain electrode may overlap with a channel (or a part of it). By using the structure where the source electrode or the drain electrode may overlap with the channel (or a part of it), the case where an electric charge is accumulated in the part of the channel so that an operation becomes unstable can be prevented. In addition, an LDD (Lightly Doped Drain) region may be provided. By providing the LDD region, off-current can be reduced and the withstand voltage of the transistor can be increased to improve reliability, or characteristics in which a drain-source current does not fluctuate very much can be provided even if a drain-source voltage fluctuates when the transistor operates in a saturation region.

Note also that one pixel corresponds to one element which can control brightness in the invention. For example, one pixel corresponds to one color element and brightness is expressed with the color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements with more than three colors may be employed. RGBW (W means white), or RGB plus yellow, cyan, and/or magenta is given as an example. Alternatively, as another example, in the case of controlling brightness of a color element by using a plurality of regions, one region corresponds to one pixel. For example, in the case of performing area gray scale display, a plurality of regions which controls brightness are provided in each color element and gray scales are expressed with the whole regions. In this case, one region which controls brightness corresponds to one pixel. In that case, one color element is composed of a plurality of pixels, and regions which contribute to display may be different depending on pixels. In addition, in the plurality of pixels which form one color element, the viewing angle may be widened by slightly varying signals supplied to the plurality of pixels.

Note that in this specification, a semiconductor device means a device having a circuit including a semiconductor element (e.g., a transistor or a diode). The semiconductor device may also include all devices that can function by utilizing semiconductor characteristics. In addition, a display device includes not only a display panel itself where a plurality of pixels including a load are formed over the same substrate as a peripheral driver circuit which drives the pixels, but also a display panel attached with a flexible printed circuit (FPC) or a printed wiring board (PWB).

In the invention, description that an object is "formed on" or "formed over" another object does not necessarily mean that the object is in direct contact with another object. The description includes the case where two objects are not in direct contact with each other, that is, the case where another object is sandwiched therebetween. Accordingly, for example, when it is described that a layer B is formed on (or over) a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed above another object, it does not necessarily mean that the object is in direct contact with another object, and another object may be sandwiched therebetween. Accordingly, for example, when it is described that a layer B is formed above a layer A, it includes both of the case where the layer B is formed in direct contact with the layer A, and the case where another layer (e.g., a layer C or a layer D) is formed in direct contact with the layer A and the layer B is formed in direct contact with the layer C or D. Similarly, when it is described that an object is formed below or under another object, it includes both of the case where the objects are in direct contact with each other, and the case where the objects are not in contact with each other.

By employing the invention, variations of the current value caused by variations in the threshold voltage of a transistor can be suppressed. Therefore, a desired current can be supplied to a load such as a light-emitting element. In particular, in the case of using a light-emitting element as a load, a display device with few variations in luminance and a high ratio of a light-emitting period in one frame period can be provided.

BRIEF DESCRIPTION OF THE DRAWINGS

In the accompanying drawings:

FIGS. 3A to 3D are diagrams each showing an operation of the pixel shown in FIG. 1;

FIG. 10 is a chart showing a writing operation of a display device shown in Embodiment Mode 1;

FIGS. 20A and 20B are partial sectional views each showing a pixel shown in Embodiment Mode 7;

FIGS. 21A and 21B are partial sectional views each showing a pixel shown in Embodiment Mode 7;

FIGS. 22A and 22B are partial sectional views each showing a pixel shown in Embodiment Mode 7;

FIGS. 25A and 25B are diagrams showing a display device shown in Embodiment Mode 9;

FIGS. 41A to 41D are diagrams each showing an operation of the pixel shown in FIG. 39;

FIGS. 44A to 44D are diagrams each showing an operation of the pixel shown in Embodiment Mode 1;

DETAILED DESCRIPTION OF THE INVENTION

Figure 1:
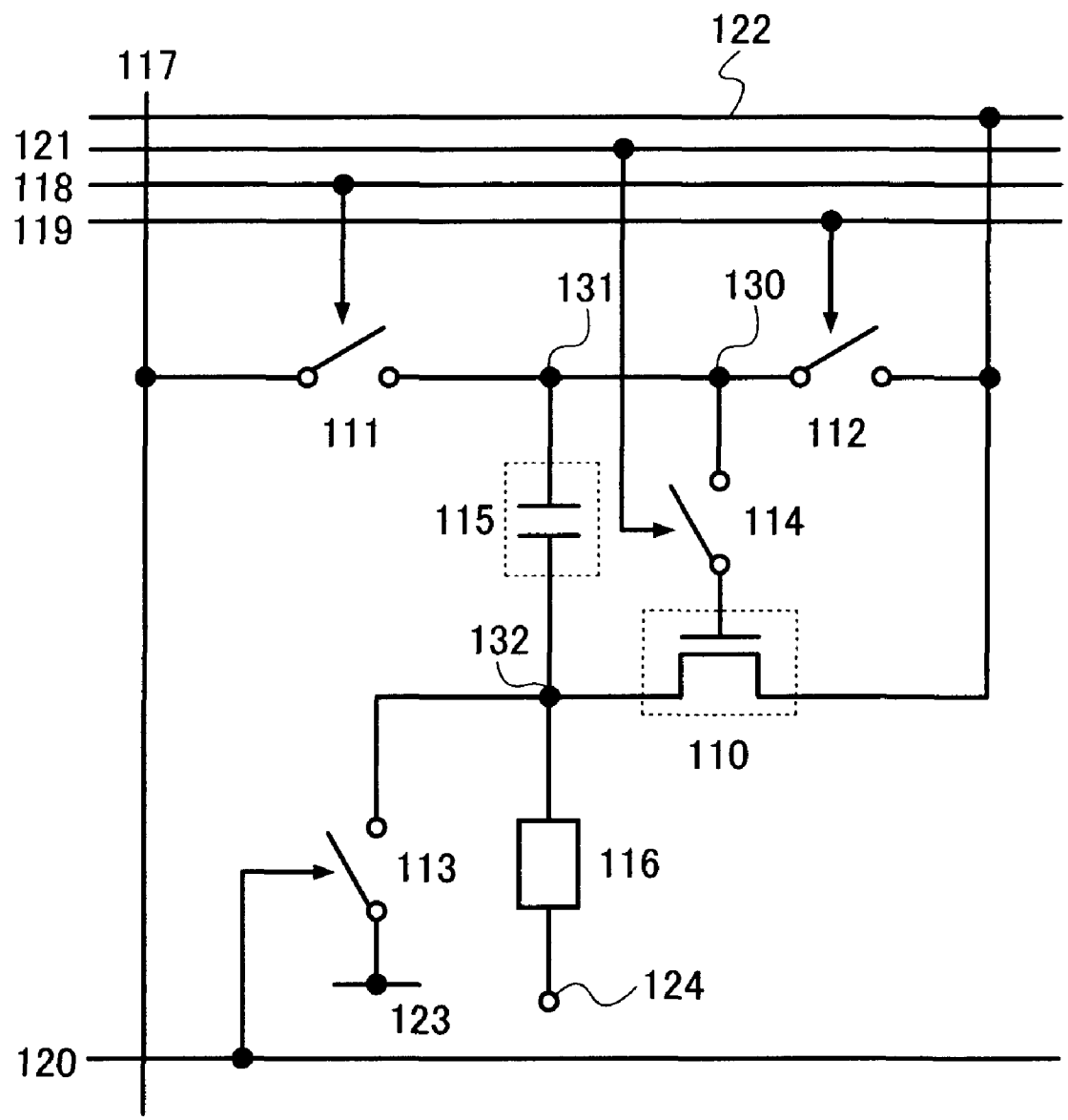
FIG. 1 is a diagram showing a pixel configuration shown in Embodiment Mode 1.

Hereinafter, modes of the invention is described. However, the invention can be implemented with various different modes and it is to be understood that various changes and modifications will be apparent to those skilled in the art. Unless such changes and modifications depart from the spirit and the scope of the invention, they should be construed as being included therein. Therefore, the invention should not be construed as being limited to the description of the modes. Note that in structures of the invention described below, reference numerals showing the same portions are used in common among the different drawings.

Embodiment Mode 1

Figure 48:
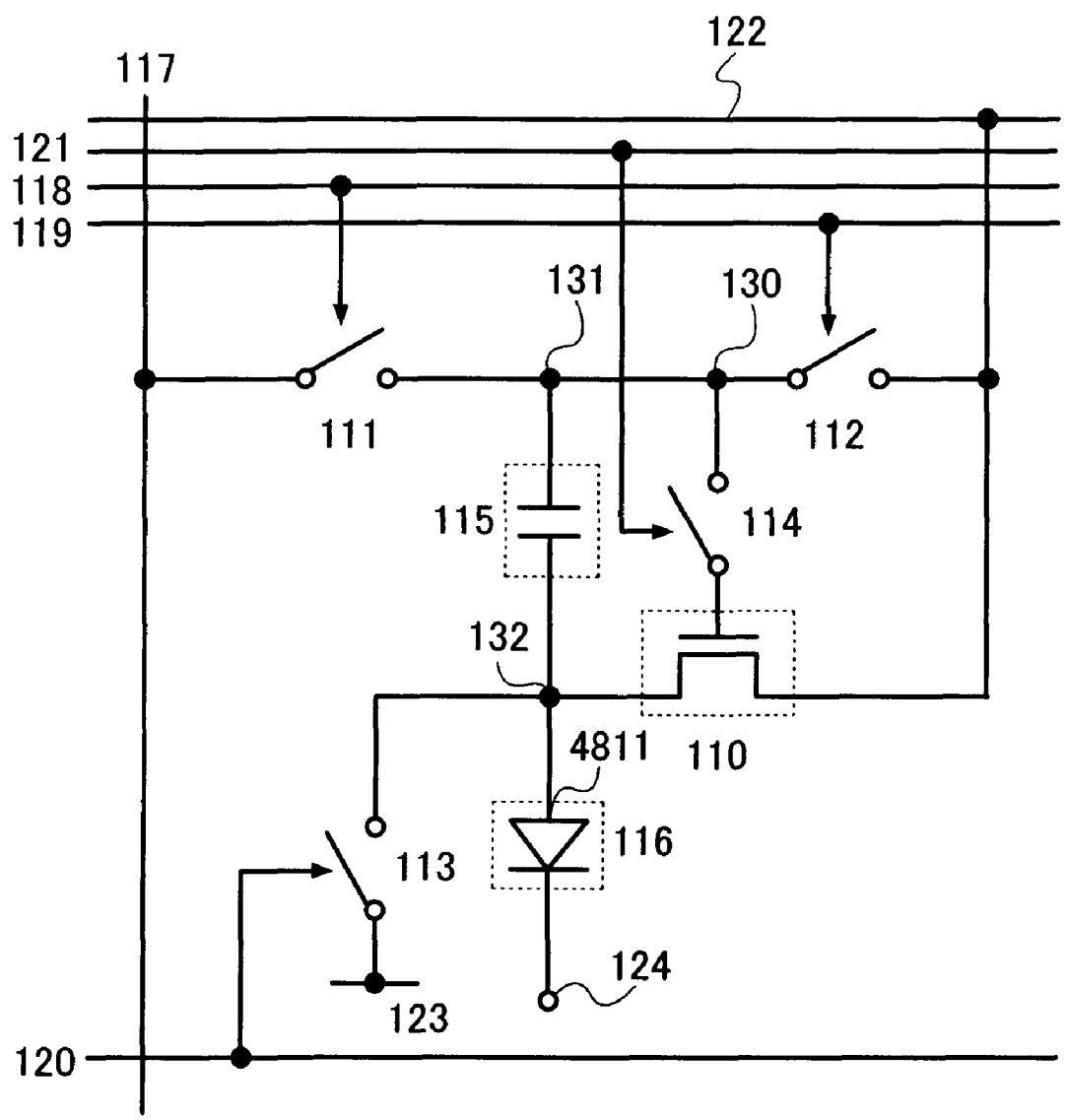
FIG. 48 is a diagram showing a pixel configuration shown in Embodiment Mode 1.

A basic configuration of a pixel of the invention is described with reference to FIG. 1. A pixel shown in FIG. 1 includes a transistor 110, a first switch 111, a second switch 112, a third switch 113, a fourth switch 114, a capacitor 115, and a light-emitting element 116. Note that the pixel is connected to a signal line 117, a first scan line 118, a second scan line 119, a third scan line 120, a fourth scan line 121, a power supply line 122, and a potential supply line 123. In this embodiment mode, the transistor 110 is an N-channel transistor, and is turned on when a gate-source voltage (Vgs) thereof exceeds the threshold voltage (Vth). In addition, an example is described in which an EL element in which a current is supplied from a pixel electrode 4811 to an opposite electrode 124 is used as the light-emitting element 116 as shown in FIG. 48. In that case, the pixel electrode 4811 of the light-emitting element 116 functions as an anode and the opposite electrode 124 thereof functions as a cathode. Note that a gate-source voltage of the transistor is described as Vgs; a drain-source voltage of the transistor is described as Vds; the threshold voltage of the transistor is described as Vth; and a voltage stored in the capacitor is described as Vcs. The power supply line 122, the potential supply line 123, and the signal line 117 are also described as a first wiring, a second wiring, and a third wiring, respectively. Further, the first scan line 118, the second scan line 119, the third scan line 120, and the fourth scan line 121 may be described as a fourth wiring, a fifth wiring, a sixth wiring, and a seventh wiring, respectively.

A first electrode (one of a source electrode and a drain electrode) of the transistor 110 is connected to the pixel electrode of the light-emitting element 116; a second electrode (the other of the source electrode and the drain electrode) of the transistor 110 is connected to the power supply line 122; and a gate electrode of the transistor 110 is connected to the power supply line 122 through the fourth switch 114 and the second switch 112. Note that the fourth switch 114 is connected between the gate electrode of the transistor 110 and the second switch 112. In addition, if a connection point of the fourth switch 114 and the second switch 112 is denoted by a node 130, the node 130 is connected to the signal line 117 through the first switch 111. Further, the first electrode of the transistor 110 is also connected to the potential supply line 123 through the third switch 113.

In addition, the capacitor 115 is connected between the node 130 and the first electrode of the transistor 110. That is, a first electrode of the capacitor 115 is connected to the gate electrode of the transistor 110 through the fourth switch 114, and a second electrode of the capacitor 115 is connected to the first electrode of the transistor 110. The capacitor 115 may be formed by sandwiching an insulating film with a wiring, a semiconductor layer, or an electrode, or can be omitted by using gate capacitance of the transistor in some cases. Such a means which holds a voltage is described as a storage capacitor. Further, a connection point of the node 130 and a wiring to which the first switch 111 and the first electrode of the capacitor 115 are connected is denoted by a node 131, and a connection point of the first electrode of the transistor 110 and a wiring to which the second electrode of the capacitor 115 and the pixel electrode of the light-emitting element 116 are connected is denoted by a node 132.

By inputting signals into the first scan line 118, the second scan line 119, the third scan line 120, and the fourth scan line 121, on/off of the first switch 111, the second switch 112, the third switch 113, and the fourth switch 114 is controlled, respectively.

A signal in accordance with a gray scale of the pixel which corresponds to a video signal, that is, a potential in accordance with luminance data is inputted to the signal line 117.

Next, operations of the pixel shown in FIG. 1 are described with reference to a timing chart in FIG. 2, and FIGS. 3A to 3D. Note that, in FIG. 2, one frame period which corresponds to a period for displaying an image for one screen is divided into an initialization period, a threshold voltage (Vth) writing period, a data writing period, and a light-emitting period. In addition, the initialization period, the threshold voltage (Vth) writing period, and the data writing period are collectively described as an address period. Although one frame period is not particularly limited to a certain period, it is preferable that one frame period be at least 1/60 second or less so that an image viewer does not perceive a flicker.

Note that a potential of V1 is inputted to an opposite electrode 124 of the light-emitting element 116 and a potential of V1−Vth−α (α: an arbitrary positive number) is inputted to the potential supply line 123. In addition, the potential of V1 is inputted to the power supply line 122 in the address period, and a potential of V2 is inputted to the power supply line 122 in the light-emitting period. Note that V2>V1 is satisfied. That is, the potentials of the power supply line 122 and the potential supply line 123 in the initialization period may be any potential as long as a potential difference between the potentials of the power supply line 122 and the potential supply line 123 is a potential which turns on the transistor 110.

Here, although a potential of the opposite electrode 124 of the light-emitting element 116 is the same as a potential of the power supply line 122 in the address period for description of the operations, the potential of the opposite electrode 124 may be any potential as long as it is higher than a potential of V1−Vth−α−$V_{EL}$ when a potential difference which is at least necessary for the light-emitting element 116 to emit light is $V_{EL}$. That is, in the address period, potentials of both ends of the light-emitting element 116 may be any potential as long as a current does not flow to the light-emitting element 116. In addition, the potential V2 of the power supply line 122 in the light-emitting period may be any potential as long as it is higher than the sum of the potential of the opposite electrode 124 and the potential difference ($V_{EL}$) which is at least necessary for the light-emitting element 116 to emit light; here, since the potential of the opposite electrode 124 is V1 for description, V2 may be any potential higher than V1+$V_{EL}$.

First, in the initialization period, the first switch 111 is turned off and the second switch 112, the third switch 113, and the fourth switch 114 are turned on as shown in FIGS. 2A and 3A. At this time, the first electrode of the transistor 110 serves as the source electrode, and a potential thereof is equal to a potential of the potential supply line 123 which is V1−Vth−α. On the other hand, a potential of the gate electrode of the transistor 110 is V1. Therefore, a gate-source voltage Vgs of the transistor 110 is Vth+α so that the transistor 110 is turned on. Then, Vth+α is held in the capacitor 115 provided between the gate electrode and the first electrode of the transistor 110. Although the case where the fourth switch 114 is turned on is described, the fourth switch 114 may be turned off as long as the capacitor 115 can hold a voltage which turns on the transistor 110. Note that in the following threshold voltage writing period, the fourth switch 114 is required to be turned on.

Figure 2:
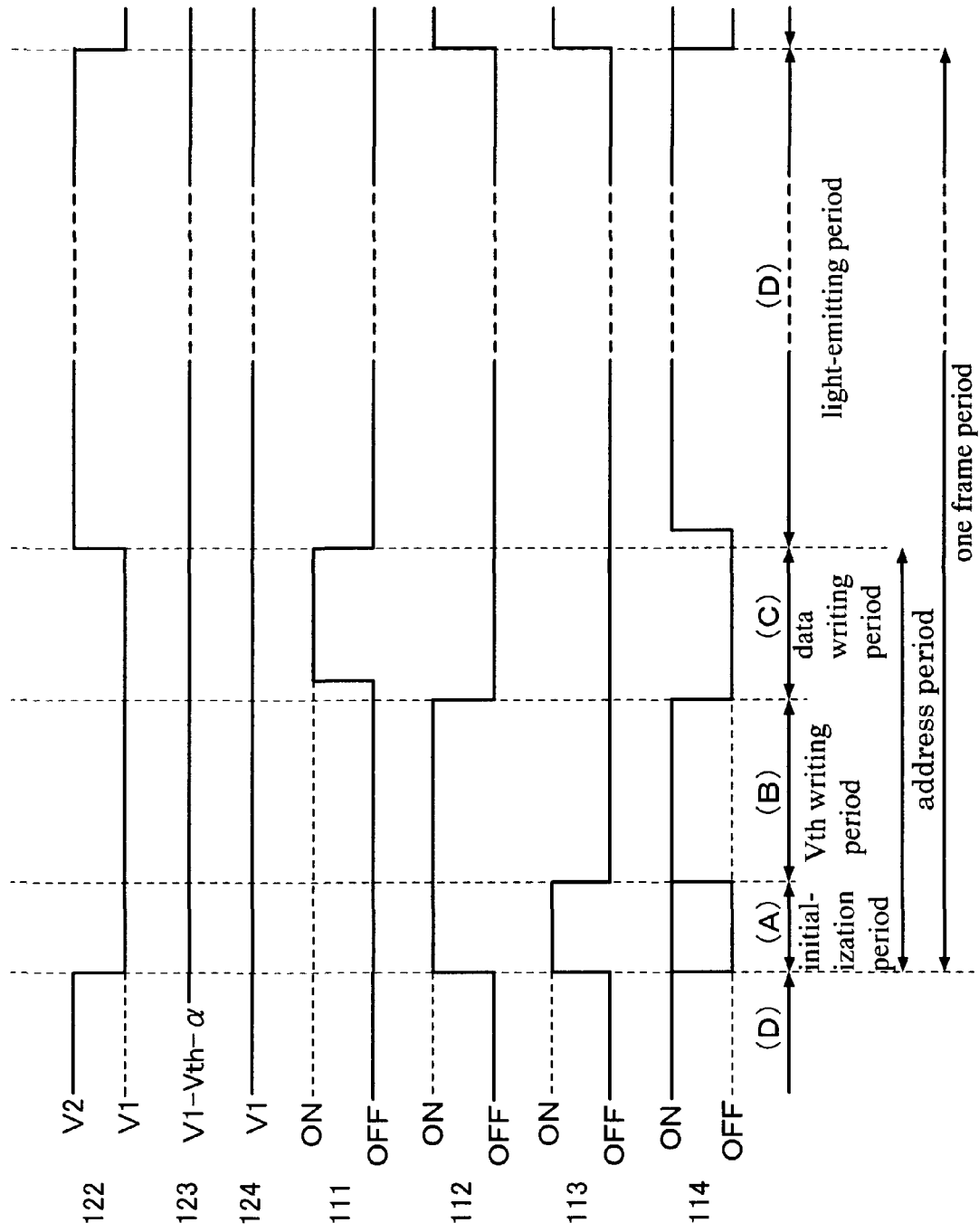
FIG. 2 is a timing chart showing an operation of the pixel shown in FIG. 1.

A threshold voltage writing period (B) shown in FIG. 2, and in FIG. 3B, the third switch 113 is turned off. Therefore, the potential of the first electrode, that is, the source electrode of the transistor 110 rises gradually, and when the potential reaches V1−Vth, that is, when the gate-source voltage Vgs of the transistor 110 reaches the threshold voltage (Vth), the transistor 110 is turned off. Accordingly, a voltage held in the capacitor 115 is approximately Vth.

In the following data writing period (C) shown in FIG. 2, and in FIG. 3C, the first switch 111 is turned on after the second switch 112 and the fourth switch 114 are turned off, and a potential in accordance with luminance data (V1+Vdata) is inputted from the signal line 117. By turning off the fourth switch 114 in this period, the transistor 110 can be held to be turned off. Therefore, potential fluctuation of the second electrode of the capacitor 115 caused by a current supplied from the power supply line 122 at the time of data writing can be suppressed. Accordingly, a voltage Vcs which is held in the capacitor 115 at this time can be represented by Formula (1) when electrostatic capacitance of the capacitor 115 is C1 and electrostatic capacitance of the light-emitting element 116 is C2.

[Formula 1]

$$Vcs = Vth + Vdata \times \frac{C2}{C1+C2} \quad (1)$$

Note that since the light-emitting element 116 has thinner film thickness and a larger electrode area than the capacitor 115, C2>>C1 is satisfied. Therefore, the voltage Vcs which is held in the capacitor 115 is represented by Formula (2) from C2/(C1+C2)≈1. Note also that in the case where the light-emitting element 116 is controlled not to emit light in the following light-emitting period, a potential V1+Vdata (Vdata≦0) is input.

[Formula 2]

$$Vcs = Vth + Vdata \quad (2)$$

Next, in the light-emitting period (D) shown in FIG. 2, and in FIG. 3D, the first switch 111 is turned off, and the fourth switch 114 is turned on after the potential of the power supply line 122 is made V2. At this time, the gate-source voltage of the transistor 110 is Vgs=Vth+Vdata so that the transistor 110 is turned on. Therefore, a current in accordance with luminance data flows to the transistor 110 and the light-emitting element 116, so that the light-emitting element 116 emits light.

Note that a current I flowing to the light-emitting element 116 is represented by Formula (3) in the case of operating the transistor 110 in a saturation region.

[Formula 3]

$$I = \frac{1}{2}\left(\frac{W}{L}\right)\mu Cox(Vgs-Vth)^2 \quad (3)$$
$$= \frac{1}{2}\left(\frac{W}{L}\right)\mu Cox(Vth+Vdata-Vth)^2$$
$$= \frac{1}{2}\left(\frac{W}{L}\right)\mu Cox(Vdata)^2$$

In addition, the current I flowing to the light-emitting element 116 is represented by Formula (4) in the case of operating the transistor 110 in a linear region.

[Formula 4]

$$I = \left(\frac{W}{L}\right)\mu Cox\left[(Vgs-Vth)Vds-\frac{1}{2}Vds^2\right] \quad (4)$$
$$= \left(\frac{W}{L}\right)\mu Cox\left[(Vth+Vdata-Vth)Vds-\frac{1}{2}Vds^2\right]$$
$$= \left(\frac{W}{L}\right)\mu Cox\left[(Vdata)Vds-\frac{1}{2}Vds^2\right]$$

Here, W denotes channel width of the transistor 110; L denotes channel length of the transistor 110; μ denotes mobility of the transistor 110; and Cox denotes storage capacitance of the transistor 110.

According to Formula (3) and Formula (4), a current flowing to the light-emitting element 116 does not depend on the threshold voltage (Vth) of the transistor 110 in each of the case where the transistor 110 is operated in the saturation region and the case where the transistor 110 is operated in the linear region. Therefore, variations of a current value caused by variations in the threshold voltage of the transistor 110 can be suppressed, so that the current in accordance with luminance data can be supplied to the light-emitting element 116.

Accordingly, variations in luminance caused by variations in the threshold voltage of the transistor 110 can be suppressed. In addition, since the potential of the opposite electrode 124 is fixed at a constant potential during the operation, power consumption can be reduced.

Further, in the case of operating the transistor 110 in the saturation region, variations in luminance caused by deterioration of the light-emitting element 116 can also be reduced. When the light-emitting element 116 deteriorates, $V_{EL}$ of the light-emitting element 116 is increased and the potential of the first electrode, that is, the source electrode of the transistor 110 rises. At this time, the source electrode of the transistor 110 is connected to the second electrode of the capacitor 115; the gate electrode of the transistor 110 is connected to the first electrode of the capacitor 115 and is in a floating state. Therefore, in accordance with rise in the source potential, a gate potential of the transistor 110 rises by the same amount. Accordingly, since Vgs of the transistor 110 does not change, a current flowing to the transistor 110 and the light-emitting element 116 is not affected even if the light-emitting element 116 deteriorates. Note that it can be seen in Formula (3) that the current I flowing to the light-emitting element 116 does not depend on the source potential or a drain potential.

Therefore, in the case of operating the transistor 110 in the saturation region, variations in the current flowing to the transistor 110 caused by variations in the threshold voltage of the transistor 110 and deterioration of the light-emitting element 116 can be suppressed.

Note that in the case of operating the transistor 110 in the saturation region, as the channel length L is shorter, a larger amount of current easily flows by avalanche breakdown when a drain voltage is extremely increased.

Figure 4:
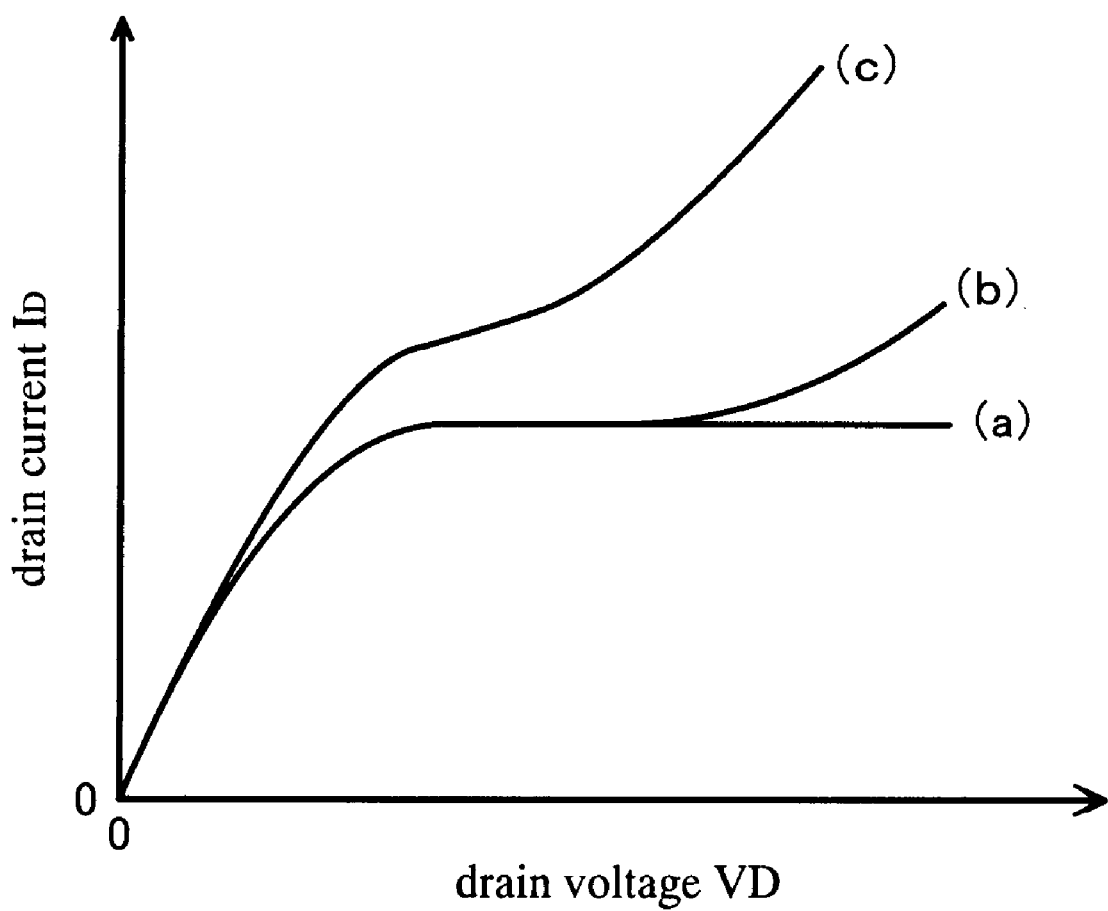
FIG. 4 is a model diagram of voltage-current characteristics in accordance with channel length modulation.

In addition, a pinch-off point moves to a source side when the drain voltage is increased to be higher than a pinch-off voltage, and effective channel length which substantially functions as a channel is decreased. Therefore, a current value is increased. Such a phenomenon is described as channel length modulation. Note that the pinch-off point means a boundary portion at which the channel disappears and thickness of the channel below the gate is 0. The pinch-off voltage means a voltage when the pinch-off point is at a drain edge. This phenomenon is easily generated as the channel length L is shorter. For example, a model diagram of voltage-current characteristics in accordance with the channel length modulation is shown in FIG. 4. Note that as for the channel length of the transistors, (a)>(b)>(c) is satisfied in FIG. 4.

Accordingly, in the case of operating the transistor 110 in the saturation region, the current I with respect to the drain-source voltage Vds is preferably as constant as possible. Therefore, the channel length L of the transistor 110 is preferably longer. For example, the channel length L of the transistor 110 is preferably larger than the channel width W thereof. In addition, the channel length L is preferably equal to or greater than 10 μm and equal to or less than 50 μm. More preferably, the channel length L is equal to or greater than 15 μm and equal to or less than 40 μm. Note that the channel length L and the channel width W are not limited to them.

In addition, since a reverse bias voltage is applied to the light-emitting element 116 in the initialization period, a short-circuited portion in the light-emitting element 116 can be insulated or deterioration of the light-emitting element 116 can be suppressed. Therefore, a life of the light-emitting element 116 can be extended.

Note that since variations of the current value caused by variations in the threshold voltage of the transistor can be suppressed, a supply destination of a current controlled by the transistor is not particularly limited to a certain destination. Therefore, an EL element (an organic EL element, an inorganic EL element, or an EL element including both an organic material and an inorganic material), an electron-emissive element, a liquid crystal element, electronic ink, and the like can be applied to the light-emitting element 116 shown in FIG. 1.

Note that it is only necessary for the transistor 110 to have a function for controlling a current value supplied to the light-emitting element 116, and various types of transistors can be applied to the transistor 110 without particularly limiting to a certain type. Accordingly, a thin film transistor (TFT) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied.

The first switch 111 is a switch which selects timing for inputting a signal in accordance with a gray scale of the pixel from the signal line 117 into the pixel and controls a signal supplied to the gate electrode of the transistor 110. The second switch 112 is a switch which selects timing for supplying a predetermined potential to the gate electrode of the transistor 110 and controls whether to supply the predetermined potential to the gate electrode of the transistor 110. The third switch 113 is a switch which selects timing for supplying a predetermined potential for initializing a potential written into the capacitor 115 and lowers the potential of the first electrode of the transistor 110. The fourth switch 114 is a switch which suppresses the potential fluctuation of the second electrode of the capacitor 115 at the time of data writing. Therefore, the first switch 111, the second switch 112, the third switch 113, and the fourth switch 114 are not particularly limited as long as they have the aforementioned functions. For example, each of the first switch 111, the second switch 112, the third switch 113, and the fourth switch 114 may be a transistor, a diode, or a logic circuit combining them. Note that the first to third switches are not particularly needed if the signal or the potential can be supplied to the pixel at the aforementioned timing.

Figure 5:
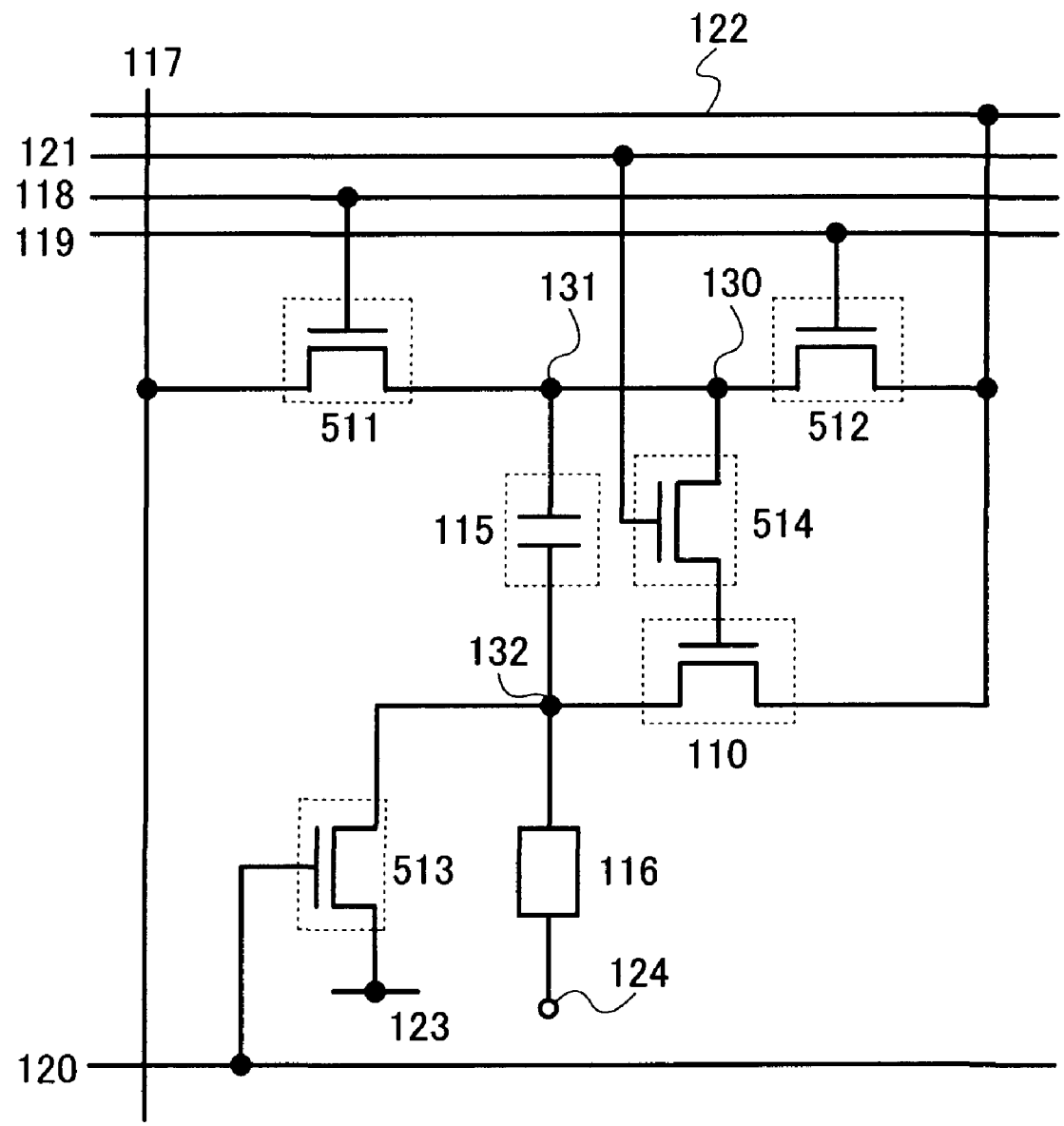
FIG. 5 is a diagram showing a pixel configuration shown in Embodiment Mode 1.

Next, FIG. 5 shows the case where N-channel transistors are applied to the first switch 111, the second switch 112, the third switch 113, and the fourth switch 114. Note that common reference numerals are used for portions which are common to the portions in the configuration in FIG. 1 and the description is omitted.

A first switching transistor 511 corresponds to the first switch 111 in FIG. 1; a second switching transistor 512 corresponds to the second switch 112 in FIG. 1; a third switching transistor 513 corresponds to the third switch 113 in FIG. 1; and a fourth switching transistor 514 corresponds to the fourth switch 114 in FIG. 1. Channel length of the transistor 110 is preferably longer than that of any of the first switching transistor 511, the second switching transistor 512, the third switching transistor 513, and the fourth switching transistor 514.

A gate electrode of the first switching transistor 511 is connected to the first scan line 118; a first electrode of the first switching transistor 511 is connected to the signal line 117; and a second electrode of the first switching transistor 511 is connected to the node 131.

A gate electrode of the second switching transistor 512 is connected to the second scan line 119; a first electrode of the second switching transistor 512 is connected to the power supply line 122; and a second electrode of the second switching transistor 512 is connected to the node 130.

A gate electrode of the third switching transistor 513 is connected to the third scan line 120; a first electrode of the third switching transistor 513 is connected to the node 132; and a second electrode of the third switching transistor 513 is connected to the potential supply line 123.

A gate electrode of the fourth switching transistor 514 is connected to the fourth scan line 121; a first electrode of the fourth switching transistor 514 is connected to the gate electrode of the transistor 110; and a second electrode of the fourth switching transistor 514 is connected to the node 130.

Each of the switching transistors 511 to 514 is turned on when a signal inputted to each of the scan lines 118 to 121 is at an H level and turned off when the signal inputted to each of the scan lines 118 to 121 is at an L level.

Figure 38:
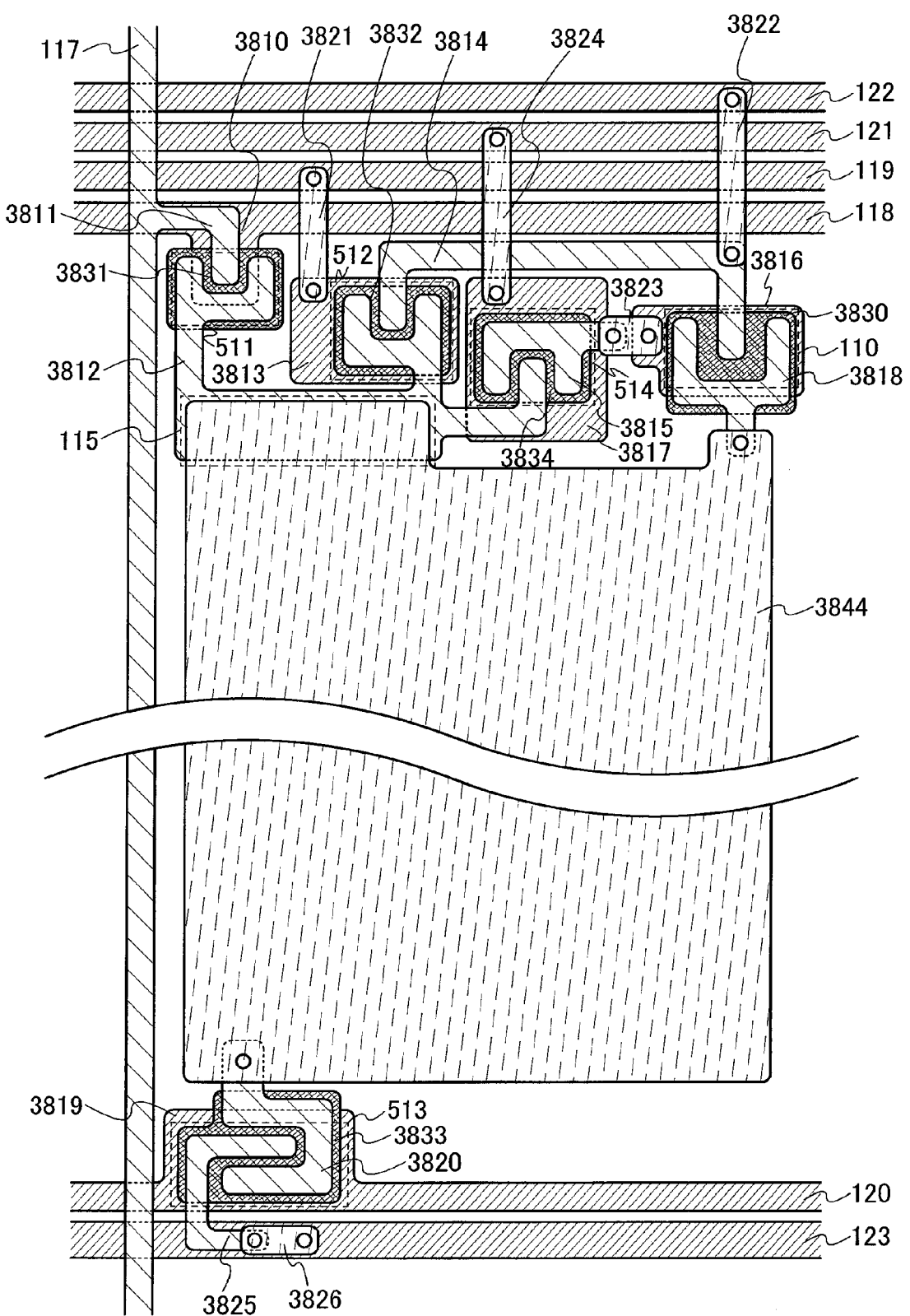
FIG. 38 is a top plan view of the pixel shown in FIG. 5.

FIG. 38 shows one mode of a top plan view of the pixel shown in FIG. 5. A conductive layer 3810 includes the first scan line 118 and the gate electrode of the first switching transistor 511. A conductive layer 3811 includes the signal line 117 and the first electrode of the first switching transistor 511. A conductive layer 3812 includes a portion which functions as the second electrode of the first switching transistor 511, a portion which functions as the first electrode of the capacitor 115, the second electrode of the second switching transistor 512, and a portion which functions as the second electrode of the fourth switching transistor 514. A conductive layer 3813 includes a portion which functions as the gate electrode of the second switching transistor 512, and is connected to the second scan line 119 through a wiring 3821. A conductive layer 3814 includes a portion which functions as the first electrode of the second switching transistor 512 and a portion which functions as the second electrode of the transistor 110, and is connected to the power supply line 122 through a wiring 3822. A conductive layer 3815 includes a portion which functions as the first electrode of the fourth switching transistor 514, and is connected to a conductive layer 3816 including a portion which functions as the gate electrode of the transistor 110 through a wiring 3823. A conductive layer 3817 includes a portion which functions as the gate electrode of the fourth switching transistor 514, and is connected to the fourth scan line 121 through a wiring 3824. A conductive layer 3818 includes a portion which functions as the first electrode of the transistor 110, and is connected to a pixel electrode 3844 of a light-emitting element. A conductive layer 3819 includes a portion which functions as the third scan line 120 and the gate electrode of the third switching transistor 513. A conductive layer 3820 includes a portion which functions as the first electrode of the third switching transistor 513, and is connected to the pixel electrode 3844. A conductive layer 3825 including a portion which functions as the second electrode of the third switching transistor 513 is connected to the potential supply line 123 through a wiring 3826.

Note that the portions which function as the gate electrode, the first electrode, and the second electrode of the first switching transistor 511 are portions which are formed by overlapping the conductive layers including the electrodes with a semiconductor layer 3831. The portions which function as the gate electrode, the first electrode, and the second electrode of the second switching transistor 512 are portions which are formed by overlapping the conductive layers including the electrodes with a semiconductor layer 3832. The portions which function as the gate electrode, the first electrode, and the second electrode of the third switching transistor 513 are portions which are formed by overlapping the conductive layers including the electrodes with a semiconductor layer 3833. The portions which function as the gate electrode, the first electrode, and the second electrode of the fourth switching transistor 514 are portions which are formed by overlapping the conductive layers including the electrodes with a semiconductor layer 3834. Similarly, the portions which function as the gate electrode, the first electrode, and the second electrode of the transistor 110 are portions which are formed by overlapping the conductive layers including the electrodes with a semiconductor layer 3830. Note that the capacitor 115 is formed in a portion in which the conductive layer 3813 overlaps with the pixel electrode 3844.

Also in the pixel configuration in FIG. 5, variations of the current value caused by variations in the threshold voltage of the transistor 110 can be suppressed by an operating method which is similar to that in FIG. 1. Therefore, the current in accordance with luminance data can be supplied to the light-emitting element 116, so that variations in luminance can be suppressed. In the case of operating the transistor 110 in the saturation region, variations in luminance caused by deterioration of the light-emitting element 116 can also be suppressed. In addition, a structure in which one of the source electrode and the drain electrode surrounds the other of the source electrode and the drain electrode is employed in each transistor, channel width can be widened. Accordingly, it is more effective when a non-crystalline semiconductor layer with lower mobility than that of a crystalline semiconductor layer is used for a semiconductor layer of each transistor included in the pixel.

Further, since the pixel can be formed by using only N-channel transistors, a manufacturing process can be simplified. In addition, a non-crystalline semiconductor such as an amorphous semiconductor or a semi-amorphous semiconductor (also described as a microcrystalline semiconductor) can be used for the semiconductor layer of each transistor included in the pixel. For example, amorphous silicon (a-Si:H) can be given as an example of the amorphous semiconductor. By using such a non-crystalline semiconductor, the manufacturing process can be further simplified. Accordingly, manufacturing cost can be reduced and a yield can be improved.

Note that since the first switching transistor 511, the second switching transistor 512, the third switching transistor 513, and the fourth switching transistor 514 is operated just as a switch, the polarity (a conductivity type) of the transistors is not particularly limited to a certain type. However, a transistor of polarity with smaller off-current is preferably used. A transistor provided with an LDD region, a transistor with a multi-gate structure, or the like is given as an example of a transistor with smaller off-current. In addition, a CMOS switch may be employed by using both N-channel and P-channel transistors.

Figure 6:
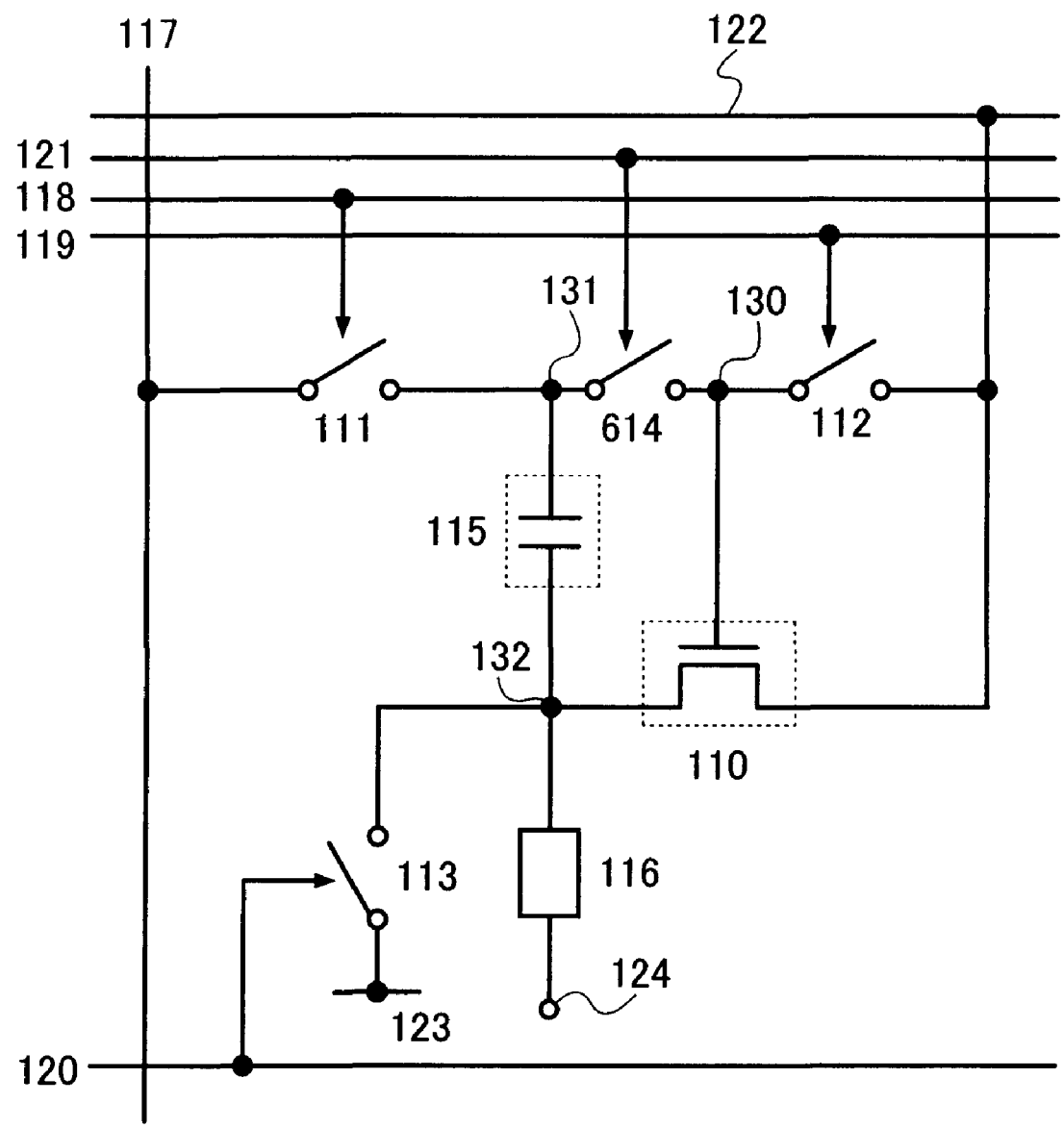
FIG. 6 is a diagram showing a pixel configuration shown in Embodiment Mode 1.

In addition, various connections of the switches can be employed as long as an operation which is similar to that in FIG. 1 is performed, so that the invention is not limited to FIG. 1. As it can be seen from FIGS. 3A to 3D showing the operations of the pixel configuration in FIG. 1, in the invention, it is necessary to have electrical continuity in the initialization period, the threshold voltage writing period, data writing period, and the light-emitting period as shown by a solid line in each of FIGS. 44A to 44D. Therefore, any configuration may be employed as long as a switch or the like is provided so as to satisfy this and can be operated. For example, the fourth switch 114 shown in FIG. 1 may be connected between the node 130 and the node 131, and FIG. 6 shows such a configuration. Note that the fourth switch 114 in FIG. 1 corresponds to a fourth switch 614, and common reference numerals are used for portions which are common to the portions in the configuration in FIG. 1 and the description is omitted.

Also in the pixel configuration in FIG. 6, variations of the current value caused by variations in the threshold voltage of the transistor 110 can be suppressed by an operating method which is similar to that in FIG. 1. Therefore, the current in accordance with luminance data can be supplied to the light-emitting element 116, so that variations in luminance can be suppressed. In the case of operating the transistor 110 in the saturation region, variations in luminance caused by deterioration of the light-emitting element 116 can also be suppressed.

In addition, the fourth switch 114 shown in FIG. 1 may be provided on a path from the node 132 to a connection point of the second electrode of the transistor 110 and the power supply line 122.

Figure 7:
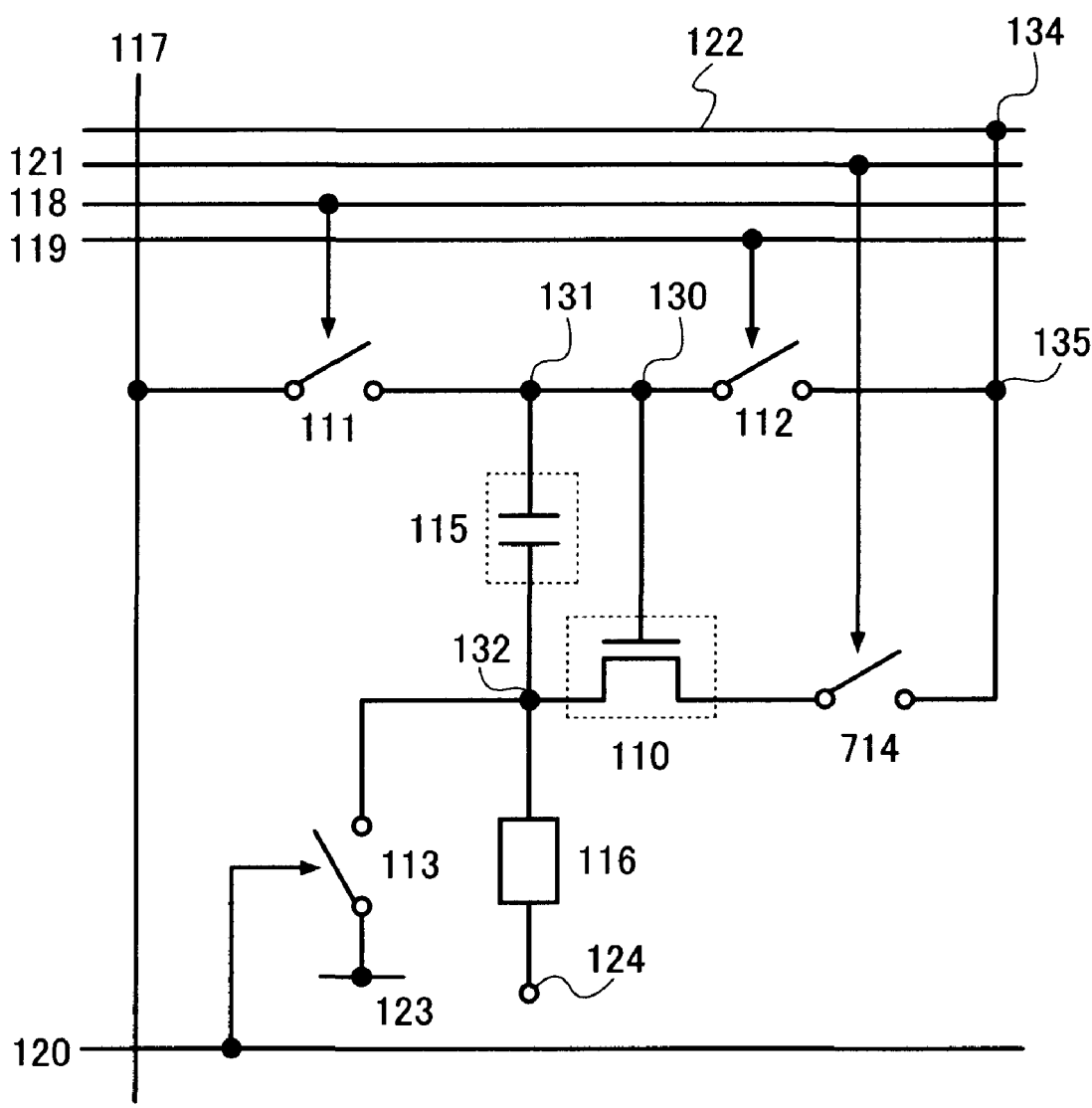
FIG. 7 is a diagram showing a pixel configuration shown in Embodiment Mode 1.

FIG. 7 shows one example of such configuration. Note that a connection point of the second electrode of the transistor 110 and the power supply line 122 is denoted by a node 134. In the configuration in FIG. 7, the fourth switch 114 in FIG. 1 corresponds to a fourth switch 714 and the fourth switch 714 is connected between the second electrode of the transistor 110 and the node 134. Note that common reference numerals are used for portions which are common to the portions in the configuration in FIG. 1 and the description is omitted.

Also in the case where the transistor 110 is turned on by the fourth switch 714 at the time of data writing, the current flowing to the transistor 110 can be interrupted by turning off the fourth switch 714. Therefore, fluctuation of the potential of the second electrode of the capacitor 115 in the data writing period can be suppressed.

Figure 45:
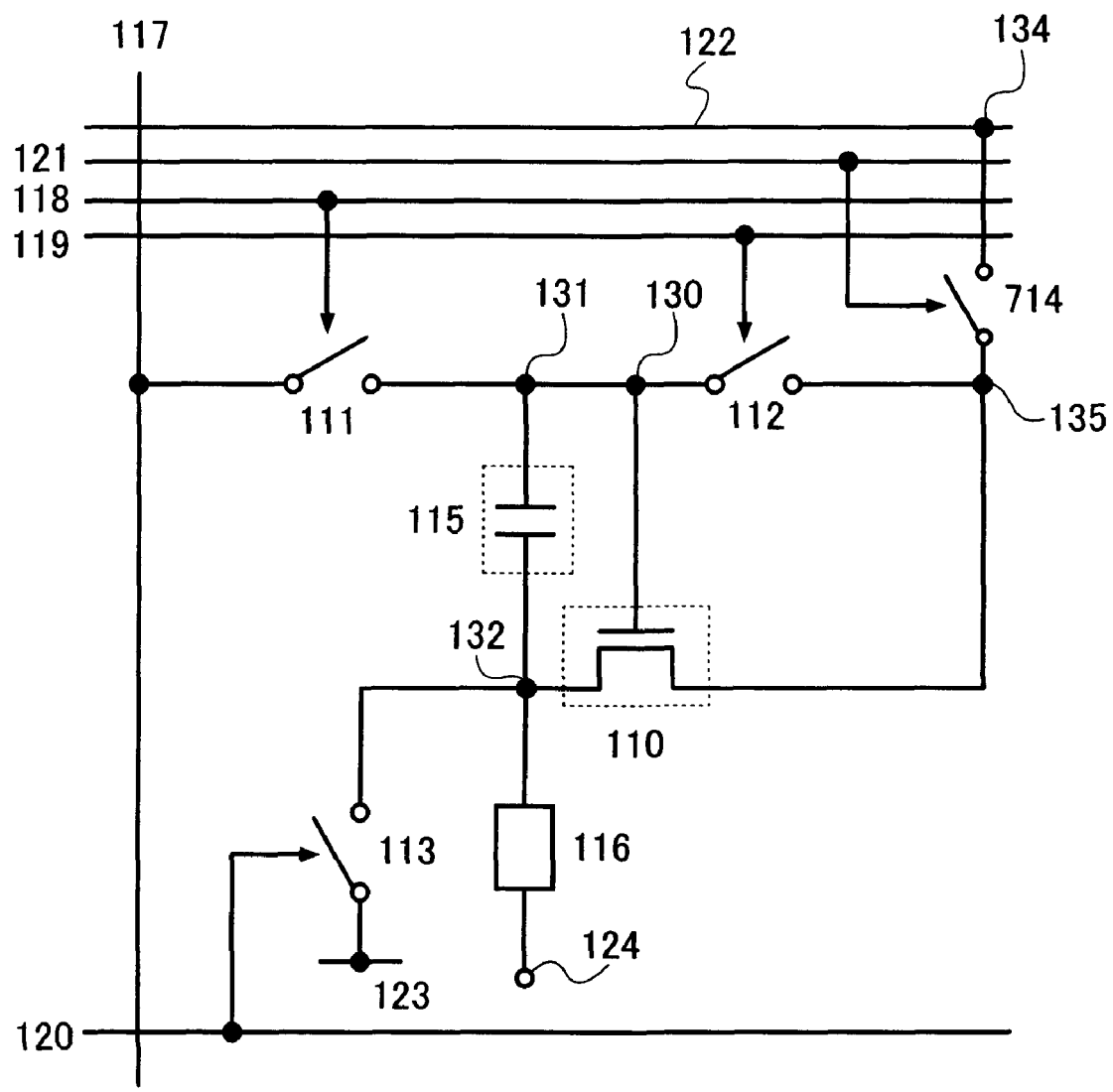
FIG. 45 is a diagram showing a pixel configuration shown in Embodiment Mode 1.

Accordingly, also in the pixel configuration in FIG. 7, variations of the current value caused by variations in the threshold voltage of the transistor 110 can be suppressed by an operating method which is similar to that in FIG. 1. Therefore, the current in accordance with luminance data can be supplied to the light-emitting element 116, so that variations in luminance can be suppressed. In addition, in the case of operating the transistor 110 in the saturation region, variations in luminance caused by deterioration of the light-emitting element 116 can also be suppressed. Further, in the case of turning off the fourth switch 114 in the initialization period, power consumption can be reduced. Note that when a connection point of the node 134 and the second switch 112 is denoted by a node 135, the fourth switch 714 cannot be turned off in the initialization period in the case where the fourth switch 714 is connected between the node 134 and the node 135 as shown in FIG. 45.

Figure 16:
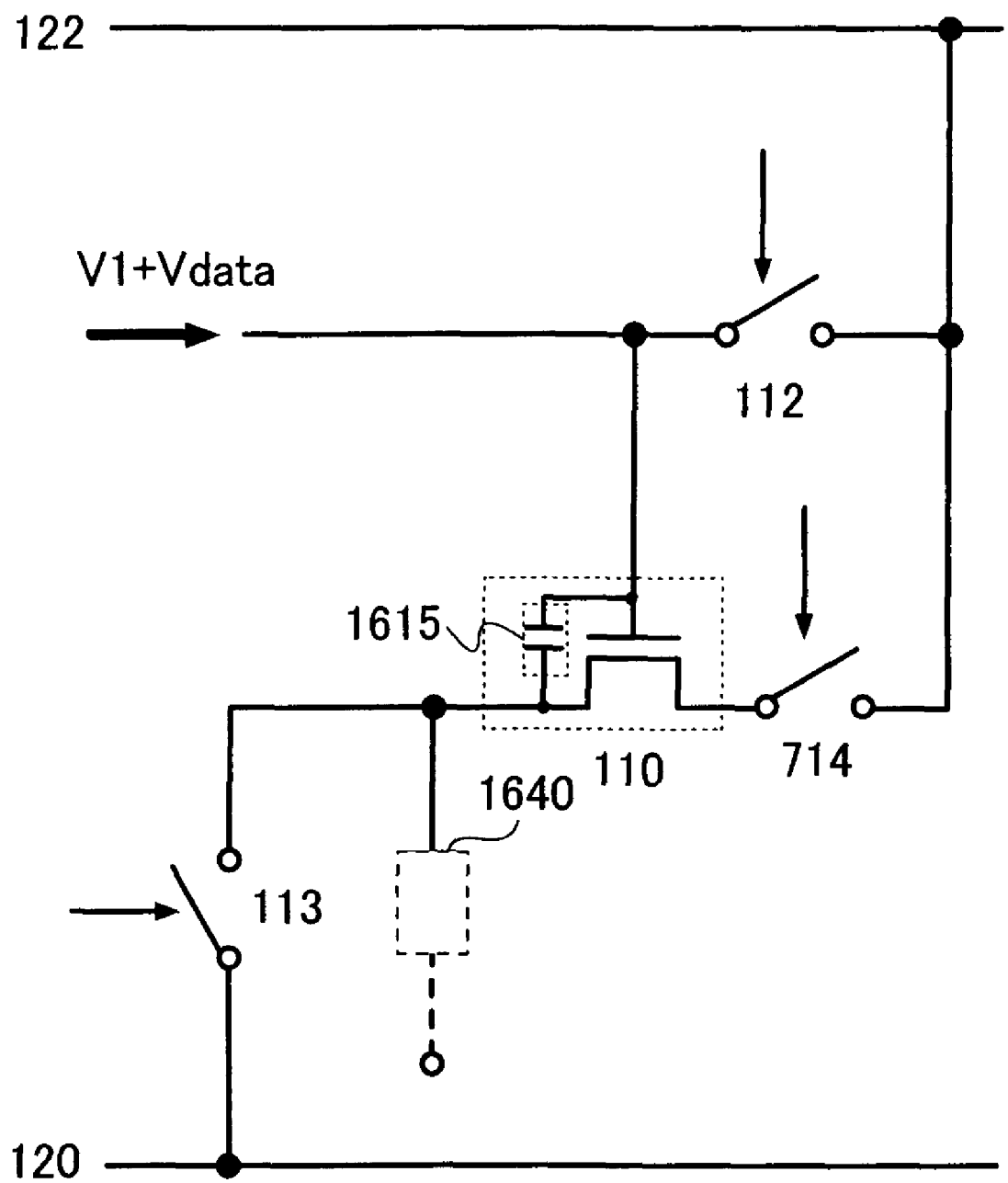
FIG. 16 is a diagram showing a pixel configuration shown in Embodiment Mode 1.

As described above, the first switch 111 is not particularly limited as long as it is a switch which selects timing for inputting the signal in accordance with the gray scale of the pixel from the signal line 117 into the pixel and controls the signal supplied to the gate electrode of the transistor 110. The second switch 112 is not particularly limited as long as it is a switch which selects timing for supplying the predetermined potential to the gate electrode of the transistor 110 and controls whether to supply the predetermined potential to the gate electrode of the transistor 110. The third switch 113 is not particularly limited as long as it is a switch which selects timing for supplying the predetermined potential for initializing the potential written into the capacitor 115 and lowers the potential of the first electrode of the transistor 110. In addition, the first to third switches are not particularly needed if the signal or the potential can be supplied to the pixel at the aforementioned timing. For example, in the case where the signal in accordance with the gray scale of the pixel can be inputted to the pixel, the first switch 111 is not required to be provided as shown in FIG. 16. The pixel shown in FIG. 16 includes the transistor 110, the second switch 112, the third switch 113, the fourth switch 114, and a pixel electrode 1640. The first electrode (one of the source electrode and the drain electrode) of the transistor 110 is connected to the pixel electrode 1640; a second electrode (the other of the source electrode and the drain electrode) of the transistor 110 is connected to the power supply line 122 through the fourth switch 714; and a gate electrode of the transistor 110 is connected to the power supply line 122 through the second switch 112. Further, the first electrode of the transistor 110 is also connected to the potential supply line 123. Note that since a gate capacitance 1615 of the transistor 110 is used as the storage capacitor, the capacitor 115 in FIG. 1 is not particularly required to be provided. Also in such pixel, each switch is operated in accordance with the timing chart shown in FIG. 2 and a desired potential is supplied to each switch, so that variations of the current value caused by variations in the threshold voltage of the transistor 110 can be suppressed. That is, a desired current can be supplied to the pixel electrode 1640.

Figure 8:
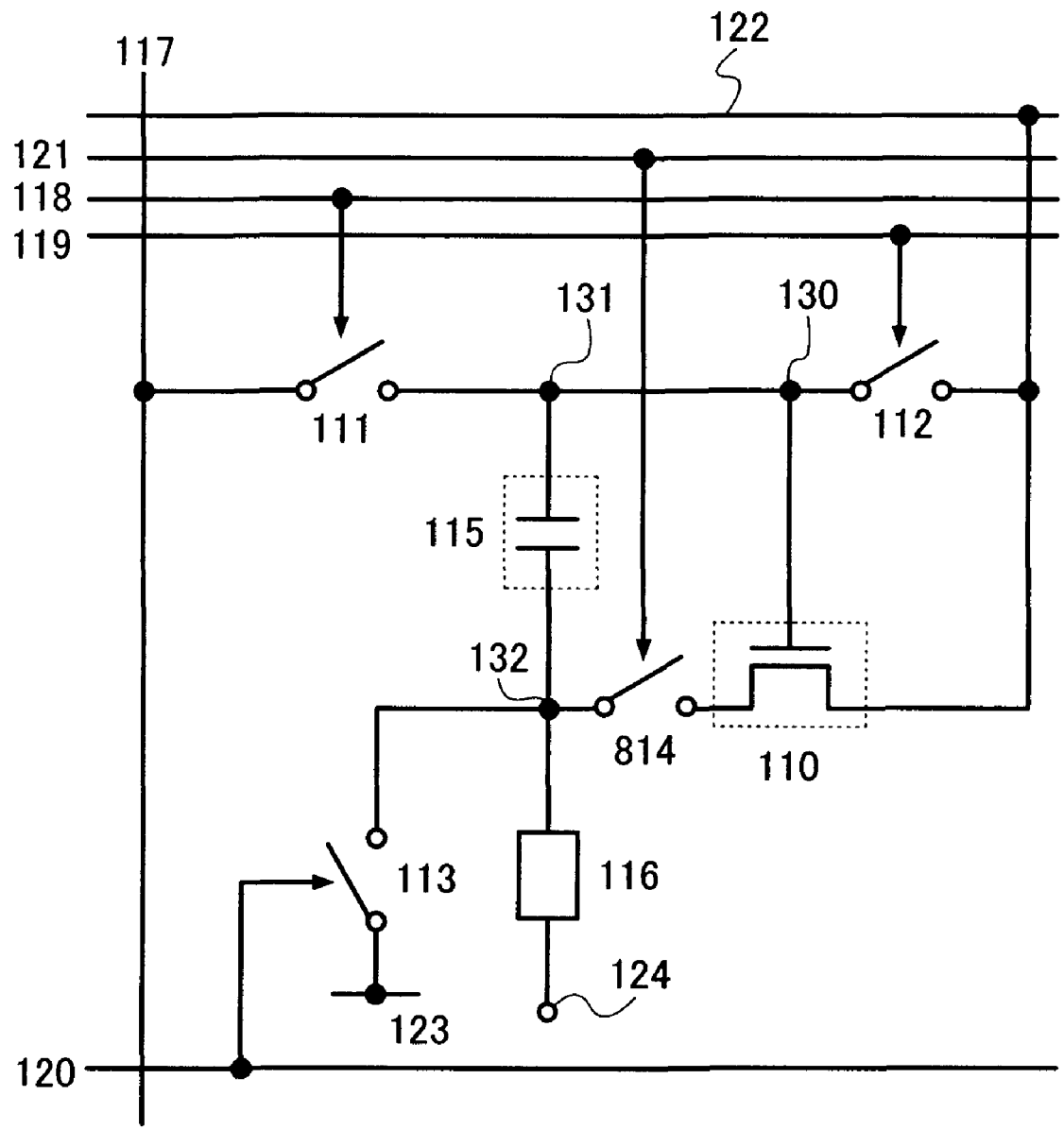
FIG. 8 is a diagram showing a pixel configuration shown in Embodiment Mode 1.

In addition, FIG. 8 shows another configuration. In the configuration in FIG. 8, the fourth switch 114 in FIG. 1 corresponds to a fourth switch 814 and the fourth switch 814 is connected between the first electrode of the transistor 110 and a node 132. Note that common reference numerals are used for portions which are common to the portions in the configuration in FIG. 1 and the description is omitted.

Also in the case where the transistor 110 is turned on by the fourth switch 814 at the time of data writing, the current flowing to the node 132 can be interrupted by turning off the fourth switch 814. Therefore, fluctuation of the potential of the second electrode of the capacitor 115 in the data writing period can be suppressed.

Accordingly, also in the pixel configuration in FIG. 8, variations of the current value caused by variations in the threshold voltage of the transistor 110 can be suppressed by the operating method which is similar to that in FIG. 1. Therefore, the current in accordance with luminance data can be supplied to the light-emitting element 116, so that variations in luminance can be suppressed. In addition, in the case of operating the transistor 110 in the saturation region, variations in luminance caused by deterioration of the light-emitting element 116 can also be suppressed. Further, in the case of turning off the fourth switch 114 in the initialization period, power consumption can be reduced.

Note that each of the fourth switch 614, the fourth switch 714, and the fourth switch 814 may also be a transistor, a diode, or a logic circuit combining them, similarly to the first switch to third switches.

In addition, in the case where the fourth switch is provided on the path from the node 132 to the connection point of the second electrode of the transistor 110 and the power supply line 122 as shown in FIGS. 7 and 8, a non light-emitting state can also be forcibly made by turning off the fourth switch in the light-emitting period. By providing the non light-emitting period in a part of the light-emitting period by such an operation, the light-emitting time can be freely set. Further, by inserting black display, an after image is hardly viewed and moving image characteristics can be improved.

Next, a display device including the aforementioned pixel of the invention is described with reference to FIG. 9.

The display device includes a signal line driver circuit 911, a scan line driver circuit 912, and a pixel portion 913. The pixel portion 913 includes a plurality of signal lines S1 to Sm which are arranged while being extended from the signal line driver circuit 911 in a column direction; a plurality of first scan lines G1_1 to Gn_1, second scan lines G1_2 to Gn_2, third scan lines G1_3 to Gn_3, fourth scan lines G1_4 to Gn_4, power supply lines P1_1 to Pn_1, and potential supply lines P1_2 to Pn_2 which are arranged while being extended from the scan line driver circuit 912 in a row direction; and a plurality of pixels 914 which are arranged in matrix corresponding to the signal lines S1 to Sm. Each pixel 914 is connected to a signal line Sj (one of the signal lines S1 to Sm), a first scan line Gi_1 (one of the scan lines G1_1 to Gn_1), a second scan line Gi_2, a third scan line Gi_3, a fourth scan line Gi_4, a power supply line Pi_1, and a potential supply line Pi_2.

Note that the signal line Sj, the first scan line Gi_1, the second scan line Gi_2, the third scan line Gi_3, the fourth scan line Gi_4, the power supply line Pi_1, and the potential supply line Pi_2 correspond to the signal line 117, the first scan line 118, the second scan line 119, the third scan line 120, the fourth scan line 121, the power supply line 122, and the potential supply line 123 in FIG. 1, respectively.

In response to a signal output from the scan line driver circuit 912, the operations shown in FIG. 2 are performed in each of pixels of one row as well as the row of the pixels to be operated is selected. Note that in the data writing period in FIG. 2, a video signal output from the signal line driver circuit 911 is written into each of the pixels of the selected row. At this time, a potential in accordance with luminance data of each pixel is inputted to each of the signal lines S1 to Sm.

As shown in FIG. 10, for example, when a data writing period of an i-th row is terminated, writing of a signal into pixels in an i+1 row is performed. Note that in order to show the data writing period of each row, FIG. 10 shows only the operation of the first switch 111 in FIG. 2 which can precisely show the period. Then, a pixel which terminates the data writing period in the i-th row proceeds to a light-emitting period and emits light in accordance with the signal written into the pixel.

Therefore, unless the data writing periods of each rows overlaps, an initialization start period can be freely set in each row. In addition, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since the threshold voltage writing period can also be set long, the threshold voltage of the transistor can be written in the capacitor more accurately. Therefore, reliability as a display device can be improved.

Figure 9:
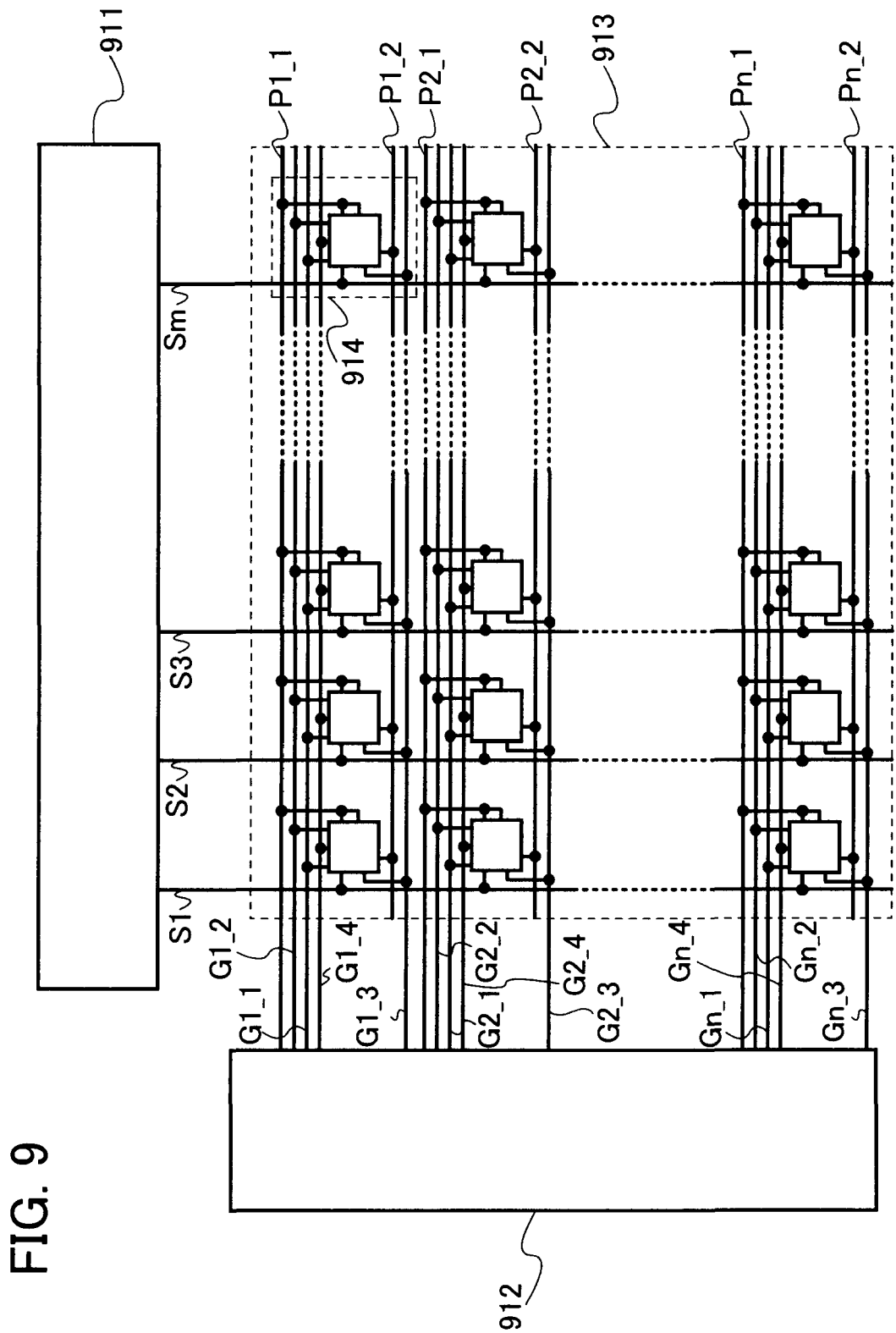
FIG. 9 is a diagram showing a display device shown in Embodiment Mode 1.

Note that the configuration of the display device shown in FIG. 9 is only one example, so that the invention is not limited to this. For example, the potential supply lines P1_2 to Pn_2 are not required to be arranged in parallel with the first scan lines G1_1 to Gn_1, and may be arranged in parallel with the signal lines S1 to Sm.

Meanwhile, as a driving method of the display device for expressing a gray scale, there are an analog gray scale method and a digital gray scale method. The analog gray scale method includes a method which controls emission intensity of a light-emitting element in an analog manner and a method which controls light-emitting time of a light-emitting element in an analog manner. In the analog gray scale method, the method which controls emission intensity of a light-emitting element in an analog manner is often used. On the other hand, in the digital gray scale method, a gray scale is expressed by controlling on/off of a light-emitting element in a digital manner. In the case of the digital gray scale method, there is an advantage of high noise resistance because data processing can be performed with a digital signal; however, since the digital driving method has only two states of a light-emitting state and a non light-emitting state, the digital driving method can only display two gray scales by itself. Therefore, multi-gray scale display has been realized by combining with another method. As a technique for multi-gray scale display, there are an area gray scale method in which light-emitting areas of pixels are weighted and selected to perform gray scale display and a time gray scale method in which light-emitting time is weighted and selected to perform gray scale display.

Figure 43:
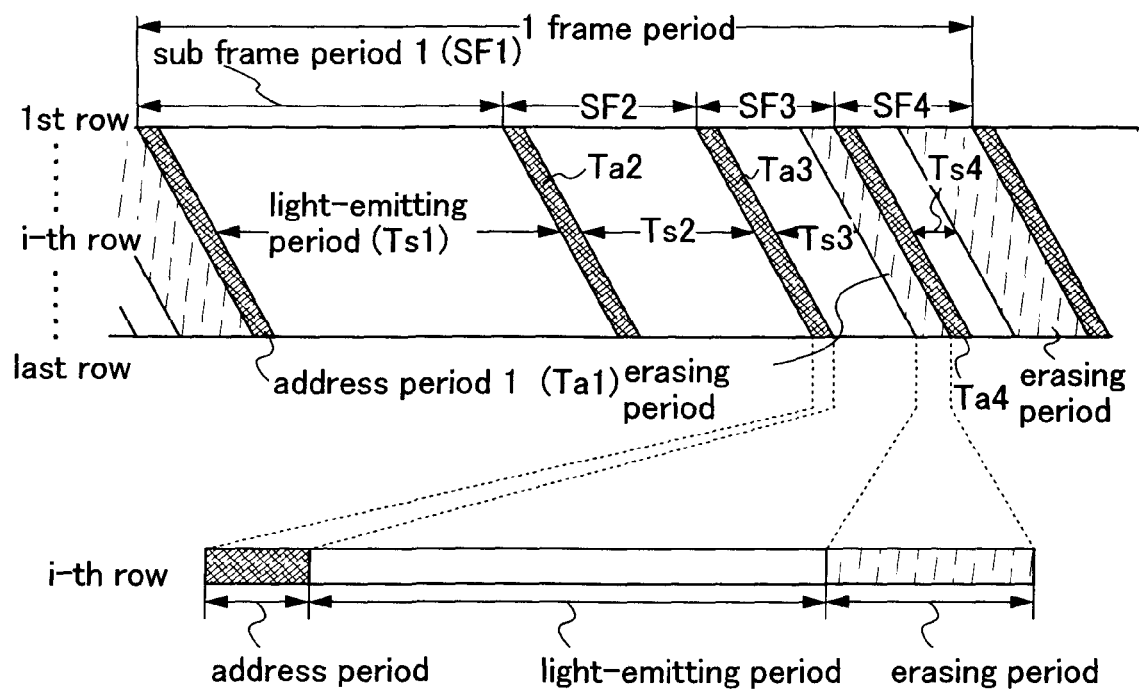
FIG. 43 is a chart showing a driving method in which a digital gray scale method and a time gray scale method are combined.

In the case of combining the digital gray scale method and the time gray scale method, one frame period is divided into a plurality of subframe periods (SFn) as shown in FIG. 43. Each subframe period includes an address period having an initialization period, a threshold voltage writing period, and a data writing period, and a light-emitting period (Ts). Note that the number of the subframe periods which are provided in one frame period corresponds to the number of display bits n. In addition, in one frame period, a ratio of length of light-emitting periods in respective subframe periods is set to satisfy $2^{(n-1)}:2^{(n-2)}: \ldots :2:1$, light-emission or non light-emission of a light-emitting element in each light-emitting period is selected, and thus, gray scales are expressed by utilizing difference in total light-emitting time in one frame period in which the light-emitting element emits light. In one frame period, luminance is high when the total light-emitting time is long, and luminance is low when the total light-emitting time is short. Note that FIG. 43 shows an example of a 4-bit gray scale, in which one frame period is divided into four subframe periods and $2^4=16$ gray scales can be expressed by a combination of light-emitting periods. Note that gray scales can be expressed even when a ratio of length of the light-emitting periods is not a power-of-two ratio. Further, one subframe period may further be divided.

Note that in the case of realizing multi-gray scale display by using the time gray scale method as described above, length of the light-emitting period of a low-order bit is short. Therefore, when a data writing operation of the next subframe period is started immediately after termination of the light-emitting period, the data writing operation overlaps with the data writing operation of a previous subframe period, so that normal operation cannot be performed. Thus, the fourth switch is provided between the node 132 to the connection point of the second electrode of the transistor 110 and the power supply line 122 as shown in FIGS. 7 and 8 and a non light-emitting state is forcibly made by turning off the fourth switch in a part of the light-emitting period, so that light emission having shorter length than data writing periods which are required for all rows can be expressed. Accordingly, this is effective not only in the analog gray scale method, but also in the method combining the digital gray scale method and the time gray scale method. Note also that since it is only necessary that a current does not flow to the light-emitting element in order to obtain the non light-emitting state, the non light-emitting state can be obtained by lowering the potential of the power supply line 122 or by turning on the third switch 113, as well as turning off the fourth switch as described above. In addition, the non light-emitting state can also be obtained by making the gate-source voltage of the transistor 110 equal to or less than the threshold voltage thereof, and for example, the non light-emitting state can be obtained by additionally providing a switch in parallel with the capacitor 115 and electrically connecting between the gate and the source of the transistor 110 by using the switch.

Note that variations in the threshold voltage include not only a difference between the threshold voltage of each transistor of pixels, but also include fluctuation over time in the threshold voltage in the case of paying attention to one transistor. In addition, the difference between the threshold voltage of each transistor also includes a difference in transistor characteristics at the time of manufacturing each transistor. Note that the transistor here means a transistor having a function of supplying a current to a load such as a light-emitting element.

Embodiment Mode 2

Figure 11A:
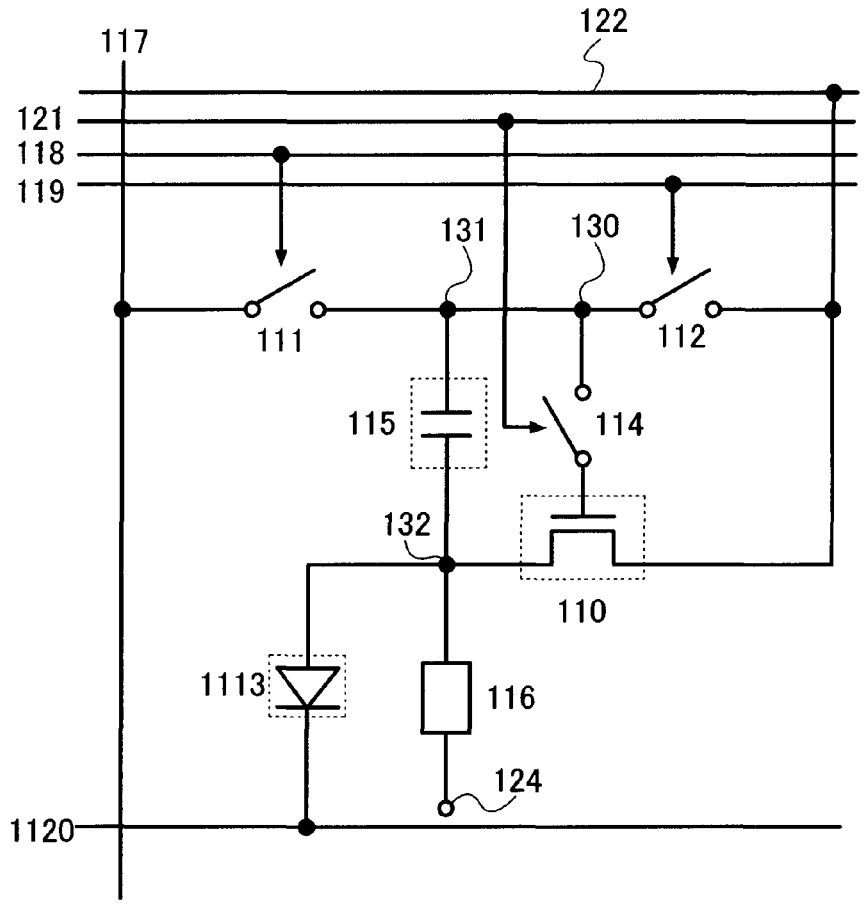
FIGS. 11A to 11F are diagrams each showing a pixel configuration shown in Embodiment Mode 2.

In this embodiment mode, FIG. 11A shows a configuration of a pixel which is different from Embodiment Mode 1. Note that common reference numerals are used for portions which are similar to Embodiment Mode 1 and detailed description of the same portions or portions having similar functions is omitted.

Figures 11B, 11C, 11D, 11E:
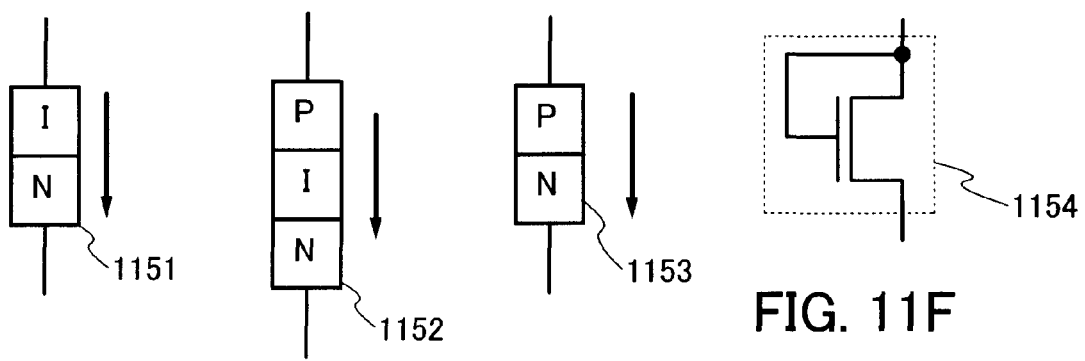
Figure 11F:
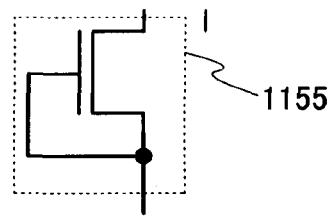

A pixel shown in FIG. 11A includes the transistor 110, the first switch 111, the second switch 112, the fourth switch 114, a rectifying element 1113, the capacitor 115, and the light-emitting element 116. Note that the pixel is connected to the signal line 117, the first scan line 118, the second scan line 119, a third scan line 1120, the fourth scan line 121, and the power supply line 122. The pixel shown in FIG. 11A has a configuration in which the rectifying element 1113 is used as the third switch 113 in FIG. 3, and the second electrode of the capacitor 115, the first electrode of the transistor 110, and the pixel electrode of the light-emitting element 116 are connected to the third scan line 1120 through the rectifying element 1113. That is, the rectifying element 1113 is connected so that a current flows from the first electrode of the transistor 110 to the third scan line 1120. Needless to say, as shown in Embodiment Mode 1, a transistor or the like may be used as each of the first switch 111, the second switch 112, and the fourth switch 114. In addition, diode-connected transistors 1154 and 1155 shown in FIGS. 11E and 11F can be used as the rectifying element 1113 as well as a Schottky barrier diode 1151, a PIN diode 1152, a PN diode 1153, or the like shown in FIGS. 11B to 11D. Note that in each the transistors 1154 and 1155, the polarity of the transistor is needed to be selected as appropriate depending of a direction of a current flow.

A current does not flow to the rectifying element 1113 when an H-level signal is inputted to the third scan line 1120, and a current flows to the rectifying element 1113 when an L-level signal is inputted to the third scan line 1120. Therefore, in the case of operating the pixel in FIG. 11A similarly to the pixel shown in FIG. 1, an L-level signal is inputted to the third scan line 1120 in the initialization period and an H-level signal is inputted to the third scan line 1120 in other periods. Note that since not only a current flows to the rectifying element 1113, but also the potential of the second electrode of the capacitor 115 is required to be lowered to V1−Vth−α (α: an arbitrary positive number), a potential of the L-level signal is V1−Vth−α−β (α, β: an arbitrary positive number). Note that β shows the threshold voltage in a forward direction of the rectifying element 1113. Further, the L-level signal may be made lower than the potential of the opposite electrode 124 of the light-emitting element and a reverse bias voltage may be applied to the light-emitting element 116 in the initialization period. On the other hand, since the H-level signal is not particularly limited as long as a current does not flow to the rectifying element 1113 as described above, the H-level signal may be any signal which is larger than a value obtained by subtracting the threshold voltage of the rectifying element 1113 from V1−Vth, that is, V1−Vth−β.

Considering the aforementioned description, by performing an operation which is similar to that in Embodiment Mode 1 also in the pixel configuration in FIG. 11A, variations in a current value caused by variations in the threshold voltage of the transistor 110 can be suppressed. Therefore, a current in accordance with luminance data can be supplied to the light-emitting element 116, so that variations in luminance can be suppressed. In addition, in the case of operating the transistor 110 in the saturation region, variations in luminance caused by deterioration of the light-emitting element 116 can also be suppressed. Further, by using the rectifying element 1113, the number of wirings can be reduced, so that an aperture ratio can be improved.

In addition, the pixel shown in this embodiment mode can be applied to the display device in FIG. 9. Similarly to Embodiment Mode 1, unless the data writing periods of each rows overlaps, an initialization start period can be freely set in each row. Further, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since a threshold voltage writing period can also be set long, the threshold voltage of a transistor which controls a current value flowing to the light-emitting element can be written in the capacitor more accurately. Therefore, reliability as a display device can be improved.

This embodiment mode can also be freely combined with any pixel configuration shown in another embodiment mode in addition to the pixel configuration in FIG. 1. For example, the case where the fourth switch 114 is connected between the node 130 and the node 131 or between the first electrode of the transistor 110 and the node 132 and the case where the second electrode of the transistor 110 is connected to the power supply line 122 through the fourth switch 114 are given as examples. The invention is not limited to this, and the rectifying element 1113 can also be applied to the pixels shown in other embodiment modes.

Embodiment Mode 3

In this embodiment mode, FIGS. 12 to 15 show configurations each a pixel which is different from Embodiment Modes 1 and 2. Note that although description is made by paying attention to one pixel in Embodiment Modes 1 and 2, the number of wirings can be reduced by sharing a wiring connected to each pixel among pixels. In this case, if normal operation can be performed, various wirings can be shared among the pixels. For example, a wiring can be shared with the next pixel and this embodiment mode shows one example of the method. Note that common reference numerals are used for portions which are similar to Embodiment Mode 1 and detailed description of the same portions or portions having similar functions is omitted.

Figure 12:
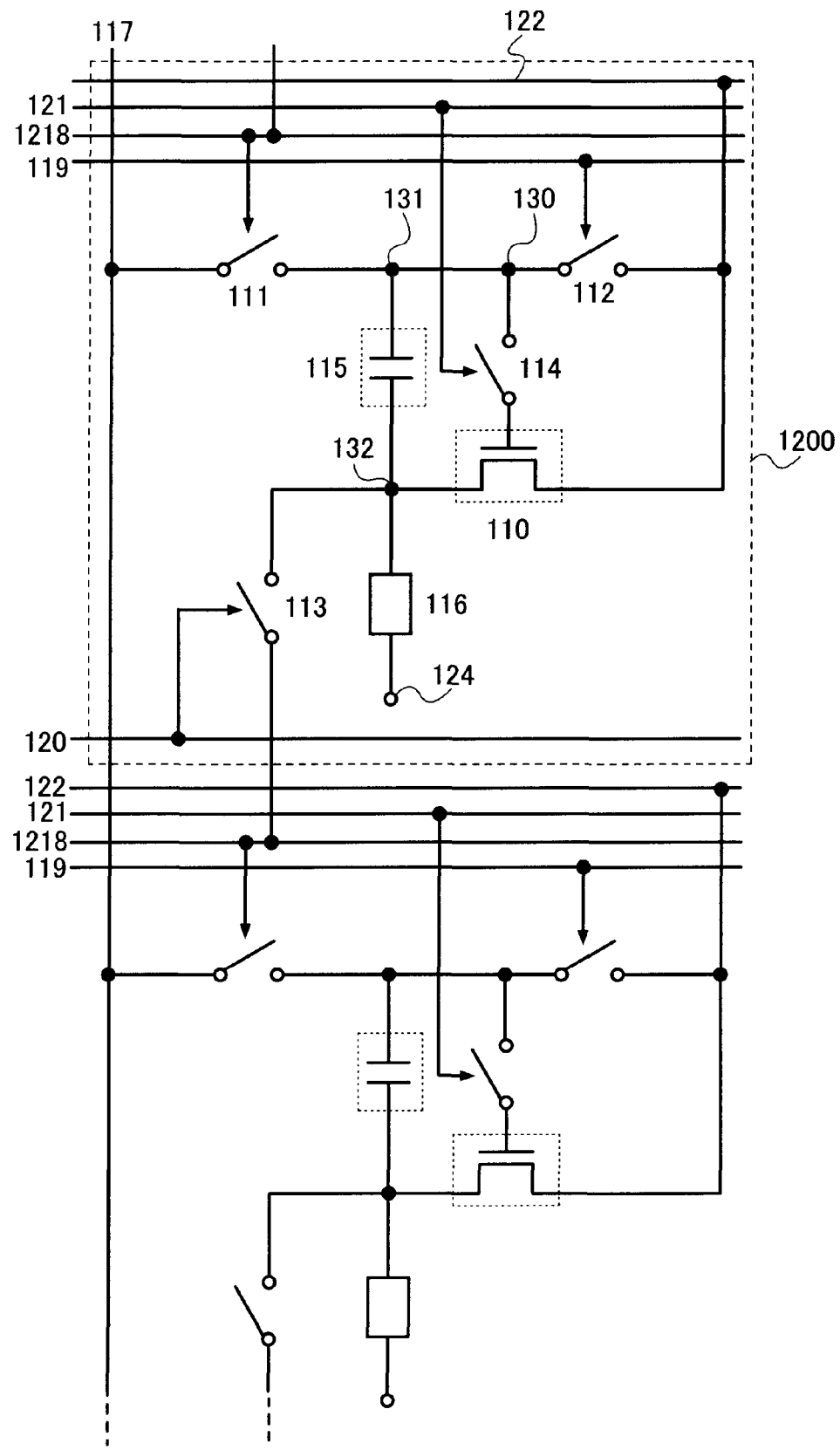
FIG. 12 is a diagram showing a pixel configuration shown in Embodiment Mode 3.

A pixel 1200 shown in FIG. 12 includes the transistor 110, the first switch 111, the second switch 112, the third switch 113, the fourth switch 114, the capacitor 115, and the light-emitting element 116. Note that the pixel 1200 is connected to the signal line 117, a first scan line 1218, the second scan line 119, the third scan line 120, the fourth scan line 121, the power supply line 122, and a first scan line 1218 in the following row.

Although the second electrode of the capacitor 115 is connected to the potential supply line 123 through the third switch 113 in the pixel shown in FIG. 1 in Embodiment Mode 1, the second electrode of the capacitor 115 can be connected to the first scan line 1218 of the following row in FIG. 12. This is because it is only necessary that a predetermined potential is supplied to the second electrode of the capacitor 115 in the initialization period, without limiting to the potential supply line 123. Therefore, as long as the predetermined potential can be supplied to the second electrode of the capacitor 115 in the initialization period, a wiring which supplies a potential is not always required to have a constant potential. Thus, the first scan line 1218 of the following row can be used instead of the potential supply line 123. By sharing the wiring with the following row in this manner, the number of wirings can be reduced, so that an aperture ratio can be improved.

Note that by performing operations similar to those in Embodiment Mode 1 also in the pixel configuration in FIG. 12, variations in a current value caused by variations in the threshold voltage of the transistor 110 can be suppressed. Therefore, a current in accordance with luminance data can be supplied to the light-emitting element 116, so that variations in luminance can be suppressed. In addition, since the transistor 110 is operated with a potential of an opposite electrode fixed at a constant potential, power consumption can be reduced. Note that although an operation region of the transistor 110 is not particularly limited, an advantageous effect of the invention becomes more apparent when the transistor 110 is operated in the saturation region. Further, in the case of operating the transistor 110 in the saturation region, variations in a current flowing to the transistor 110 caused by deterioration of the light-emitting element 116 can be suppressed.

Note that a signal turning off the first switch 111 in the first scan line 1218 is a potential of V1−Vth−α (α: an arbitrary positive number). Therefore, it is necessary to use the first switch 111 which is turned off by the potential of V1−Vth−α (α: an arbitrary positive number). In addition, it is necessary to operate such that the initialization period of a row of the pixel 1200 does not overlap with the data writing period of a row which shares the wiring with the row of the pixel 1200.

Note that in the case of using an N-channel transistor as the third switch 113, a potential which turns off the third switch 113 in the third scan line 120 may be lower than the potential of V1−Vth−α which is the signal turning off the first switch 111 in the first scan line 1218. In this case, a gate-source voltage of the transistor in an off state can be made a negative value, so that current leakage when the third switch 113 is off can be reduced.

Although the potential of V1−Vth−α is used as the signal turning off the first switch 111 in the aforementioned description, it may also be used as a signal turning on the first switch 111. Note that limitation of the operations is different from that in the aforementioned description.

Figure 13:
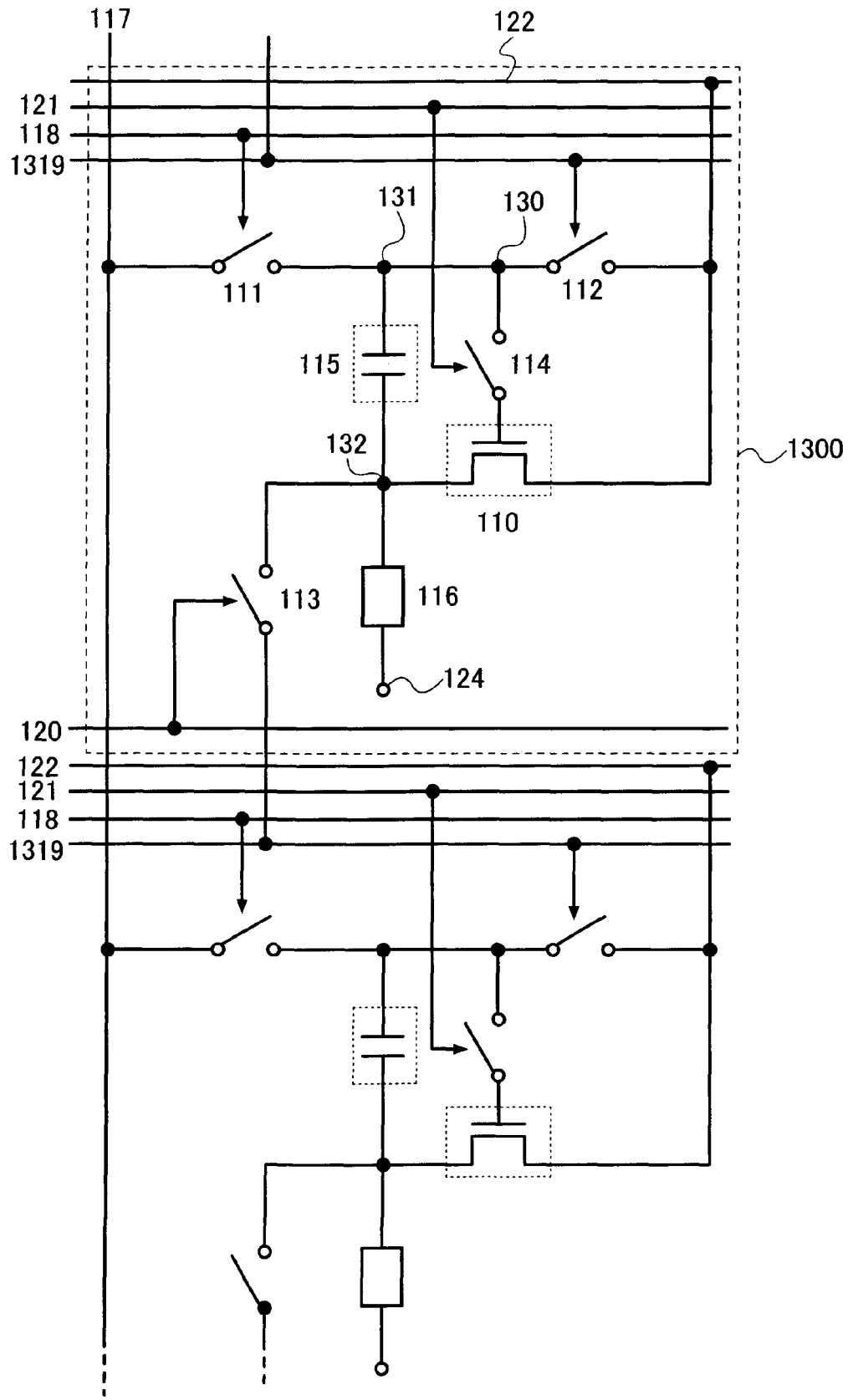
FIG. 13 is a diagram showing a pixel configuration shown in Embodiment Mode 3.

In addition, as shown in a pixel 1300 in FIG. 13, the potential supply line 123 in FIG. 1 may be shared with a second scan line 1319 of the following row. Also in the pixel 1300, operations which are similar to those in Embodiment Mode 1 can be performed. Note that it is preferable that a signal turning off the second switch 112 in the second scan line 1319 be a potential of V1−Vth−α (α: an arbitrary positive number). In this case, it is necessary to use the second switch 112 which is turned off by the potential of V1−Vth−α (α: an arbitrary positive number). In addition, it is necessary to operate such that the initialization period of a row of the pixel 1300 does not overlap with the data writing period of a row which shares the wiring with the row of the pixel 1300.

Note that in the case of using an N-channel transistor as the third switch 113, a potential which turns off the third switch 113 in the third scan line 120 may be lower than the potential of V1−Vth−α which is the signal turning off the second switch 112 in the second scan line 1319. In this case, current leakage when the third switch 113 is off can be reduced.

Although the potential of V1−Vth−α is used as the signal turning off the second switch 112 in the aforementioned description, it may also be used as a signal turning on the second switch 112. Note that limitation of the operations is different from that in the aforementioned description.

Figure 14:
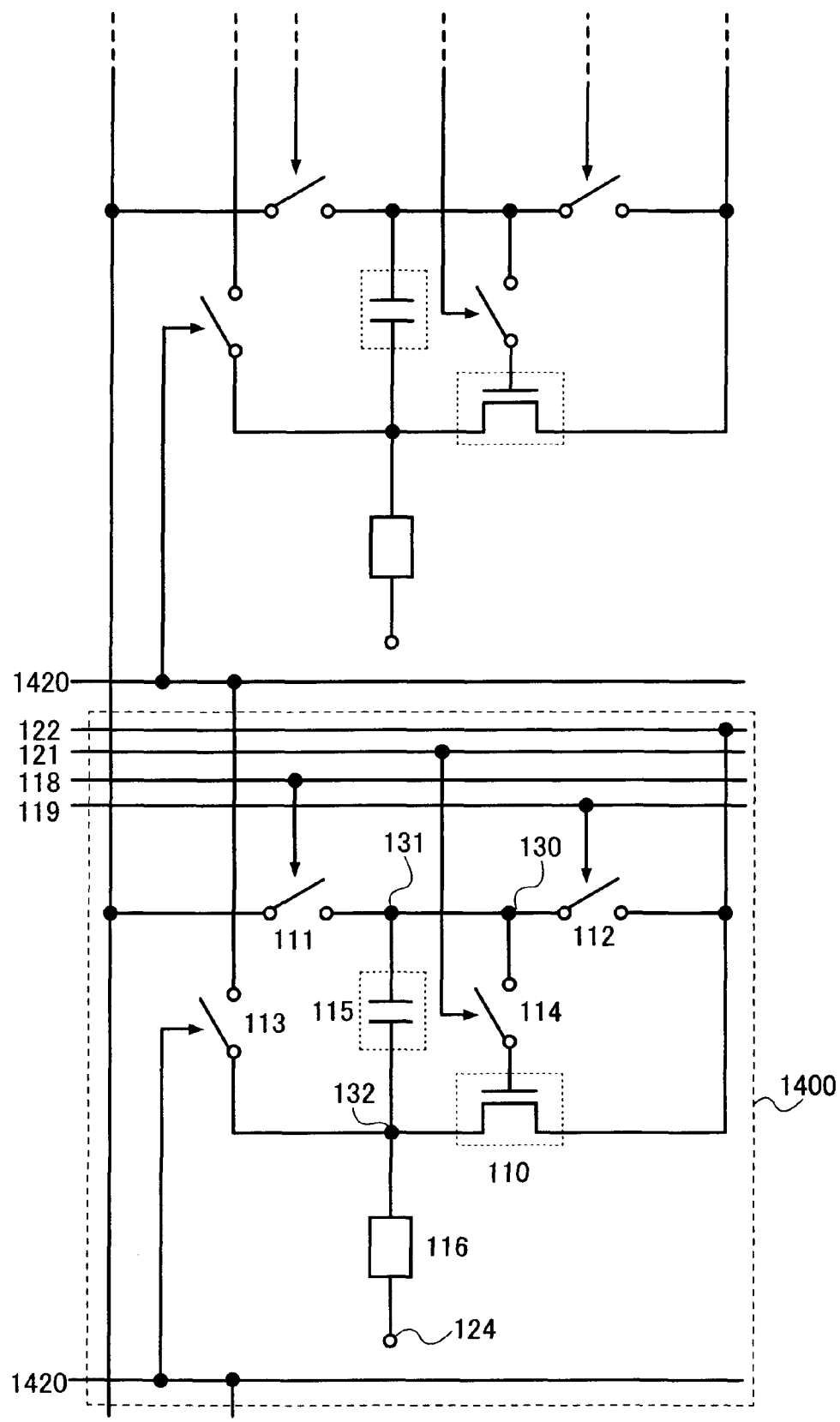
FIG. 14 is a diagram showing a pixel configuration shown in Embodiment Mode 3.

In addition, as shown in a pixel 1400 in FIG. 14, the potential supply line 123 in FIG. 1 may be shared with a third scan line 1420 of a previous row. Also in the pixel 1400, operations which are similar to those in Embodiment Mode 1 can be performed. Note that a signal turning off the third switch 113 in the third scan line 1420 is a potential of V1−Vth−α (α: an arbitrary positive number). Therefore, it is necessary to use the third switch 113 which is turned off by the potential of V1−Vth−α (α: an arbitrary positive number). In this case, although it is necessary to operate such that the initialization period of a row of the pixel 1400 does not overlap with the initialization period of a row which shares a wiring with the row of the pixel 1400, it does not particularly matter when the initialization period is set to be shorter than the data writing period.

Although the potential of V1−Vth−α is used as the signal turning off the third switch 113 in the aforementioned description, it may also be used as a signal turning on the third switch 113. Note that limitation of the operations is different from that in the aforementioned description.

Figure 15:
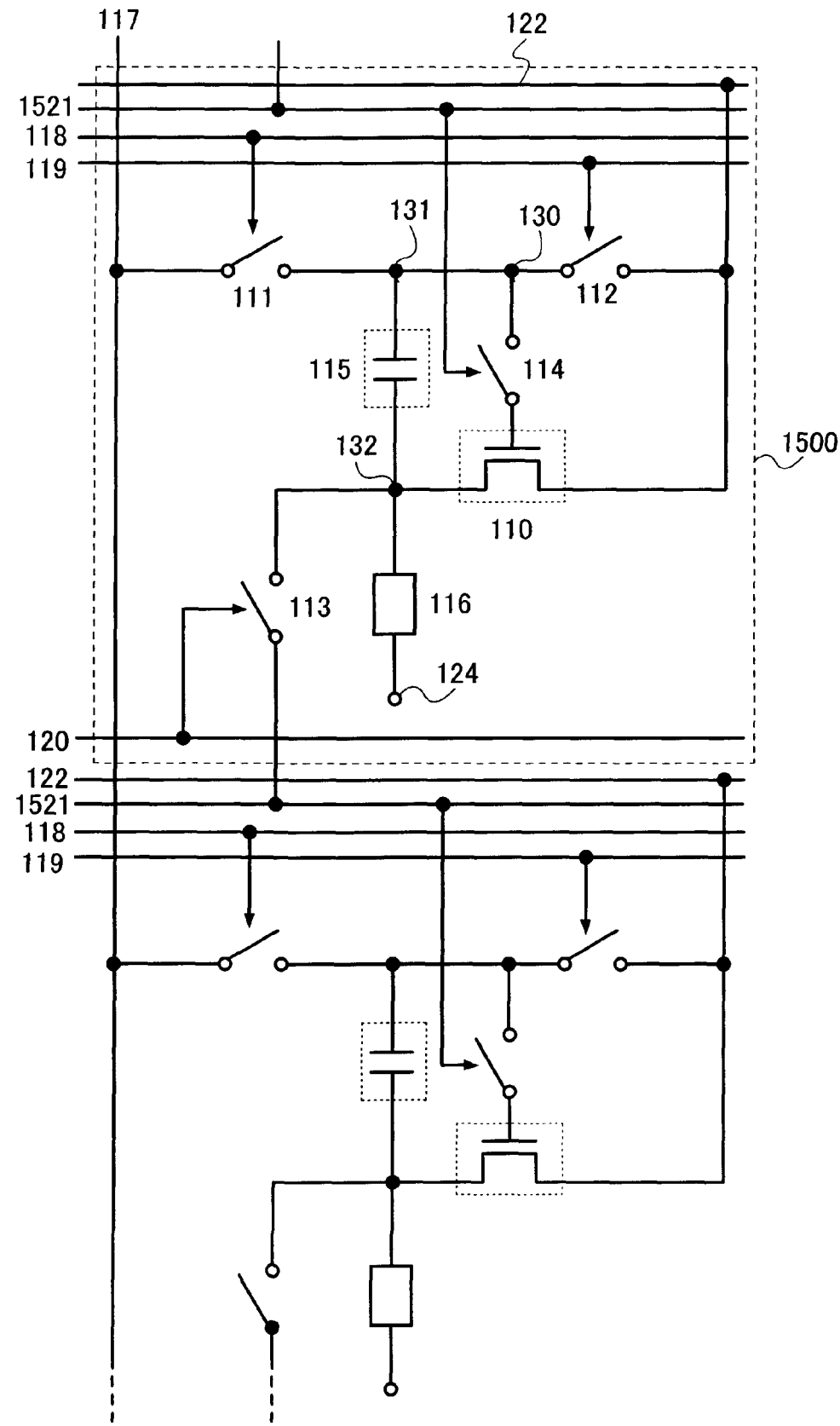
FIG. 15 is a diagram showing a pixel configuration shown in Embodiment Mode 3.

In addition, as shown in a pixel 1500 in FIG. 15, the potential supply line 123 in FIG. 1 may be shared with a fourth scan line 1521 of the following row. Also in the pixel 1500, operations which are similar to those in Embodiment Mode 1 can be performed. Note that in the fourth scan line 1521, it is preferable that the fourth switch 114 which is turned on when a potential of V1−Vth−α (α: an arbitrary positive number) is input thereinto be used. In this case, it is necessary to operate such that the initialization period of a row of the pixel 1500 does not overlap with the data writing period of a row which shares the wiring with the row of the pixel 1500. Further, in the case of turning off the fourth switch 114 in the initialization period, it is necessary to operate such that the initialization period of the row of the pixel 1500 does not overlap with the initialization period of the row which shares the wiring with the row of the pixel 1500.

Although the potential of V1−Vth−α is used as the signal turning on the fourth switch 114 in the aforementioned description, it may also be used as a signal turning off the fourth switch 114. Note that limitation of the operations is different from that in the aforementioned description.

In addition to the aforementioned description, the potential supply line 123 in FIG. 1 may be shared with the power supply line 122 of the following row. In that case, three kinds of potentials V1, V2, and V1−Vth−α (α: an arbitrary positive number) are supplied to the power supply line 122, and a pixel configuration in which operations which are similar to those in Embodiment mode 1 can be performed may be employed.

Although the case is described in which the potential supply line 123 in FIG. 1 is shared with the scan line of the following row or the previous row in this embodiment mode, another wiring may be used as long as it can supply a potential of V1−Vth−α (α: an arbitrary positive number) in the initialization period.

Further, pixel shown in this embodiment mode can be applied to the display device in FIG. 9. An initialization start period can be freely set in each row within a limitation of the operations in each pixel shown in FIGS. 12 to 15 and a range in which the data writing period in each row does not overlap. In addition, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since a threshold voltage writing period can also be set long, the threshold voltage of a transistor which controls a current value flowing to the light-emitting element can be written in the capacitor more accurately. Therefore, reliability as a display device can be improved.

The fourth switch 114 is not necessarily connected between the node 130 and the gate electrode of the transistor 110, and may be connected between the node 130 and the node 131 or the first electrode of the transistor 110 and the node 132. In addition, the second electrode of the transistor 110 may be connected to the power supply line 122 through the fourth switch 114.

This embodiment mode can be freely combined with any pixel configuration shown in another embodiment mode, without limiting to the aforementioned description.

Embodiment Mode 4

Figure 29:
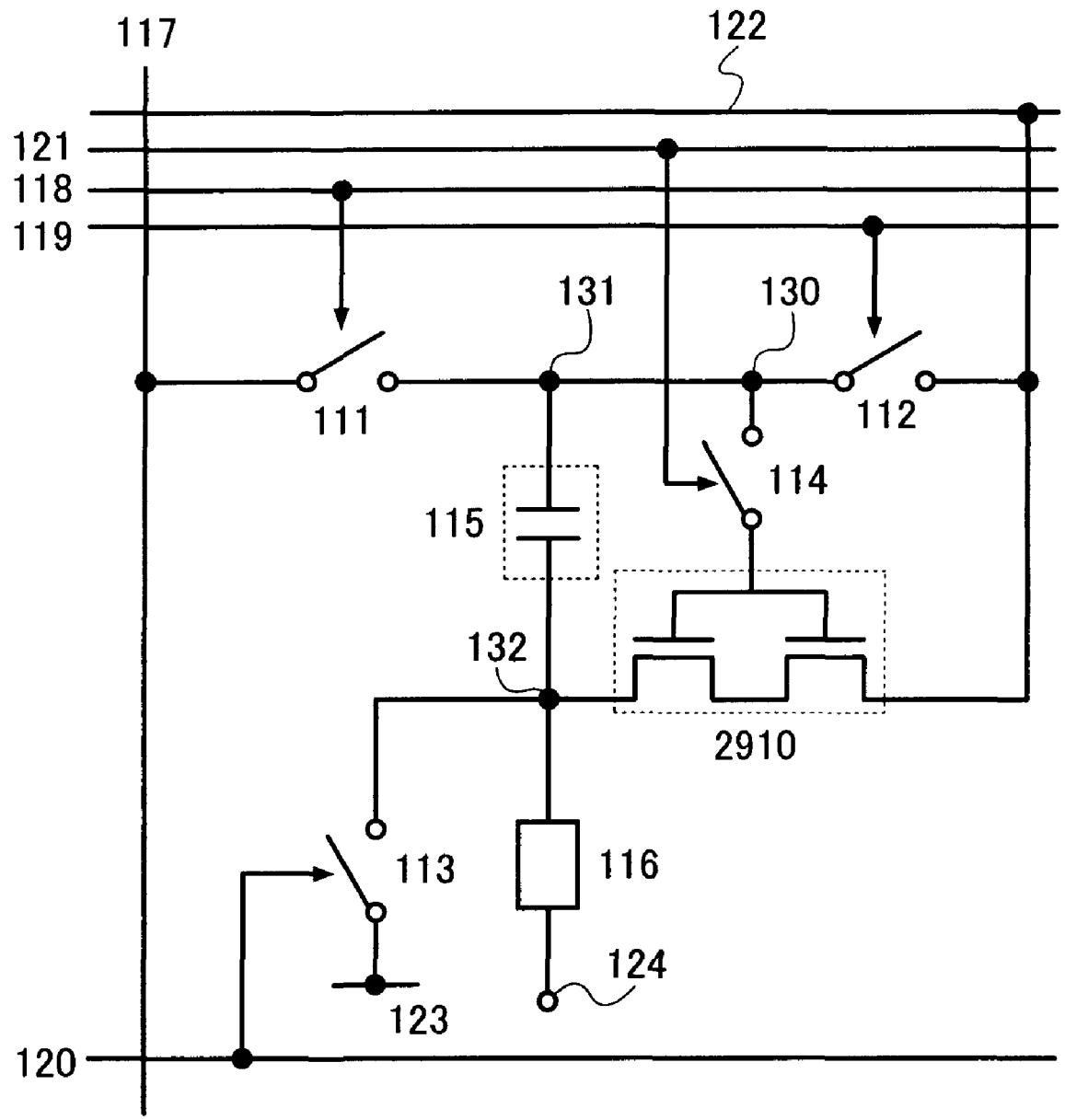
FIG. 29 is a diagram showing a pixel configuration shown in Embodiment Mode 4.

In this embodiment mode, FIG. 29 shows a configuration of a pixel which is different from Embodiment Mode 1. Note that common reference numerals are used for portions which are similar to Embodiment Mode 1 and detailed description of the same portions or portions having similar functions is omitted.

A pixel shown in FIG. 29 includes a transistor 2910, the first switch 111, the second switch 112, the third switch 113, the fourth switch 114, the capacitor 115, and the light-emitting element 116. Note that the pixel is connected to the signal line 117, the first scan line 118, the second scan line 119, the third scan line 120, the fourth scan line 121, the power supply line 122, and the potential supply line 123.

The transistor 2910 in this embodiment mode is a multi-gate transistor where two transistors are connected in series, and is provided in the same position as that of the transistor 110 in Embodiment Mode 1. Note that the number of transistors which are connected in series is not particularly limited.

By performing operations similar to those of the pixel in FIG. 1 in the pixel in FIG. 29, variations of a current value caused by variations in the threshold voltage of the transistor 2910 can be suppressed. Therefore, a current in accordance with luminance data can be supplied to the light-emitting element 116, so that variations in luminance can be suppressed. In addition, since the transistor 2910 is operated with a potential of an opposite electrode fixed at a constant potential, power consumption can be reduced. Note that although an operation region of the transistor 2910 is not particularly limited, an advantageous effect of the invention becomes more apparent when the transistor 2910 is operated in the saturation region.

Further, in the case of operating the transistor 2910 in the saturation region, variations of the currents flowing to the transistor 2910 caused by deterioration of the light-emitting element 116 can be suppressed.

When channel widths of the two transistors connected in series are equal to each other, channel length L of the transistor 2910 in this embodiment mode is equal to the sum of the channel widths of the two transistors. Therefore, a current value which is closer to a constant value can be easily obtained in the saturation region regardless of a drain-source voltage Vds. In particular, the transistor 2910 is effective when it is difficult to manufacture a transistor having long channel length L. Note that a connection portion of the two transistors functions as a resistor.

Note that it is only necessary for the transistor 2910 to have a function for controlling a current value supplied to the light-emitting element 116, and a type of the transistor 2910 is not particularly limited. Accordingly, a thin film transistor (TFT) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied.

In addition, in the pixel shown in FIG. 29, a transistor or the like can be used as each of the first switch 111, the second switch 112, the third switch 113, and the fourth switch 114, similarly to the pixel shown in FIG. 1, Note that the switch 114 is not necessarily connected between the node 130 and a gate electrode of the transistor 2910, and may be connected between the node 130 and the node 131 or a first electrode of the transistor 2910 and the node 132. In addition, a second electrode of the transistor 2910 may be connected to the power supply line 122 through the fourth switch 114.

In addition, the pixel shown in this embodiment mode can be applied to the display device in FIG. 9. Similarly to Embodiment Mode 1, unless the data writing period in each row overlaps, an initialization start period can be freely set in each row. Further, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since a threshold voltage writing period can also be set long, the threshold voltage of a transistor which controls a current value flowing to the light-emitting element can be written in the capacitor more accurately. Therefore, reliability as a display device can be improved.

Figure 30:
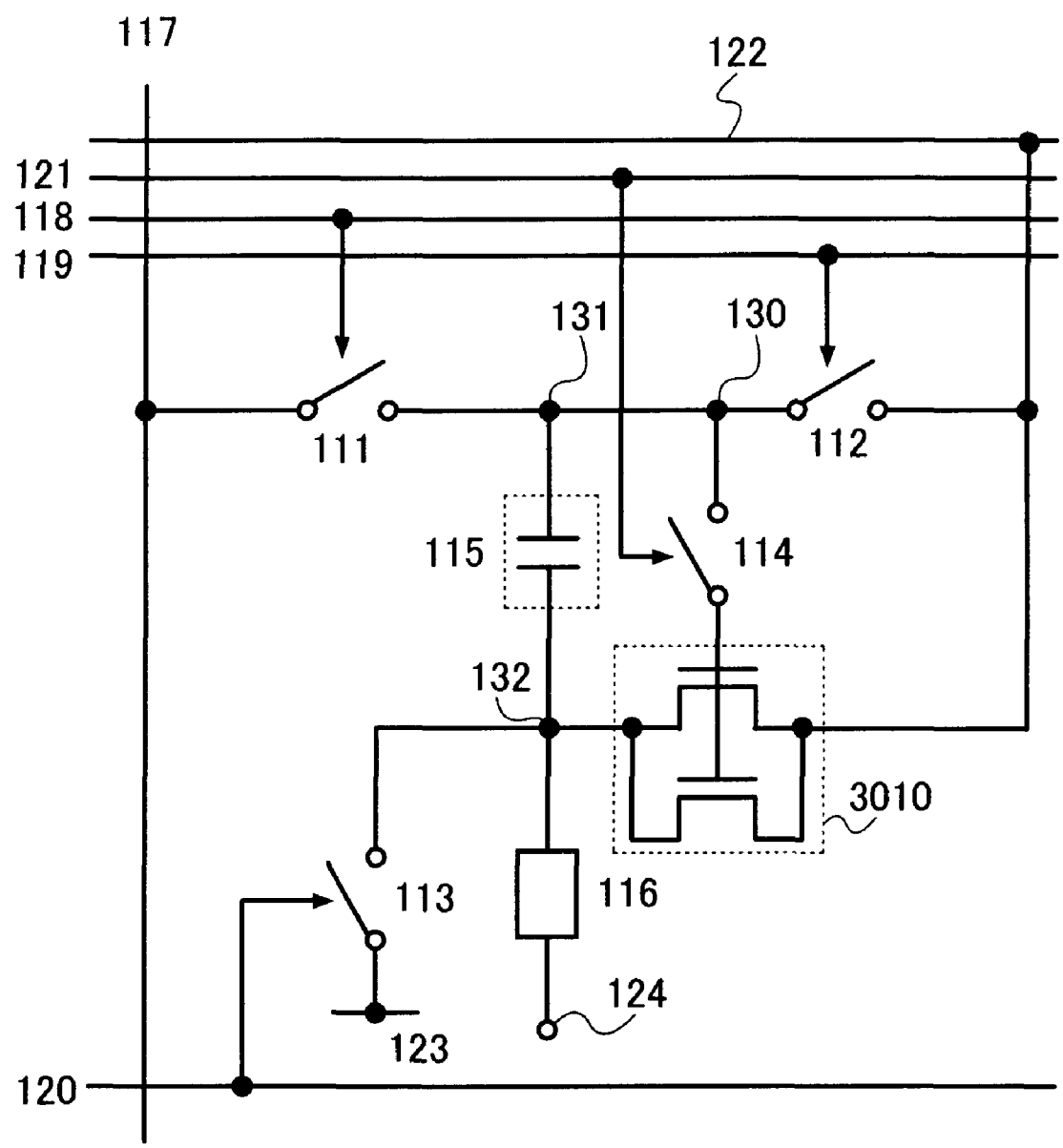
FIG. 30 is a diagram showing a pixel configuration shown in Embodiment Mode 4.

Note that the transistor 2910 is not limited to a structure where transistors are connected in series, and may be a structure where transistors are connected in parallel like a transistor 3010 shown in FIG. 30. A larger current can be supplied to the light-emitting element 116 by using the transistor 3010. In addition, since transistor characteristics are averaged by using the two transistors connected in parallel, original variations in characteristics of the transistors included in the transistor 3010 can be more reduced. Therefore, when variations are reduced, variations of the current value caused by variations in the threshold voltage of the transistor can be easily suppressed.

Further, each of the transistors connected in parallel shown in the transistor 3010 may be connected in series like the transistor 2910 shown in FIG. 29.

This embodiment mode can be freely combined with any pixel configuration shown in another embodiment mode, without limiting to the aforementioned description. That is, the transistor 2910 or the transistor 3010 can be applied to any of pixel configurations shown in other embodiment modes Embodiment Mode 5

Figure 31:
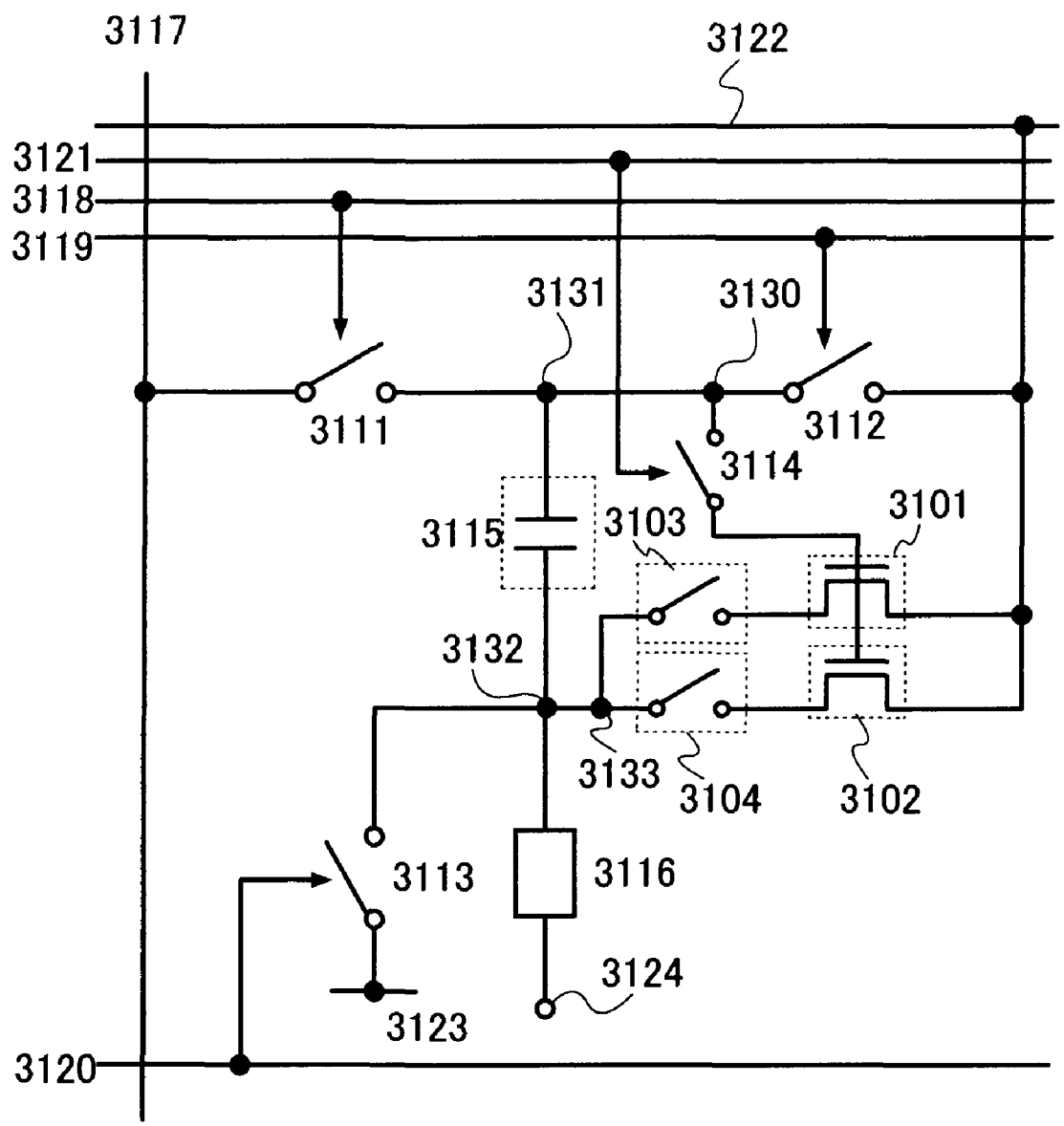
FIG. 31 is a diagram showing a pixel configuration shown in Embodiment Mode 5.

In this embodiment mode, a pixel configuration is described in which deterioration of transistors over time is averaged by switching transistors which control a current value supplied to a light-emitting element for each period in the pixel of the invention, with reference to FIG. 31.

A pixel shown in FIG. 31 includes a first transistor 3101, a second transistor 3102, a first switch 3111, a second switch 3112, a third switch 3113, a fourth switch 3114, a fifth switch 3103, a sixth switch 3104, a capacitor 3115, and a light-emitting element 3116. Note that the pixel is connected to a signal line 3117, a first scan line 3118, a second scan line 3119, a third scan line 3120, a fourth scan line 3121, a power supply line 3122, and a potential supply line 3123. Further, although not shown in FIG. 31, the pixel is connected to fifth and sixth scan lines which control on/off of the fifth switch 3103 and the sixth transistor 3104, respectively. In this embodiment mode, each of the first transistor 3101 and the second transistor 3102 is an N-channel transistor, and is turned on when a gate-source voltage (Vgs) thereof exceeds the threshold voltage. In addition, a pixel electrode of the light-emitting element 3116 corresponds to an anode and an opposite electrode 3124 thereof corresponds to a cathode. Note that a gate-source voltage of the transistor is described as Vgs and a voltage stored in the capacitor is described as Vcs. Further, the threshold voltage of the first transistor 3101 is described as Vth1 and the threshold voltage of the second transistor 3102 is described as Vth2. The power supply line 3122, the potential supply line 3123, and the signal line 3117 are also described as a first wiring, a second wiring, and a third wiring, respectively.

A first electrode (one of a source electrode and a drain electrode) of the first transistor 3101 is connected to the pixel electrode of the light-emitting element 3116 through the fifth switch 3103; a second electrode (the other of the source electrode and the drain electrode) of the first transistor 3101 is connected to the power supply line 3122; and a gate electrode of the first transistor 3101 is connected to the power supply line 3122 through the fourth switch 3114 and the second switch 3112. Note that the fourth switch 3114 is connected between the gate electrode of the first transistor 3101 and the second switch 3112. In addition, if a connection point of the fourth switch 3114 and the second switch 3112 is denoted by a node 3130, the node 3130 is connected to the signal line 3117 through the first switch 3111. Further, the first electrode of the first transistor 3101 is also connected to the potential supply line 3123 through the fifth switch 3103 and the third switch 3113.

A first electrode (one of a source electrode and a drain electrode) of the second transistor 3102 is connected to the pixel electrode of the light-emitting element 3116 through the sixth switch 3104; a second electrode (the other of the source electrode and the drain electrode) of the second transistor 3102 is connected to the power supply line 3122; and a gate electrode of the second transistor 3102 is connected to the node 3130 through the fourth switch 3114. In addition, the first electrode of the second transistor 3102 is also connected to the potential supply line 3123 through the sixth switch 3104 and the third switch 3113. Note that the gate electrode of the first transistor 3101 and the gate electrode of the second transistor 3102 are connected. Further, the first electrode of the first transistor 3101 and the first electrode of the second transistor 3102 are connected through the fifth switch 3103 and the sixth switch 3104, and a connection point of the fifth switch 3103 and the sixth switch 3104 is denoted by a node 3133.

In addition, the capacitor 3115 is connected between the node 3133 and the node 3130. That is, a first electrode of the capacitor 3115 is connected to the gate electrodes of the first transistor 3101 and the second transistor 3102 through the fourth switch 3114; and a second electrode of the capacitor 3115 is connected to the first electrode of the first transistor 3101 through the fifth switch 3103 and is connected to the first electrode of the second transistor 3102 through the sixth switch 3104. The capacitor 3115 may be formed by sandwiching an insulating film with a wiring, a semiconductor layer, or an electrode, or can be omitted by using gate capacitance of the first transistor 3101 and the second transistor 3102 in some cases. Further, a connection point of the first electrode of the capacitor 3115 and a wiring to which the first switch 3111 and the node 3130 are connected is denoted by a node 3131, and a connection point of a wiring to which the node 3133 and the second electrode of the capacitor 3115 are connected and the pixel electrode of the light-emitting element 3116 is denoted by a node 3132.

Note that by inputting signals into the first scan line 3118, the second scan line 3119, the third scan line 3120, and the fourth scan line 3121, on/off of the first switch 3111, the second switch 3112, the third switch 3113, and the fourth switch 3114 is controlled, respectively. In FIG. 31, scan lines which control on/off of the fifth switch 3103 and the sixth switch 3104 respectively are omitted.

A signal in accordance with a gray scale of the pixel which corresponds to a video signal, that is, a potential in accordance with luminance data is inputted to the signal line 3117.

Next, operations of the pixel shown in FIG. 31 are described with reference to a timing chart in FIG. 32. Note that, in FIG. 32, one frame period which corresponds to a period for displaying an image for one screen is divided into an initialization period, a threshold voltage writing period, a data writing period, and a light-emitting period.

Note that a potential of V1 is inputted to the opposite electrode 3124 of the light-emitting element 3116 and a potential of V1−Vth−α (α: an arbitrary positive number) is inputted to the potential supply line 3123. Vth corresponds to a higher potential between Vth1 and Vth2. In addition, the potential of V1 is inputted to the power supply line 3122 in the address period, and a potential of V2 is inputted to the power supply line 3122 in the light-emitting period. Note that V2>V1 is satisfied.

Here, although a potential of the opposite electrode 3124 of the light-emitting element 3116 is the same as a potential of the power supply line 3122 in the address period for description of the operations, the potential of the opposite electrode 3124 may be any potential as long as it is higher than a potential of V1−Vth−α−$V_{EL}$ when a potential difference which is at least necessary for the light-emitting element 3116 to emit light is $V_{EL}$. In addition, the potential V2 of the power supply line 3122 in the light-emitting period may be any potential as long as it is higher than the sum of the potential of the opposite electrode 3124 and the potential difference ($V_{EL}$) which is at least necessary for the light-emitting element 3116 to emit light; here, since the potential of the opposite electrode 3124 is V1 for description, V2 may be any potential higher than V1+$V_{EL}$.

Figure 32:
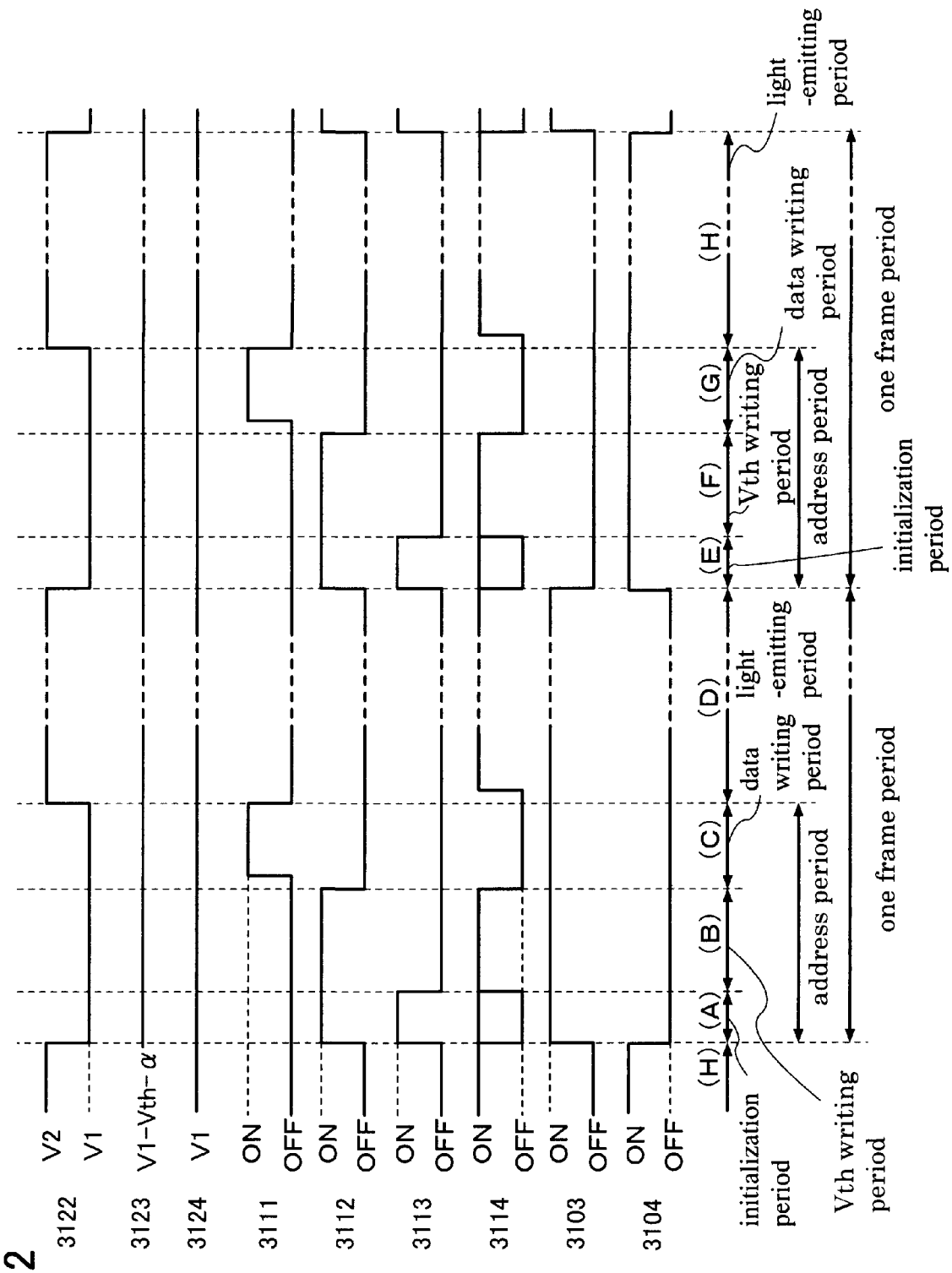
FIG. 32 is a timing chart showing operations of the pixel shown in FIG. 31.

First, in the initialization period, the first switch 3111 and the sixth switch 3104 are turned off and the second switch 3112, the third switch 3113, the fourth switch 3114, and the fifth switch 3103 are turned on as shown (A) in FIG. 32. At this time, the first electrode of the first transistor 3101 is the source electrode, and a potential thereof is equal to a potential of the potential supply line 3123 which is V1−Vth−α. On the other hand, a potential of the gate electrode of the first transistor 3101 is V1. Therefore, a gate-source voltage Vgs of the first transistor 3101 is Vth+α so that the first transistor 3101 is turned on. Then, Vth+α is held in the capacitor 3115 provided between the gate electrode and the first electrode of the first transistor 3101. Although the case where the fourth switch 3114 is turned on is described, the fourth switch 3114 may be turned off. Note that in the next threshold voltage writing period, the fourth switch 114 is required to be turned on.

In the threshold voltage writing period shown (B) in FIG. 32, the third switch 3113 is turned off. Therefore, the potential of the first electrode, that is, the source electrode of the first transistor 3101 rises gradually, and when the potential reaches V1−Vth1, that is, when the gate-source voltage Vgs of the first transistor 3101 reaches the threshold voltage (Vth1), the first transistor 3101 is turned off. Accordingly, a voltage held in the capacitor 3115 is Vth1.

In the next data writing period shown (C) in FIG. 32, the first switch 3111 is turned on after the second switch 3112 and the fourth switch 3114 are turned off, and a potential in accordance with luminance data (V1+Vdata) is inputted from the signal line 3117. By turning off the fourth switch 3114 in this period, the first transistor 3101 can be held to be turned off. Therefore, potential fluctuation of the second electrode of the capacitor 3115 caused by a current supplied from the power supply line 3122 at the time of data writing can be suppressed. Accordingly, a voltage Vcs which is held in the capacitor 3115 at this time is Vth1+Vdata. Note that in the case where the light-emitting element 3116 is controlled not to emit light in the next light-emitting period, a potential of Vdata≦0 is input.

Next, in the light-emitting period shown (D) in FIG. 32, the fourth switch 3114 is turned on after the first switch 3111 is turned off and the potential of the power supply line 3122 is made V2. At this time, a gate-source voltage of the first transistor 3101 is Vgs=Vth1+Vdata so that the first transistor 3101 is turned on. Therefore, the current in accordance with luminance data flows to the first transistor 3101 and the light-emitting element 3116, so that the light-emitting element 3116 emits light.

By performing such an operation, a current flowing to the light-emitting element 3116 does not depend on the threshold voltage (Vth1) of the first transistor 3101 in each of the case where the first transistor 3101 is operated in the saturation region and the case where the first transistor 3101 is operated in the linear region.

Further, in the initialization period of the next one frame period (E) shown in FIG. 32, the fifth switch 3103 is turned off and the second switch 3112, the third switch 3113, the fourth switch 3114, and the sixth switch 3104 are turned on. At this time, the first electrode of the second transistor 3102 is the source electrode, and a potential thereof is equal to the potential of the potential supply line 3123 which is V1−Vth−α. On the other hand, a potential of the gate electrode of the second transistor 3102 is V1. Therefore, a gate-source voltage Vgs of the second transistor 3102 is Vth+a so that the second transistor 3102 is turned on. Then, Vth+α is held in the capacitor 3115 provided between the gate electrode and the first electrode of the second transistor 3102. Although the case where the fourth switch 3114 is turned on is described, the fourth switch 3114 may be turned off. Note that in the next threshold voltage writing period, the fourth switch 3114 is required to be turned on.

Next, in the threshold voltage writing period (F) shown in FIG. 32, the third switch 3113 is turned off. Therefore, the potential of the first electrode, that is, the source electrode of the second transistor 3102 rises gradually, and when the potential reaches V1−Vth2, that is, when the gate-source voltage Vgs of the second transistor 3102 reaches the threshold voltage (Vth2), the second transistor 3102 is turned off. Accordingly, the voltage Vcs which is held in the capacitor 3115 is Vth2.

In the following data writing period (G) shown in FIG. 32, the first switch 3111 is turned on after the second switch 3112 and the fourth switch 3114 are turned off, and the potential in accordance with luminance data (V1+Vdata) is inputted from the signal line 3117. By turning off the fourth switch 3114 in this period, the second transistor 3102 can be held to be turned off. Therefore, potential fluctuation of the second electrode of the capacitor 3115 caused by the current supplied from the power supply line 3122 at the time of data writing can be suppressed. Accordingly, the voltage Vcs which is held in the capacitor 3115 at this time is Vth2+Vdata.

Next, in the light-emitting period (H) shown in FIG. 32, the fourth switch 3114 is turned on after the first switch 3111 is turned off and the potential of the power supply line 3122 is made V2. At this time, a gate-source voltage of the second transistor 3102 is Vgs=Vth2+Vdata so that the second transistor 3102 is turned on. Therefore, the current in accordance with luminance data flows to the second transistor 3102 and the light-emitting element 3116, so that the light-emitting element 3116 emits light.

The current flowing to the light-emitting element 3116 does not depend on the threshold voltage (Vth2) of the second transistor 3102 in each of the case where the second transistor 3102 is operated in the saturation region and the case where the second transistor 3102 is operated in the linear region.

Therefore, in the case of controlling a current supplied to the light-emitting element by using either the first transistor 3101 or the second transistor 3102, variations of the current value caused by variations in the threshold voltage of the transistor can be suppressed, so that the current in accordance with luminance data can be supplied to the light-emitting element 3116. Note that by switching the first transistor 3101 and the second transistor 3102, a load added to one transistor is reduced, and thus, fluctuation of the threshold voltage of the transistor over time can be decreased.

Accordingly, variations in luminance caused by variations in the threshold voltage of each of the first transistor 3101 and the second transistor 3102 can be suppressed. In addition, since the potential of the opposite electrode 3124 is fixed at a constant potential, power consumption can be reduced.

Therefore, in the case of operating the first transistor 3101 and the second transistor 3102 in the saturation region, variations in a current flowing to each of the first transistor 3101 and the second transistor 3102 caused by deterioration of the light-emitting element 3116 can be suppressed.

Note that in the case of operating the first transistor 3101 and the second transistor 3102 in the saturation region, channel length L of each transistor is preferably long.

In addition, since a reverse bias voltage is applied to the light-emitting element 3116 in the initialization period, a short-circuited portion in the light-emitting element 3116 can be insulated or deterioration of the light-emitting element 3116 can be suppressed. Therefore, a life of the light-emitting element 3116 can be extended.

Note that since variations of the current value caused by variations in the threshold voltage of the transistor can be suppressed, a supply destination of a current controlled by the transistor is not particularly limited to a certain destination. Therefore, an EL element (an organic EL element, an inorganic EL element, or an EL element including both an organic material and an inorganic material), an electron-emissive element, a liquid crystal element, electronic ink, and the like can be applied to the light-emitting element 3116 shown in FIG. 31.

Note that it is only necessary for each of the first transistor 3101 and the second transistor 3102 to have a function for controlling a current value supplied to the light-emitting element 3116, and a type of each of the first transistor 3101 and the second transistor 3102 is not particularly limited. Accordingly, a thin film transistor (TF1) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied.

The first switch 3111 is a switch which selects timing for inputting a signal in accordance with a gray scale of the pixel from the signal line 3117 into the pixel. The second switch 3112 is a switch which selects timing for supplying a predetermined potential to the gate electrode of the first transistor 3101 or the second transistor 3102. The third switch 3113 is a switch which selects timing for supplying a predetermined potential for initializing a potential written into the capacitor 3115. The fourth switch 3114 is a switch which suppresses potential fluctuation of the second electrode of the capacitor 3115 at the time of data writing. Therefore, the first switch 3111, the second switch 3112, the third switch 3113, and the fourth switch 3114 are not particularly limited as long as they have the aforementioned functions. For example, each of the first switch 3111, the second switch 3112, the third switch 3113, and the fourth switch 3114 may be a transistor, a diode, or a logic circuit combining them. In addition, the fifth switch 3103 and the sixth switch 3104 are not particularly limited. For example, each of the fifth switch 3103, and the sixth switch 3104 may be a transistor, a diode, or a logic circuit combining them.

Further, since the pixel can be formed by using only N-channel transistors when N-channel transistors are used for the first switch 3111, the second switch 3112, the third switch 3113, the fourth switch 3114, the fifth switch 3103, and the sixth switch 3104, a manufacturing process can be simplified. In addition, a non-crystalline semiconductor such as an amorphous semiconductor or a semi-amorphous semiconductor (also described as a microcrystalline semiconductor) can be used for the semiconductor layer of each transistor included in the pixel. For example, amorphous silicon (a-Si:H) can be given as an example of the amorphous semiconductor. By using such a non-crystalline semiconductor, the manufacturing process can be further simplified. Accordingly, manufacturing cost can be reduced and a yield can be improved.

Note that when a transistor is used for each of the first switch 3111, the second switch 3112, the third switch 3113, the fourth switch 3114, the fifth switch 3103, and the sixth switch 3104, the polarity (a conductivity type) of each transistor is not particularly limited to a certain type. However, a transistor of polarity with smaller off-current is preferably used.

Figure 37:
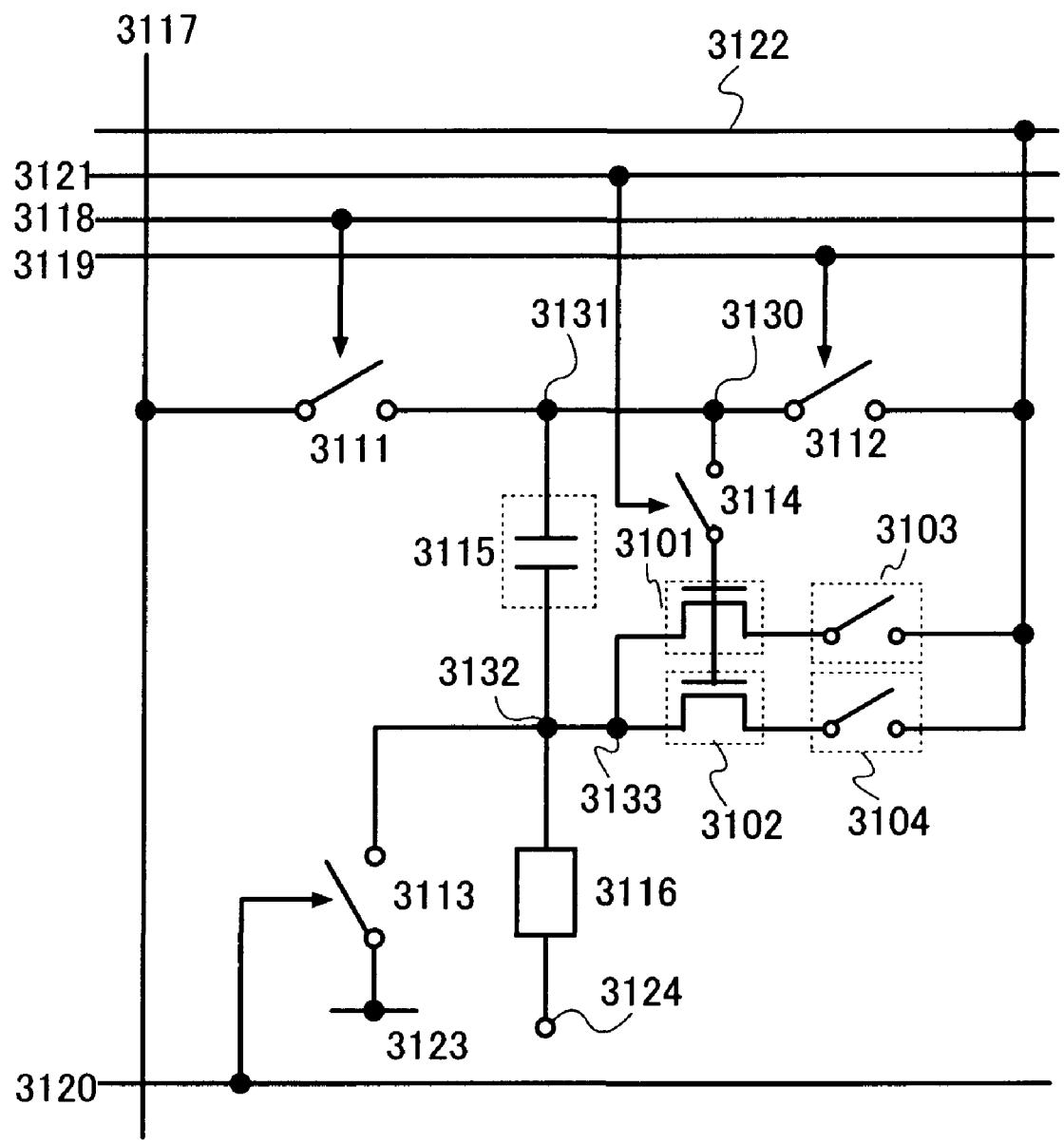
FIG. 37 is a diagram showing a pixel configuration shown in Embodiment Mode 5.

In addition, the first transistor 3101 and the fifth switch 3103, and the second transistor 3102 and the sixth transistor 3104 may be switched to be arranged, as shown in FIG. 37. That is, the first electrodes of the first transistor 3101 and the second transistor 3102 are connected to the gate electrodes of the first transistor 3101 and the second transistor 3102 through the capacitor 3115 and the fourth switch 3114. Further, the second electrode of the first transistor 3101 is connected to the power supply line 3122 through the fifth switch 3103, and the second electrode of the second transistor 3102 is connected to the power supply line 3122 through the sixth switch 3104.

Furthermore, although FIGS. 31 and 37 show the cases where the number of sets arranged in parallel is two, using a transistor and a switch as one set, that is, using the first transistor 3101 and the fifth switch 3103 as a set, and using the second transistor 3102 and the sixth switch 3104 as a set, the number of sets arranged in parallel is not particularly limited.

Note that the fourth switch 3114 is not necessarily connected between the node 3130 and the gate electrode of the first transistor 3101, and may be connected between the node 3130 and the node 3131 or the node 3133 and the node 3132.

Figure 42:
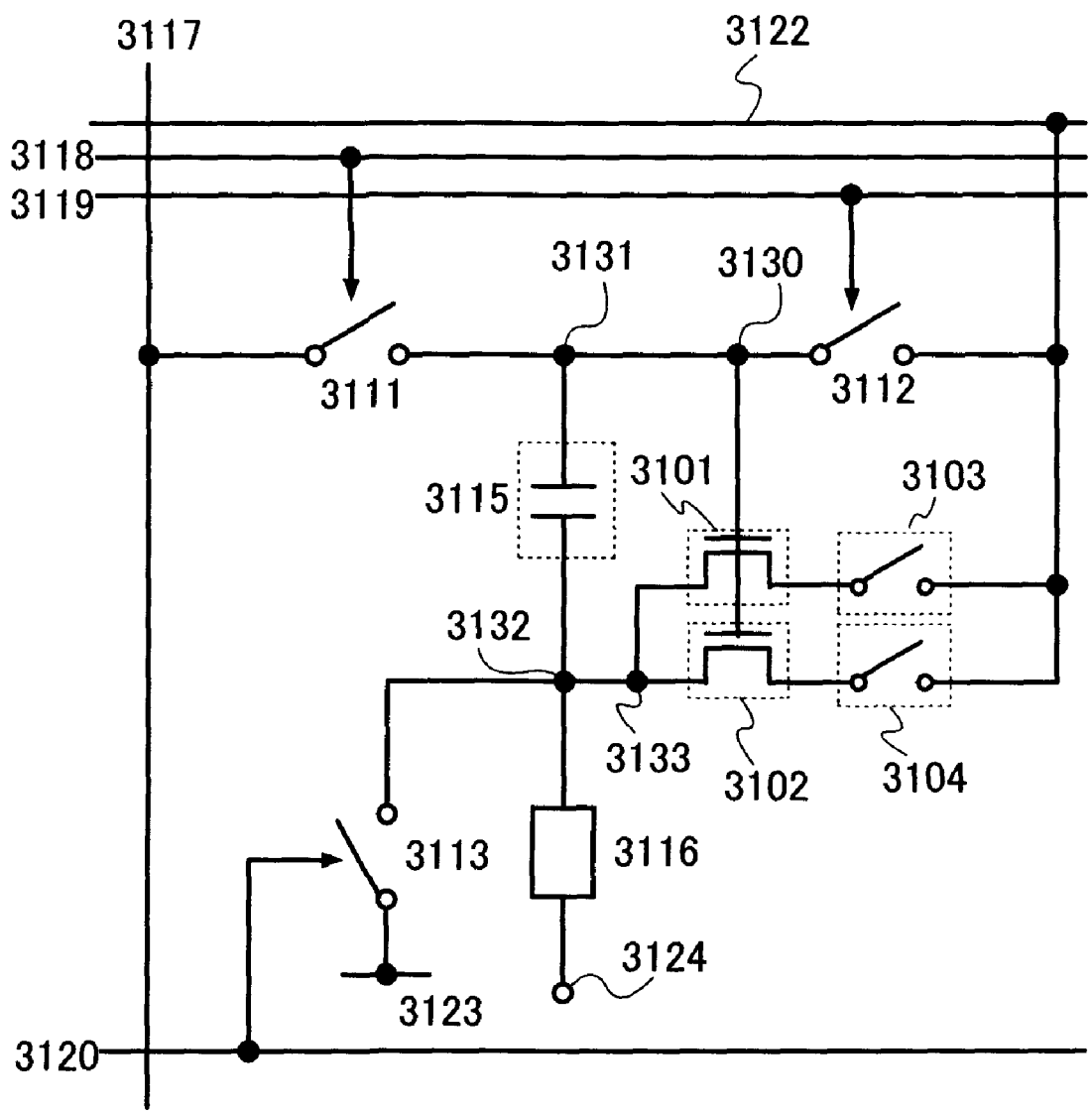
FIG. 42 is a diagram showing a pixel configuration shown in Embodiment Mode 5.

In addition, the fourth switch 3114 is not necessarily to be provided as shown in FIG. 42. In the pixel shown in this embodiment mode, a current supplied from the power supply line 3122 to the node 3133 can be interrupted by turning off both of the fifth switch 3103 and the sixth switch 3104 in the data writing period even when the fourth switch 3114 is not provided. Therefore, since the potential fluctuation of the second electrode of the capacitor 3115 can be suppressed, a voltage of Vth1+Vdata or a voltage of Vth2+Vdata can be held in the capacitor 3115, without particularly providing the fourth switch 3114. Accordingly, a more accurate current in accordance with luminance data can be supplied to the light-emitting element 3116 in the light-emitting period without using the fourth switch 3114. Needless to say, this can also be true for the pixel shown in FIG. 31, that is, the case where the fifth switch 3103 is connected between the first electrode of the first transistor 3101 and the node 3133, and the sixth switch 3104 is connected between the first electrode of the second transistor 3102 and the node 3133.

In addition, a non light-emitting state can also be forcibly made by turning off both of the fifth switch 3103 and the sixth switch 3104 in the light-emitting period. By performing such an operation, the light-emitting time can be freely set. Further, by inserting black display, an after image is hardly viewed and moving image characteristics can be improved.

In addition, the pixel shown in this embodiment mode can be applied to the display device in FIG. 9. Similarly to Embodiment Mode 1, unless the data writing period in each row overlaps, an initialization start period can be freely set in each row. Further, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

Note that also in this embodiment mode, the potential supply line 3123 can be shared with a wiring of another row, similarly to Embodiment Mode 4. In addition, a multi-gate transistor where transistors are connected in series or a transistor where transistors are arranged in parallel may be used as each of the first transistor 3101 and the second transistor 3102. This embodiment mode is not limited to them, and can be applied to any of the pixel configurations shown in Embodiment Modes 1 to 4.

Embodiment Mode 6

Figure 39:
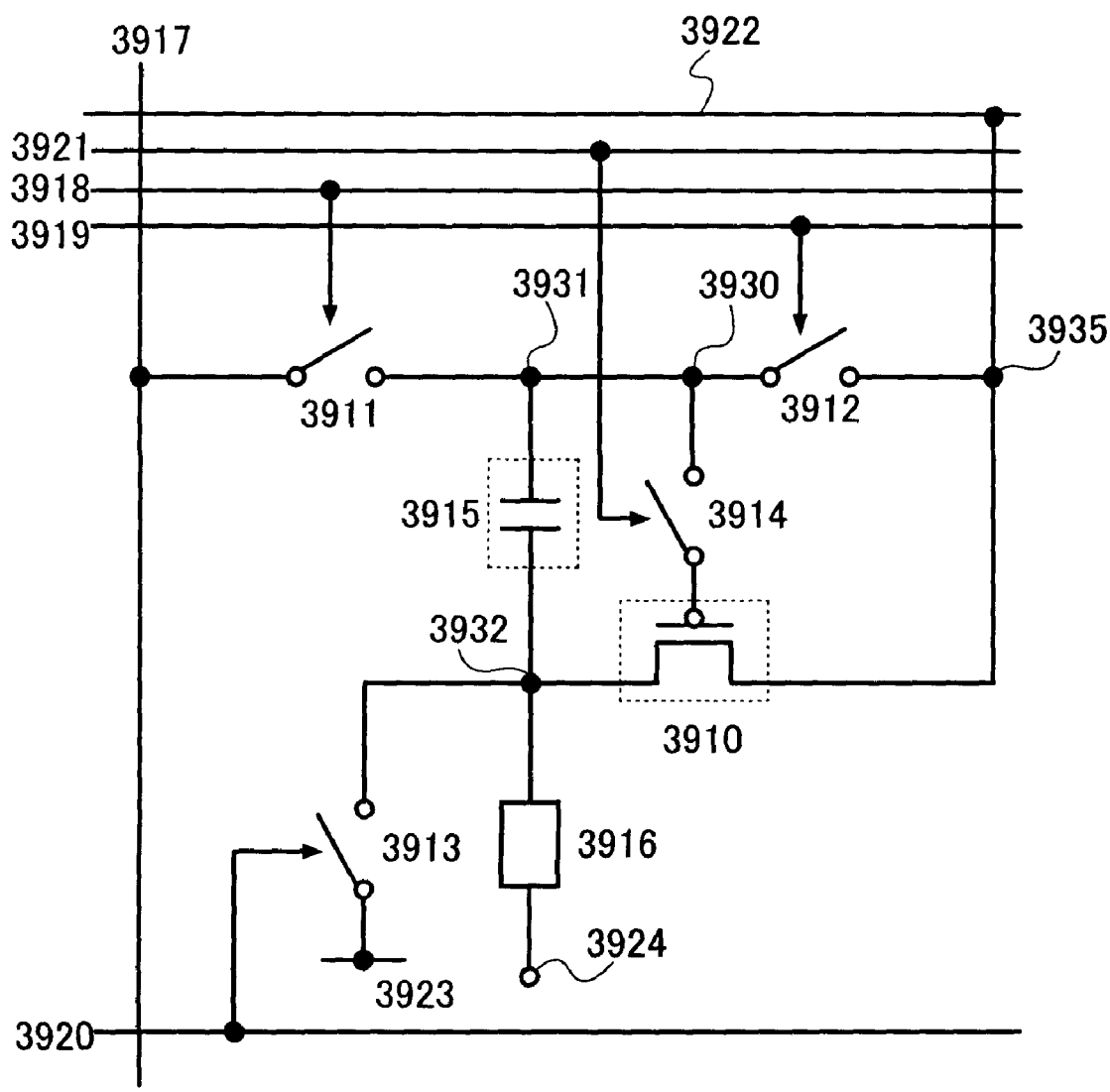
FIG. 39 is a diagram showing a pixel configuration shown in Embodiment Mode 6.

In this embodiment mode, the case is described in which a P-channel transistor is employed as a transistor which controls a current value supplied to a light-emitting element, with reference to FIG. 39.

Figure 49:
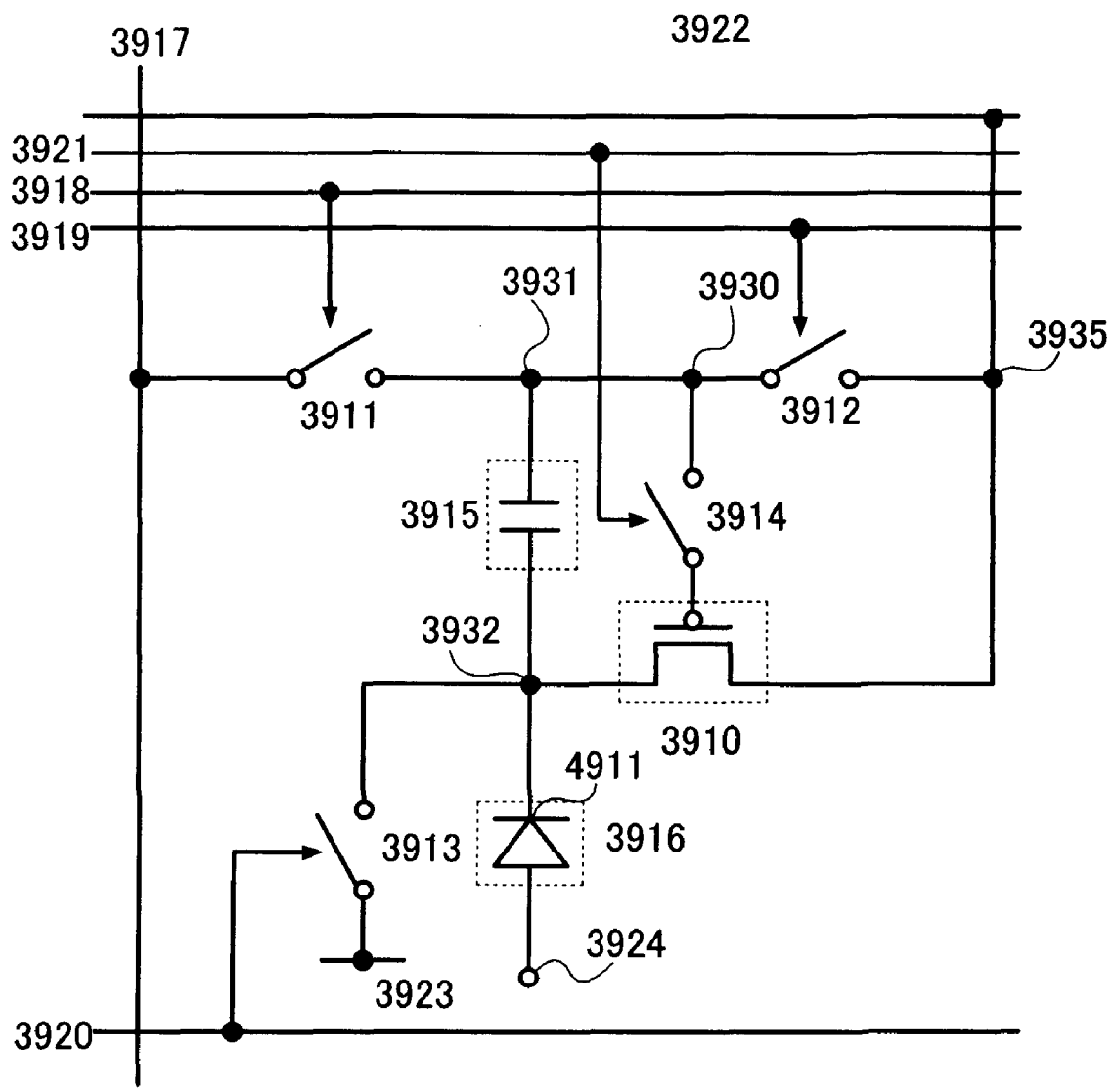
FIG. 49 is a diagram showing a pixel configuration shown in Embodiment Mode 6.
Figure 50:
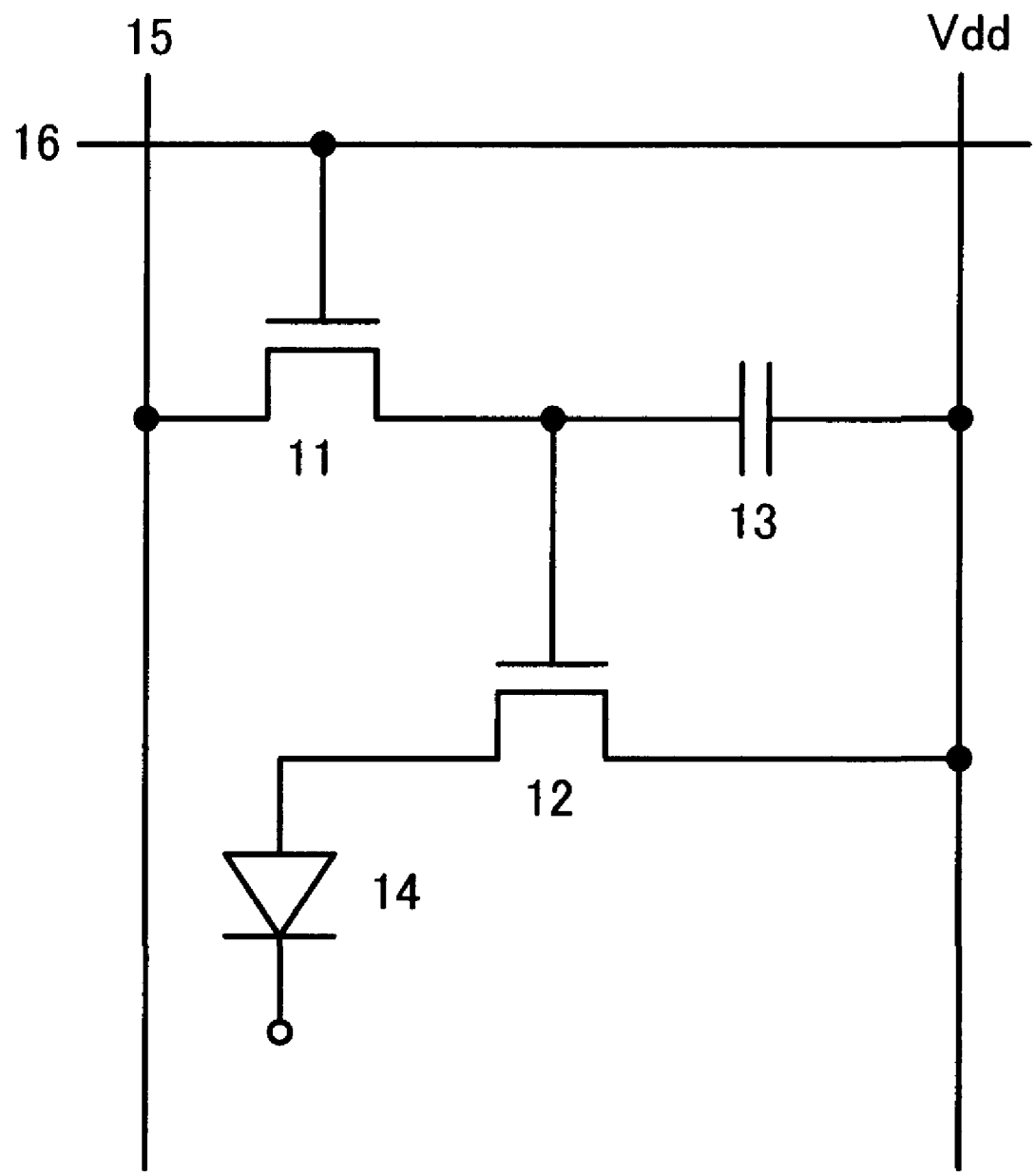
FIG. 50 is a diagram showing a pixel configuration of a conventional technique.
Figure 51:
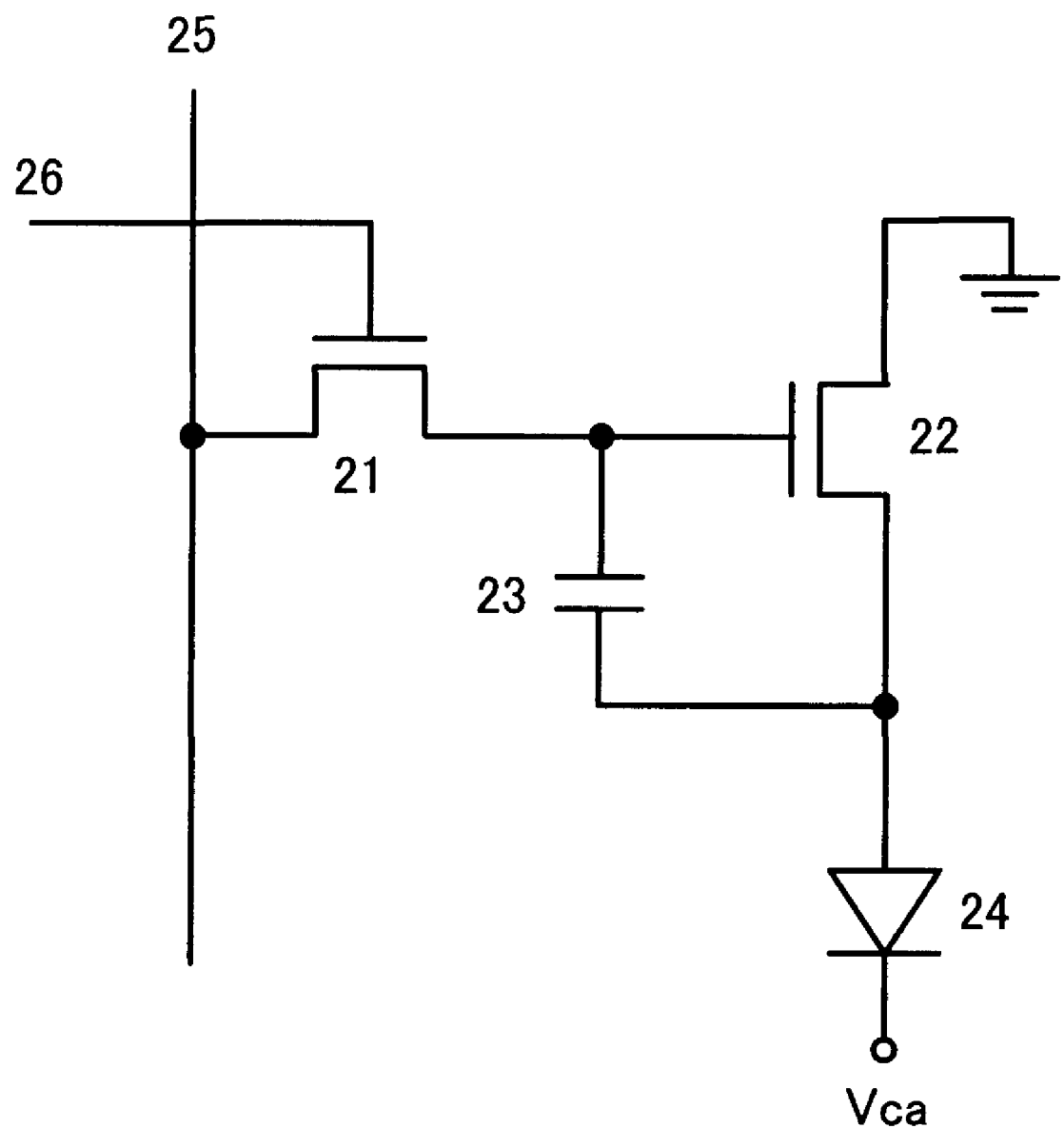
FIG. 51 is a diagram showing a pixel configuration of a conventional technique.
Figure 52:
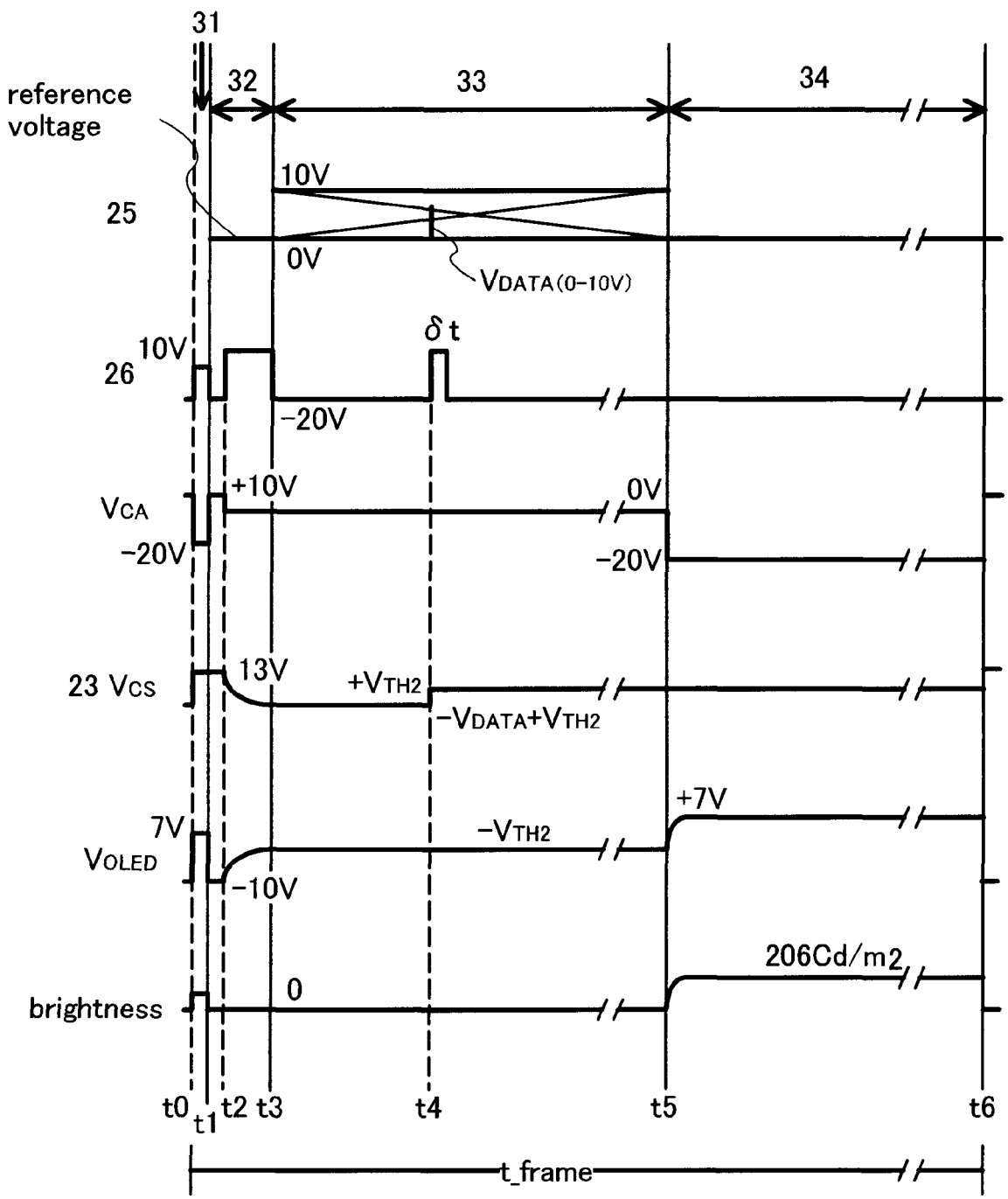
FIG. 52 is a timing chart for operating the pixel shown in a conventional technique.
Figure 53:
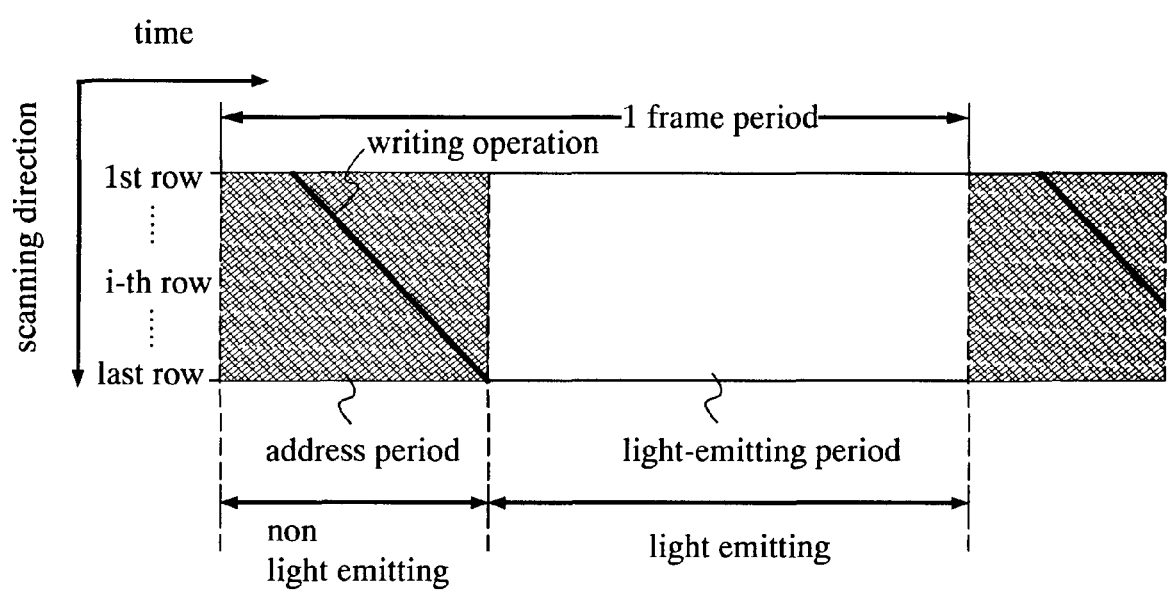
FIG. 53 is a chart showing a ratio of a light-emitting period in one frame period in the case of using a conventional technique.

A pixel shown in FIG. 39 includes a transistor 3910, a first switch 3911, a second switch 3912, a third switch 3913, a fourth switch 3914, a capacitor 3915, and a light-emitting element 3916. Note that the pixel is connected to a signal line 3917, a first scan line 3918, a second scan line 3919, a third scan line 3920, a fourth scan line 3921, a power supply line 3922, and a potential supply line 3923. In this embodiment mode, the transistor 3910 is a P-channel transistor, and is turned on when the absolute value of a gate-source voltage (|Vgs|) thereof exceeds the threshold voltage (|Vth|) (when Vgs is lower than Vth). In addition, an example is described in which an EL element in which a current is supplied from a pixel electrode 4911 to an opposite electrode 3924 is used for the light-emitting element 3916 as shown in FIG. 49. In that case, the pixel electrode 4911 functions as an anode and the opposite electrode 3924 functions as a cathode. Note that the absolute value of a gate-source voltage of the transistor is described as |Vgs|, and the absolute value of the threshold voltage of the transistor is described as |Vth|. The power supply line 3922, the potential supply line 3923, and the signal line 3917 are also described as a first wiring, a second wiring, and a third wiring, respectively. Further, the first scan line 3918, the second scan line 3919, the third scan line 3920, and the fourth scan line 3921 may also be described as a fourth wiring, a fifth wiring, a sixth wiring, and a seventh wiring, respectively.

A first electrode (one of a source electrode and a drain electrode) of the transistor 3910 is connected to a pixel electrode of the light-emitting element 3916; a second electrode (the other of the source electrode and the drain electrode) of the transistor 3910 is connected to the power supply line 3922; and a gate electrode of the transistor 3910 is connected to the power supply line 3922 through the fourth switch 3914 and the second switch 3912. Note that the fourth switch 3914 is connected between the gate electrode of the transistor 3910 and the second switch 3912. In addition, if a connection point of the fourth switch 3914 and the second switch 3912 is denoted by a node 3930, the node 3930 is connected to the signal line 3917 through the first switch 3911. Further, the first electrode of the transistor 3910 is also connected to the potential supply line 3923 through the third switch 3913.

In addition, the capacitor 3915 is connected between the node 3930 and the first electrode of the transistor 3910. That is, a first electrode of the capacitor 3915 is connected to the gate electrode of the transistor 3910 through the fourth switch 3914, and a second electrode of the capacitor 3915 is connected to the first electrode of the transistor 3910. The capacitor 3915 may be formed by sandwiching an insulating film with a wiring, a semiconductor layer, or an electrode, or can be omitted by using gate capacitance of the transistor in some cases. Such a means which holds a voltage is described as a storage capacitor. Further, a connection point of the node 3930 and a wiring to which the first switch 3911 and the first electrode of the capacitor 3915 are connected is denoted by a node 3931, and a connection point of the first electrode of the transistor 3910 and a wiring to which the second electrode of the capacitor 3915 and the pixel electrode of the light-emitting element 3916 are connected is denoted by a node 3932.

By inputting signals into the first scan line 3918, the second scan line 3919, the third scan line 3920, and the fourth scan line 3921, on/off of the first switch 3911, the second switch 3912, the third switch 3913, and the fourth switch 3914 is controlled, respectively.

A signal in accordance with a gray scale of the pixel which corresponds to a video signal, that is, a potential in accordance with luminance data is inputted to the signal line 3917.

Next, operations of the pixel shown in FIG. 39 are described with reference to a timing chart in FIG. 40, and FIGS. 41A to 41D. Note that, in FIG. 40, one frame period which corresponds to a period for displaying an image for one screen is divided into an initialization period, a threshold voltage writing period, a data writing period, and a light-emitting period. In addition, the initialization period, the threshold voltage (Vth) writing period, and the data writing period are collectively described as an address period. Although one frame period is not particularly limited to a certain period, it is preferable that one frame period be at least ⅟₆₀ second or less so that an image viewer does not perceive a flicker.

Note that a potential of V1 is inputted to an opposite electrode 3924 of the light-emitting element 3916 and a potential of V1+|Vth|+α (α: an arbitrary positive number) is inputted to the potential supply line 3923. In addition, the potential of V1 is inputted to the power supply line 3922 in the address period, and a potential of V2 is inputted to the power supply line 3922 in the light-emitting period. Note that V2>V1 is satisfied.

Here, although a potential of the opposite electrode 3924 of the light-emitting element 3916 is equal to a potential of the power supply line 3922 in the address period for description of operations, the potential of the opposite electrode 3924 may be any potential as long as it is higher than the sum of a potential of the potential supply line 3923 and $V_{EL}$ when a potential difference which is at least necessary for the light-emitting element 3916 to emit light is $V_{EL}$. That is, in the address period, potentials of both ends of the light-emitting element 3916 may be any potential as long as a current does not flow to the light-emitting element 3916. In addition, the potential V2 of the power supply line 3922 in the light-emitting period may be any potential as long as it is lower than a value which is obtained by subtracting the potential difference ($V_{EL}$) which is at least necessary for the light-emitting element 3916 to emit light from the potential of the opposite electrode 3924; here, since the potential of the opposite electrode 3924 is V1 for description, V2 may be any potential lower than V1−$V_{EL}$.

Figure 40:
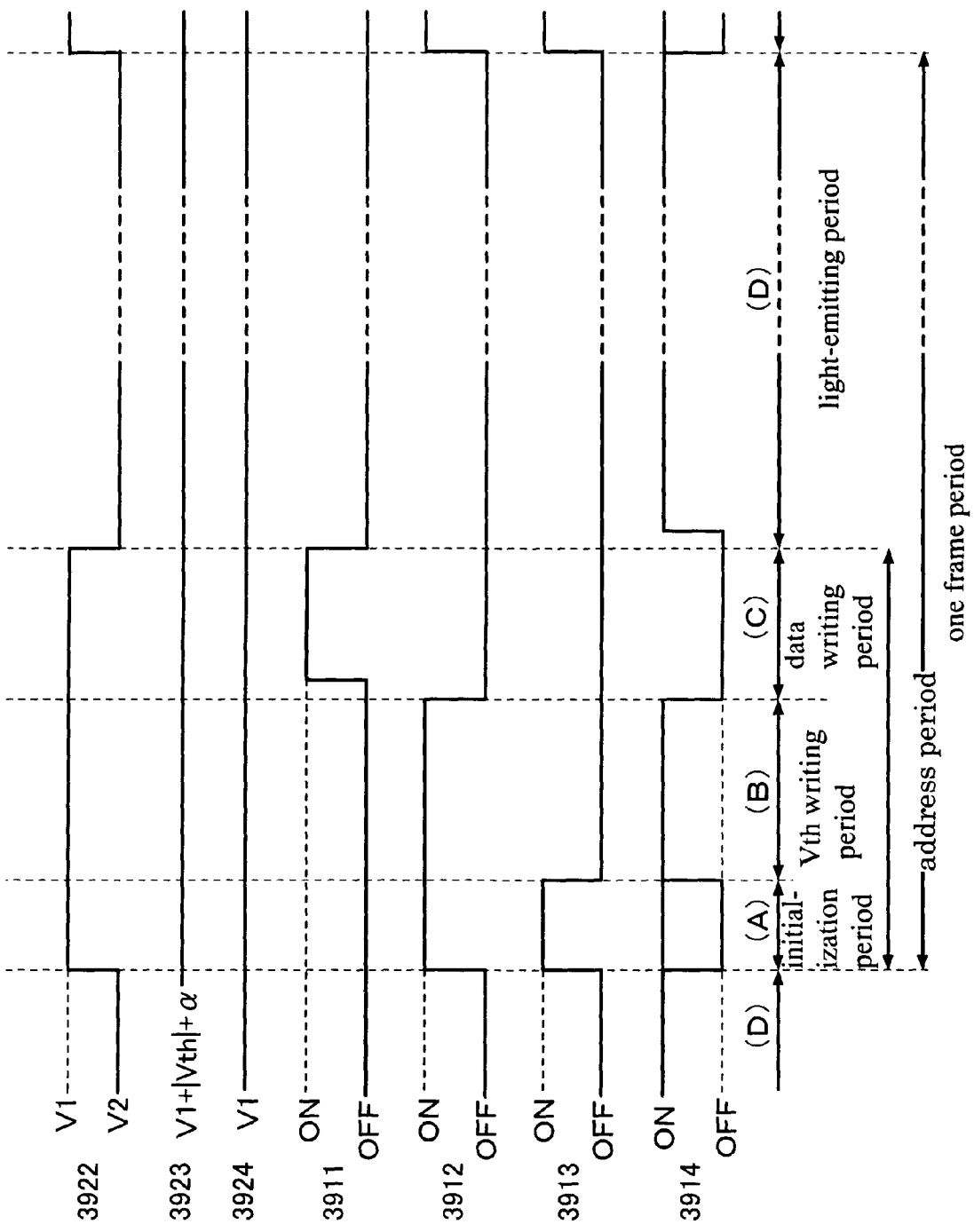
FIG. 40 is a timing chart showing operations of the pixel shown in FIG. 39.

First, in the initialization period, the first switch 3911 is turned off and the second switch 3912, the third switch 3913, and the fourth switch 3914 are turned on as shown (A) in FIG. 40, and in FIG. 41A. At this time, the first electrode of the transistor 3910 is the source electrode, and a potential thereof is equal to a potential of the potential supply line 3923 which is V1+|Vth|+α. On the other hand, a potential of the gate electrode of the transistor 3910 is V1. Therefore, the absolute value of a gate-source voltage |Vgs| of the transistor 3910 is |Vth|+α so that the transistor 3910 is turned on. Then, |Vth|+α is held in the capacitor 3915 provided between the gate electrode and the first electrode of the transistor 3910. Although the case where the fourth switch 3914 is turned on is described, the fourth switch 3914 may be turned off. Note that in the following threshold voltage writing period, the fourth switch 3914 is required to be turned on.

In the threshold voltage writing period (B) shown in FIG. 40B, and in FIG. 41B, the third switch 3913 is turned off. Therefore, the potential of the first electrode, that is, the source electrode of the transistor 3910 lowers gradually, and when the potential reaches V1+|Vth|, the transistor 3910 is turned off. Accordingly, a voltage held in the capacitor 3915 is approximately |Vth|.

In the following data writing period (C) shown in FIG. 40 and in FIG. 41C, the first switch 3911 is turned on after the second switch 3912 and the fourth switch 3914 are turned off, and a potential in accordance with luminance data (V1−Vdata) is inputted from the signal line 3917. By turning off the fourth switch 3914 in this period, the transistor 3910 can be held to be turned off. Therefore, potential fluctuation of the second electrode of the capacitor 3915 caused by a current supplied from the power supply line 3922 at the time of data writing can be suppressed. Accordingly, a voltage Vcs which is held in the capacitor 3915 at this time can be represented by Formula (5) when electrostatic capacitance of the capacitor 3915 is C1 and electrostatic capacitance of the light-emitting element 3916 is C2.

[Formula 5]

$$Vcs = \left| -|Vth| - Vdata \times \frac{C2}{C1+C2} \right| \qquad (5)$$

Note that since the light-emitting element 3916 has thinner film thickness and a larger electrode area than the capacitor 3915, C2>>C1 is satisfied. Therefore, the voltage Vcs which is held in the capacitor 3915 is represented by Formula (6) from C2/(C1+C2)≈1. Note also that in the case where the light-emitting element 3916 is controlled not to emit light in the following light-emitting period, a potential of Vdata≦0 is input.

[Formula 6]

$$Vcs=|-|Vth|-Vdata| \qquad (6)$$

Next, in the light-emitting period (D) shown in FIG. 40 and in FIG. 41D, the fourth switch 3914 is turned on after the first switch 3911 is turned off and the potential of the power supply line 3922 is made V2. At this time, the gate-source voltage of the transistor 3910 is Vgs=−Vdata−|Vth| so that the transistor 3910 is turned on. Therefore, a current in accordance with luminance data flows to the transistor 3910 and the light-emitting element 3916, so that the light-emitting element 3916 emits light.

Note that a current I flowing to the light-emitting element is represented by Formula (7) in the case of operating the transistor 3910 in a saturation region.

[Formula 7]

$$I = \frac{1}{2}\left(\frac{W}{L}\right)\mu Cox(Vgs - Vth)^2 \quad (7)$$
$$= \frac{1}{2}\left(\frac{W}{L}\right)\mu Cox(-Vdata - |Vth| - Vth)^2$$

Since the transistor 3910 is a P-channel transistor, Vth<0 is satisfied. Therefore Formula (7) can be transformed to Formula (8).

[Formula 8]

$$I = \frac{1}{2}\left(\frac{W}{L}\right)\mu Cox(-Vdata)^2 \quad (8)$$

In addition, in the case of operating the transistor 3910 in a linear region, the current I flowing to the light-emitting element is represented by Formula (9).

[Formula 9]

$$I = \left(\frac{W}{L}\right)\mu Cox\left[(Vgs - Vth)Vds - \frac{1}{2}Vds^2\right] \quad (9)$$
$$= \left(\frac{W}{L}\right)\mu Cox\left[(-Vdata - |Vth| - Vth)Vds - \frac{1}{2}Vds^2\right]$$

Since Vth<0 is satisfied, Formula (9) can be transformed to Formula (10).

[Formula 10]

$$I = \left(\frac{W}{L}\right)\mu Cox\left[(-Vdata)Vds - \frac{1}{2}Vds^2\right] \quad (10)$$

Here, W means channel width of the transistor 3910; L means channel length of the transistor 3910; μ means mobility of the transistor 3910; and Cox means storage capacitance of the transistor 3910.

According to Formula (8) and Formula (10), a current flowing to the light-emitting element 3916 does not depend on the threshold voltage (Vth) of the transistor 3910 in each of the case where the transistor 3910 is operated in the saturation region and the case where the transistor 3910 is operated in the linear region. Therefore, variations of a current value caused by variations in the threshold voltage of the transistor 3910 can be suppressed, so that the current in accordance with luminance data can be supplied to the light-emitting element 3916.

Accordingly, variations in luminance caused by variations in the threshold voltage of the transistor 3910 can be suppressed. In addition, since the potential of the opposite electrode 3924 is fixed at a constant potential, power consumption can be reduced.

Further, in the case of operating the transistor 3910 in the saturation region, variations in luminance caused by deterioration of the light-emitting element 3916 can also be reduced. When the light-emitting element 3916 deteriorates, $V_{EL}$ of the light-emitting element 3916 is increased and the potential of the first electrode, that is, the source electrode of the transistor 3910 decreases. At this time, the source electrode of the transistor 3910 is connected to the second electrode of the capacitor 3915; the gate electrode of the transistor 3910 is connected to the first electrode of the second electrode of the capacitor 3915 and is in a floating state. Therefore, a gate potential of the transistor decreases by the same potential as a potential in accordance with decrease in the source potential. Accordingly, since Vgs of the transistor 3910 does not change, a current flowing to the transistor 3910 and the light-emitting element 3916 is not affected even if the light-emitting element 3916 deteriorates. Note that it can be seen in Formula (8) that the current I flowing to the light-emitting element 3916 does not depend on the source potential or a drain potential.

Therefore, in the case of operating the transistor 3910 in the saturation region, variations in the current flowing to the transistor 3910 caused by variations in the threshold voltage of the transistor 3910 and deterioration of the light-emitting element 3916 can be suppressed.

Note that in the case of operating the transistor 3910 in the saturation region, channel length L of the transistor 3910 is preferably long in order to suppress increase in the amount of current caused by avalanche breakdown or channel length modulation.

In addition, since a reverse bias voltage is applied to the light-emitting element 3916 in the initialization period, a short-circuited portion in the light-emitting element 3916 can be insulated or deterioration of the light-emitting element 3916 can be suppressed. Therefore, a life of the light-emitting element 3916 can be extended.

Note that the light-emitting element 3916 shown in FIG. 39 is not particularly limited to a certain type, and an EL element (an organic EL element, an inorganic EL element, or an EL element including both an organic material and an inorganic material), an electron-emissive element, a liquid crystal element, electronic ink, and the like can be applied.

Note that it is only necessary for the transistor 3910 to have a function for controlling a current value supplied to the light-emitting element 3916, and a type of the transistor 3910 is not limited. Accordingly, a thin film transistor (TFT) using a crystalline semiconductor film, a thin film transistor using a non-crystalline semiconductor film typified by amorphous silicon or polycrystalline silicon, a transistor formed by using a semiconductor substrate or an SOI substrate, a MOS transistor, a junction transistor, a bipolar transistor, a transistor using a compound semiconductor such as ZnO or a-InGaZnO, a transistor using an organic semiconductor or a carbon nanotube, or other transistors can be applied.

The first switch 3911 is a switch which selects timing for inputting a signal in accordance with a gray scale of the pixel from the signal line 3917 into the pixel. The second switch 3912 is a switch which selects timing for supplying a predetermined potential to the gate electrode of the transistor 3910 and controls whether to supply the predetermined potential to the gate electrode of the transistor 3910. The third switch 3913 is a switch which selects timing for supplying a predetermined potential for initializing a potential written into the capacitor 3915 and raises the potential of the first electrode of the transistor 3910. The fourth switch 3914 is a switch which suppresses the potential fluctuation of the second electrode of the capacitor 3915 at the time of data writing. Therefore, the first switch 3911, the second switch 3912, the third switch 3913, and the fourth switch 3914 are not particularly limited as long as they have the aforementioned functions. For example, each of the first switch 3911, the second switch 3912, the third switch 3913, and the fourth switch 3914 may be a transistor, a diode, or a logic circuit combining them.

Note that, the polarity (a conductivity type) of each transistor is not particularly limited to a certain type. However, a transistor of polarity with small off-current is preferably used. A transistor provided with an LDD region, a transistor with a multi-gate structure, or the like is given as an example of a transistor with smaller off-current. In addition, a CMOS switch may be employed by using both N-channel and P-channel transistors.

For example, in the case where P-channel transistors are employed as the first switch 3911, the second switch 3912, the third switch 3913, and the fourth switch 3914, L-level signals are inputted to scan lines which control on/off of respective switches in order to turn on the switches, and H-level signals are inputted to the can lines which control on/off of respective switches in order to turn off the switches.

Further, since the pixel can be formed by using only P-channel transistors, a manufacturing process can be simplified.

In addition, the pixel shown in this embodiment mode can be applied to the display device in FIG. 9. Similarly to Embodiment Mode 1, unless the data writing period in each row overlaps, an initialization start period can be freely set in each row. Further, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since the threshold voltage writing period can also be set long, the threshold voltage of a transistor which controls a current value flowing to the light-emitting element can be written in the capacitor more accurately. Therefore, reliability as a display device can be improved.

Note that this embodiment mode can be freely combined with any pixel configuration shown in another embodiment mode. For example, there are the case where the fourth switch 3914 is connected between the node 3930 and the node 3931 or between the first electrode of the transistor 3910 and the node 3932, the case where the second electrode of the transistor 3910 is connected to the power supply line 3922 through the fourth switch 3914, and the like. Note that when a connection point of the power supply line 3922 and a wiring to which the second switch 3912 and the second electrode of the transistor 3910 is a node 3935, the fourth switch 3914 cannot be turned on in the initialization period in the case where the fourth switch 3914 is connected between the node 3935 and the power supply line 3922.

This embodiment mode can be applied to any pixel configuration shown in another embodiment mode, without limiting to the aforementioned description.

Embodiment Mode 7

In this embodiment mode, one mode of a partial sectional view of the pixel of the invention is described with reference to FIG. 17. Note that a transistor shown in the partial sectional view in this embodiment mode is a transistor having a function of controlling a current value supplied to a light-emitting element.

First, a base film 1712 is formed over a substrate 1711 having an insulating surface. As the substrate 1711 having the insulating surface, an insulating substrate such as a glass substrate, a quartz substrate, a plastic substrate (e.g., polyimide, acrylic, polyethylene terephthalate, polycarbonate, polyarylate, or polyethersulfone), or a ceramic substrate; or a metal substrate (e.g., tantalum, tungsten, or molybdenum), a semiconductor substrate, or the like on the surface of which an insulating film is formed, can be used. Note that it is necessary to use a substrate which can withstand at least heat generated during a process.

The base film 1712 is formed of a single layer or a plurality of layers including two or more layers of an insulating film such as a silicon oxide film, a silicon nitride film, or a silicon oxynitride ($SiO_xN_y$) film. Note that the base film 1712 may be formed by sputtering, CVD, or the like. Although the base film 1712 is a single layer in this embodiment mode, it may be a plurality of layers including two or more layers.

Next, a transistor 1713 is formed over the base film 1712. The transistor 1713 includes at least a semiconductor layer 1714, a gate insulating film 1715 formed over the semiconductor layer 1714, and a gate electrode 1716 formed over the semiconductor layer 1714 with the gate insulating film 1715 interposed therebetween. The semiconductor layer 1714 includes a source region and a drain region.

The semiconductor layer 1714 can be formed of a film having a non-crystalline state (i.e., a non-crystalline semiconductor film) selected from an amorphous semiconductor containing silicon, silicon germanium (SiGe), or the like as a main component, as well as amorphous silicon (a-Si:H), a semi-amorphous semiconductor in which an amorphous state and a crystalline state are mixed, and a microcrystalline semiconductor in which crystal grains of 0.5 nm to 20 nm can be observed in an amorphous semiconductor, or a crystalline semiconductor film of polysilicon (p-Si:H) or the like. Note that a microcrystalline state in which crystal grains of 0.5 nm to 20 nm can be observed is called microcrystal. Note that when a non-crystalline semiconductor film is used for the semiconductor layer 1714, it may be formed by sputtering, CVD, or the like, and when a crystalline semiconductor film is used for the semiconductor layer 1714, it may be formed by, for example, forming a non-crystalline semiconductor film and then crystallizing it. If necessary, a slight amount of an impurity element (e.g., phosphorus, arsenic, or boron) may be contained in the semiconductor layer 1714 in addition to the above main component in order to control the threshold voltage of a transistor.

Next, a gate insulating film 1715 is formed so as to cover the semiconductor layer 1714. The gate insulating film 1715 is formed of a single layer or a plurality of layers using, for example, silicon oxide, silicon nitride, silicon nitride oxide, or the like. CVD, sputtering, or the like can be used as a film formation method thereof.

Then, a gate electrode 1716 is formed above the semiconductor layer 1714 with the gate insulating film 1715 interposed therebetween. The gate electrode 1716 may be formed of a single layer or may be formed by stacking a plurality of metal films. Note that the gate electrode can be formed of a metal element selected from tantalum (Ta), tungsten (W), titanium (Ti), molybdenum (Mo), aluminum (Al), copper (Cu), and chromium (Cr), or an alloy or compound material containing the element as a main component. For example, the gate electrode may be formed of a first conductive film using tantalum nitride (TaN) and a second conductive film using tungsten (W).

Next, an impurity which imparts N-type or P-type conductivity is selectively added into the semiconductor layer 1714 by using as a mask the gate electrode 1716 or a resist which is formed into a desired shape. In this manner, a channel forming region and an impurity region (including a source region, a drain region, a GOLD region, and an LDD region) are formed in the semiconductor layer 1714. In addition, the transistor 1713 can be formed as either an N-channel transistor or a P-channel transistor depending on the conductivity type of the impurity element to be added.

Figure 17:
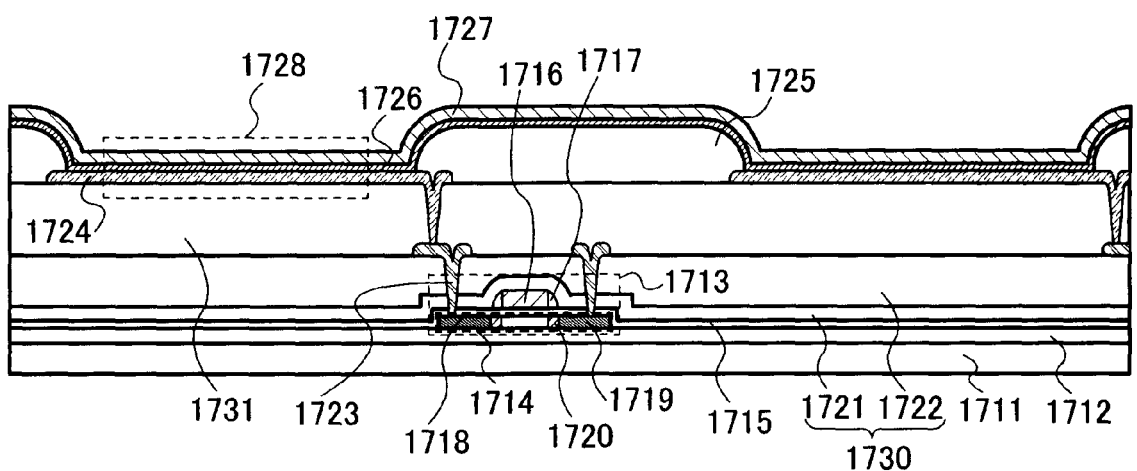
FIG. 17 is a partial sectional view showing a pixel shown in Embodiment Mode 7.

Note that in order to form an LDD region 1720 in a self-aligned manner in FIG. 17, a silicon compound, such as a silicon oxide film, a silicon nitride film, or a silicon oxynitride film is formed so as to cover the gate electrode 1716, and then is etched back to form a sidewall 1717. After that, the semiconductor layer 1714 is doped with the impurity which imparts conductivity, so that a source region 1718, a drain region 1719, and an LDD region 1720 can be formed. Therefore, the LDD region 1720 is located below the sidewall 1717. Note that the sidewall 1717 which is provided to form the LDD region 1720 in a self-aligned manner is not necessarily provided. Note that phosphorus, arsenic, boron, or the like is used as the impurity which imparts conductivity.

Next, a first interlayer insulating film 1730 is formed by stacking a first insulating film 1721 and a second insulating film 1722 to cover the gate electrode 1716. As each of the first insulating film 1721 and the second insulating film 1722, an inorganic insulating film such as a silicon oxide film, a silicon nitride film, or a silicon oxynitride ($SiO_xN_y$) film or an organic resin film (a photosensitive or non-photosensitive organic resin film) with a low dielectric constant can be used. Further, a film containing siloxane may also be used. Note that siloxane is a material in which a skeleton structure is formed by the bond of silicon (Si) and oxygen (O), and an organic group (e.g., an alkyl group or aromatic hydrocarbon) is used as a substituent. Further, a fluoro group may also be contained as a substituent.

Note that insulating films made of the same material may be used as the first insulating film 1721 and the second insulating film 1722. In this embodiment mode, the first interlayer insulating film 1730 has a stacked-layer structure of two layers; however, it may be a single layer or have a stacked-layer structure of three or more layers.

Note that the first insulating film 1721 and the second insulating film 1722 may be formed by sputtering, CVD, spin coating, or the like, and may be formed by coating when an organic resin film or a film containing siloxane is used.

After that, source and drain electrodes 1723 are formed over the first interlayer insulating film 1730. Note that the source and drain electrodes 1723 are connected to the source region 1718 and the drain region 1719 respectively through contact holes.

Note that each of the source and drain electrodes 1723 can be formed of a metal such as silver (Ag), gold (Au), copper (Cu), nickel (Ni), platinum (Pt), palladium (Pd), iridium (Ir), rhodium (Rh), tungsten (W), aluminum (Al), tantalum (Ta), molybdenum (Mo), cadmium (Cd), zinc (Zn), iron (Fe), titanium (Ti), silicon (Si), germanium (Ge), zirconium (Zr), or barium (Ba), an alloy thereof, metal nitride thereof, or a stacked-layer film thereof.

Next, a second interlayer insulating film 1731 is formed so as to cover the source and drain electrodes 1723. As the second interlayer insulating film 1731, an inorganic insulating film, a resin film, or a stacked layer thereof can be used. As the inorganic insulating film, a silicon nitride film, a silicon oxide film, a silicon oxynitride film, or a stacked-layer film thereof can be used. For the resin film, polyimide, polyamide, acrylic, polyimide amide, epoxy, or the like can be used.

A pixel electrode 1724 is formed over the second interlayer insulating film 1731. Next, an insulator 1725 is formed so as to cover an end portion of the pixel electrode 1724. The insulator 1725 is preferably formed to have a curved surface with curvature at an upper end or a lower end thereof in order to favorably form a layer 1726 containing a light-emitting substance later. For example, when positive photosensitive acrylic is used as a material of the insulator 1725, the insulator 1725 is preferably formed to have a curved surface with a curvature radius (0.2 μm to 3 μm) only at the upper end thereof. Either a negative photosensitive material which becomes insoluble in an etchant by light irradiation or a positive photosensitive material which becomes soluble in an etchant by light irradiation can be used for the insulator 1725. Further, an inorganic material such as silicon oxide or silicon oxynitride as well as an organic material can be used as a material of the insulator 1725.

Next, a layer 1726 containing a light-emitting substance and an opposite electrode 1727 are formed over the pixel electrode 1724 and the insulator 1725.

Note that a light-emitting element 1728 is formed in a region where the layer 1726 containing a light-emitting substance is sandwiched between the pixel electrode 1724 and the opposite electrode 1727.

Figure 18A:
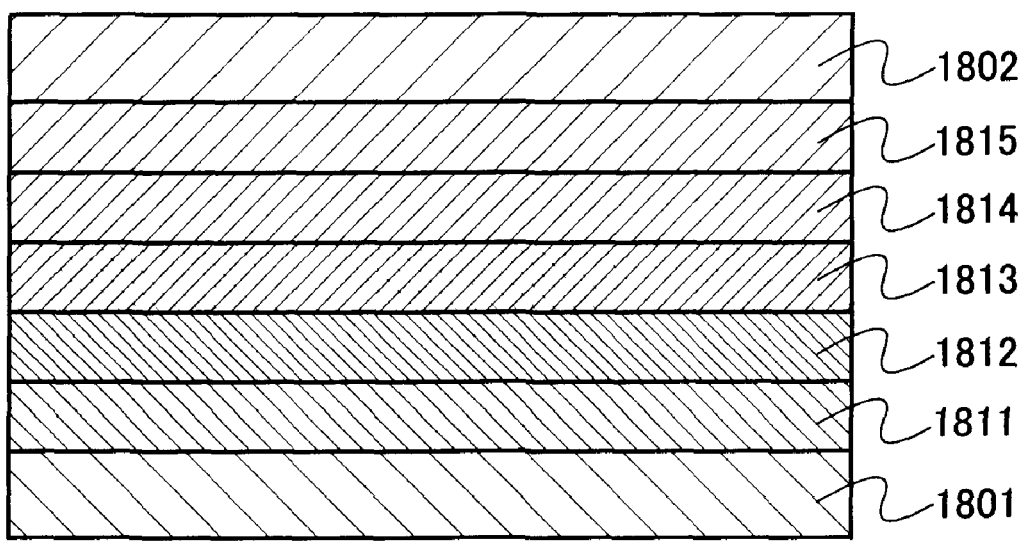
FIGS. 18A and 18B are diagrams each showing a light-emitting element shown in Embodiment Mode 7.

Next, the detail of the light-emitting element 1728 is described with reference to FIGS. 18A and 18B. Note that the pixel electrode 1724 and the opposite electrode 1727 in FIG. 17 correspond to a pixel electrode 1801 and an opposite electrode 1802 in FIGS. 18A and 18B. In FIG. 18A, the pixel electrode is an anode and the opposite electrode is a cathode.

As shown in FIG. 18A, a hole injection layer 1811, a hole transport layer 1812, an electron transport layer 1814, an electron injection layer 1815, and the like are provided in addition to a light-emitting layer 1813 between the pixel electrode 1801 and the opposite electrode 1802. These layers are stacked so that holes are injected from the pixel electrode 1801 side and electrons are injected from the opposite electrode 1802 side when a voltage is applied such that a potential of the pixel electrode 1801 is higher than that of the opposite electrode 1802.

In such a light-emitting element, the holes injected from the pixel electrode 1801 and the electrons injected from the opposite electrode 1802 are recombined in the light-emitting layer 1813 to excite the light-emitting substance. Then, light emission occurs when the excited light-emitting substance returns to a ground state. Note that any substance which can provide luminescence (electroluminescence) can be used as the light-emitting substance.

There is no particular limitation on the substance forming the light-emitting layer 1813, and the light-emitting layer may be formed of only a light-emitting substance. However, when concentration quenching occurs, the light-emitting layer is preferably a layer in which a light-emitting substance is mixed so as to be dispersed into a layer of a substance (host) having a larger energy gap than the light-emitting substance, thereby preventing concentration quenching of the light-emitting substance. Note that the energy gap refers to an energy difference between the lowest unoccupied molecular orbital (LUMO) level and the highest occupied molecular orbital (HOMO) level.

In addition, there is no particular limitation on the light-emitting substance, and any substance which can emit light with a desired emission wavelength may be used. For example, in order to obtain red light emission, a substance which exhibits light emission having a peak of an emission spectrum at 600 nm to 680 nm can be used, such as 4-dicyanomethylene-2-isopropyl-6-[2-(1,1,7,7-tetramethyljulolidine-9-yl)ethenyl]-4H-pyran (abbr.: DCJTI), 4-dicyanomethylene-2-methyl-6-[2-(1,1,7,7-tetramethyljulolidine-9-yl)ethenyl]-4H-pyran (abbr.: DCJT), 4-dicyanomethylene-2-tert-butyl-6-[2-(1,1,7,7-tetramethyljulolidine-9-yl)ethenyl]-4H-pyran (abbr.: DCJTB), periflanthene, or 2,5-dicyano-1,4-bis[2-(10-methoxy-1,1,7,7-tetramethyljulolidine-9-yl)ethenyl]benzene. In order to obtain green light emission, a substance which exhibits light emission having a peak of an emission spectrum at 500 nm to 550 nm can be used, such as N,N'-dimethylquinacridon (abbr.: DMQd), coumarin 6, coumarin 545T, tris(8-quinolinolato)aluminum (abbr.: Alq), or N,N'-diphenylquinacridon (abbr.: DPQd). In order to obtain blue light emission, a substance which exhibits light emission having a peak of an emission spectrum at 420 nm to 500 nm can be used, such as 9,10-bis(2-naphthyl)-tert-butylanthracene (abbr.: t-BuDNA), 9,9'-bianthryl, 9,10-diphenylanthracene (abbr.: DPA), 9,10-bis(2-naphthyl)anthracene (abbr.: DNA), bis(2-methyl-8-quinolinolato)-4-phenylphenolato-gallium (abbr.: BGaq), or bis(2-methyl-8-quinolinolato)-4-phenylphenolato-aluminum (abbr.: BAlq).

There is also no particular limitation on the substance which is used for dispersing the light-emitting substance, and for example, an anthracene derivative such as 9,10-di(2-naphthyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)pyridinato]zinc (abbr.: $Znpp_2$) or bis[2-(2-hydroxyphenyl)benzoxazolato]zinc (abbr.: ZnBOX), or the like can be used.

Although an anode material forming the pixel electrode 1801 is not particularly limited, it is preferable to use a metal, an alloy, an electrically conductive compound, a mixture thereof, or the like having a high work function (a work function of 4.0 eV or higher). As a specific example of such an anode material, oxide of a metal material such as indium tin oxide (abbr.: ITO), ITO containing silicon oxide (abbr.: ITSO), or indium zinc oxide (abbr.: IZO) formed by using a target in which indium oxide is mixed with zinc oxide (ZnO) at 2 wt % to 20 wt % can be given. Further, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., TiN), or the like can be given.

On the other hand, as a substance forming the opposite electrode 1802, a metal, an alloy, a conductive compound, a mixture thereof, or the like having a low work function (a work function of 3.8 eV or less) can be used. As a specific example of such a cathode material, an element belonging to Group 1 or 2 of the periodic table, that is, an alkali metal such as lithium (Li) or cesium (Cs), an alkaline earth metal such as magnesium (Mg), calcium (Ca), or strontium (Sr), or an alloy containing them (Mg:Ag, Al:Li) can be given. In addition, by providing a layer having an excellent electron injection property between the opposite electrode 1802 and the light-emitting layer 1813 so as to be stacked with the opposite electrode, various conductive materials including the materials described as the material of the pixel electrode 1801 such as Al, Ag, ITO, or ITO containing silicon oxide can be used for the opposite electrode 1802 regardless of the value of the work function. Further, a similar effect can be obtained by using a material particularly having an excellent electron injecting function for forming the electron injection layer 1815 described later.

Note that in order to extract light emission to outside, it is preferable that one or both of the pixel electrode 1801 and the opposite electrode 1802 be a transparent electrode made of ITO or the like or an electrode formed with a thickness of several to several tens nm so as to be able to transmit visible light.

The hole transport layer 1812 is provided between the pixel electrode 1801 and the light-emitting layer 1813 as shown in FIG. 18A. The hole transport layer is a layer having a function of transporting holes injected from the pixel electrode 1801 to the light-emitting layer 1813. By providing the hole transport layer 1812 to separate the pixel electrode 1801 and the light-emitting layer 1813 from each other as described above, light emission can be prevented from being quenched due to metal.

Note that the hole transport layer 1812 is preferably formed using a substance having a high hole transport property, and in particular, a substance having a hole mobility of $1 \times 10^{-6}$ $cm^2$/Vs or more is preferably used. Note that the substance having a high hole transport property refers to a substance having a higher mobility of holes than electrons. As specific examples of a substance capable of forming the hole transport layer 1812, there are 4,4'-bis[N-(1-naphthyl)-N-phenylamino]biphenyl (abbr.: NPB), 4,4'-bis[N-(3-methylphenyl)-N-phenylamino]biphenyl (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), 4,4'-bis{N-[4-(N,N-di-m-tolylamino)phenyl]-N-phenylamino}biphenyl (abbr.: DNTPD), 1,3,5-tris[N,N-di(m-tolyl)amino]benzene (abbr.: m-MTDAB), 4,4',4''-tris(N-carbazolyl)tripheylamine (abbr.: TCTA), phthalocyanine (abbr.: $H_2PC$), copper phthalocyanine (abbr.: CuPc), vanadyl phthalocyanine (abbr.: VOPc), and the like. In addition, the hole transport layer 1812 may be a layer having a multi-layer structure which is formed by combining two or more layers formed of any of the aforementioned substances.

Further, the electron transport layer 1814 may be provided between the opposite electrode 1802 and the light-emitting layer 1813 as shown in FIG. 18A. Here, the electron transport layer is a layer having a function of transporting electrons injected from the opposite electrode 1802 to the light-emitting layer 1813. By providing the electron transport layer 1814 to separate the opposite electrode 1802 and the light-emitting layer 1813 from each other as described above, light emission can be prevented from being quenched due to metal of the electrode material.

There is no particular limitation on the material of the electron transport layer 1814, and the electron transport layer 1814 can be formed using a metal complex having a quinoline skeleton or a benzoquinoline skeleton such as tris(8-quinolinolato)aluminum (abbr.: Alq), tris(4-methyl-8-quinolinolato)aluminum (abbr.: $Almq_3$), bis(10-hydroxybenzo[h]-quinolinato)beryllium (abbr.: $BeBq_2$), or bis(2-methyl-8-quinolinolato)-4-phenylphenolato-aluminum (abbr.: BAlq), or the like. Further, the electron transport layer 1814 may also be formed using a metal complex having an oxazole ligand or a thiazole ligand such as bis[2-(2-hydroxyphenyl)-benzoxazolato]zinc (abbr.: $Zn(BOX)_2$) or bis[2-(2-hydroxyphenyl)-benzothiazolato]zinc (abbr.: $Zn(BTZ)_2$), or the like. Further alternatively, the electron transport layer 1814 may be formed using 2-(4-biphenylyl)-5-(4-tert-butylphenyl)-1,3,4-oxadiazole (abbr.: PBD), 1,3-bis[5-(p-tert-butylphenyl)-1,3,4-oxadiazol-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen), bathocuproin (abbr.: BCP), or the like. The electron transport layer 1814 is preferably formed using a substance having a higher mobility of electrons than holes as described above. In addition, the electron transport layer 1814 is preferably formed using a substance having an electron mobility of $1 \times 10^{-6}$ $cm^2$/Vs or more. Note that the electron transport layer 1814 may have a multi-layer structure which is formed by combining two or more layers formed of any of the aforementioned substances.

Further, the hole injection layer 1811 may be provided between the pixel electrode 1801 and the hole transport layer 1812 as shown in FIG. 18A. Here, the hole injection layer refers to a layer having a function of promoting hole injection from the electrode functioning as the anode to the hole transport layer 1812.

There is no particular limitation on the material of the hole injection layer 1811, and the hole injection layer 1811 can be formed using metal oxide such as molybdenum oxide (MoOx), vanadium oxide (VOx), ruthenium oxide (RuOx), tungsten oxide (WOx), or manganese oxide (MnOx). Further, the hole injection layer 1811 can also be formed using a phthalocyanine-based compound such as phthalocyanine (abbr.: $H_2Pc$) or copper phthalocyanine (CuPc), an aromatic amine-based compound such as 4,4-bis(N-(4-(N,N-di-m-tolylamino)phenyl)-N-phenylamino)biphenyl (abbr.: DNTPD), a high molecule such as a poly(ethylene dioxythiophene)/poly(styrenesulfonic acid) aqueous solution (PEDOT/PSS), or the like.

Further, a mixture of the aforementioned metal oxide and a substance having a high hole transport property may be provided between the pixel electrode 1801 and the hole transport layer 1812. Such a layer does not cause a rise in driving voltage even when it is thickened; therefore, optical design using a microcavity effect or a light interference effect can be conducted by adjusting the thickness of the layer. Therefore, a high-quality light-emitting element with excellent color purity and few changes in color that are dependent on viewing angles can be manufactured. In addition, the film thickness of such a layer can be controlled so as to prevent short circuit between the pixel electrode 1801 and the opposite electrode 1802 that would occur due to irregularities generated at the film formation on the surface of the pixel electrode 1801 or due to minute residues remaining on the electrode surface.

Further, the electron injection layer 1815 may be provided between the opposite electrode 1802 and the electron transport layer 1814 as shown in FIG. 18A. Here, the electron injection layer is a layer having a function of promoting electron injection from the electrode functioning as the cathode to the electron transport layer 1814. Note that when the electron transport layer is not particularly provided, electron injection to the light-emitting layer may be helped by providing the electron injection layer between the electrode functioning as the cathode and the light-emitting layer.

There is no particular limitation on the material of the electron injection layer 1815, and the electron injection layer 1815 can be formed using a compound of alkali metal or alkaline earth metal, such as lithium fluoride (LiF), cesium fluoride (CsF), or calcium fluoride ($CaF_2$). Further, the electron injection layer 1815 can also be formed using a mixture of a substance having a high electron transport property such as Alq or 4,4-bis(5-methylbenzoxazol-2-yl)stilbene (BzOs), and alkali metal or alkaline earth metal such as magnesium or lithium.

Note that each of the hole injection layer 1811, the hole transport layer 1812, the light-emitting layer 1813, the electron transport layer 1814, and the electron injection layer 1815 may be formed by any of an evaporation method, an ink-jet method, a coating method, and the like. In addition, each of the pixel electrode 1801 and the opposite electrode 1802 may be formed by any of a sputtering method, an evaporation method, and the like.

Figure 18B:
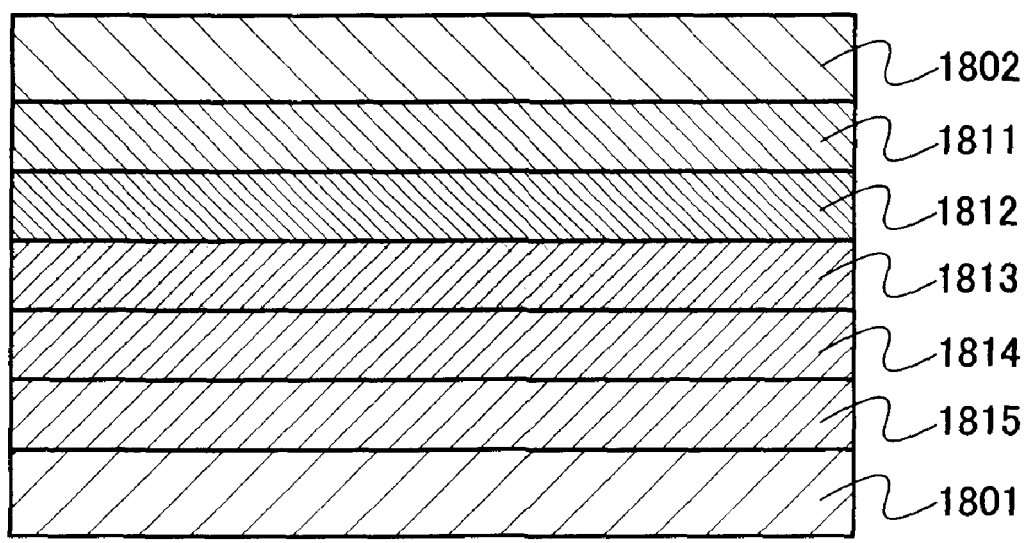

The layer structure of the light-emitting element is not limited to the one shown in FIG. 18A; the light-emitting element may be formed sequentially from an electrode functioning as a cathode as shown in FIG. 18B. That is, the pixel electrode 1801 may be formed as a cathode, and then the electron injection layer 1815, the electron transport layer 1814, the light-emitting layer 1813, the hole transport layer 1812, the hole injection layer 1811, and the opposite electrode 1802 may be stacked sequentially over the pixel electrode 1801. Note that the opposite electrode 1802 functions as an anode.

Although the light-emitting element having a single light-emitting layer is described here, the light-emitting element may include a plurality of light-emitting layers. By providing a plurality of light-emitting layers so that light emissions from the light-emitting layers are mixed, white light can be obtained. For example, in the case of a light-emitting element including two light-emitting layers, it is preferable to provide a spacing layer, or a layer which generates holes and a layer which generates electrons between a first light-emitting layer and a second light-emitting layer. By employing this structure, the light emitted to outside is visually mixed and perceived as white light; thus, white light can be obtained.

Light emission is extracted to outside through one or both of the pixel electrode 1724 and the opposite electrode 1727 in FIG. 17. Therefore, one or both of the pixel electrode 1724 and the opposite electrode 1727 is/are formed of a light-transmitting substance.

Figure 19A:
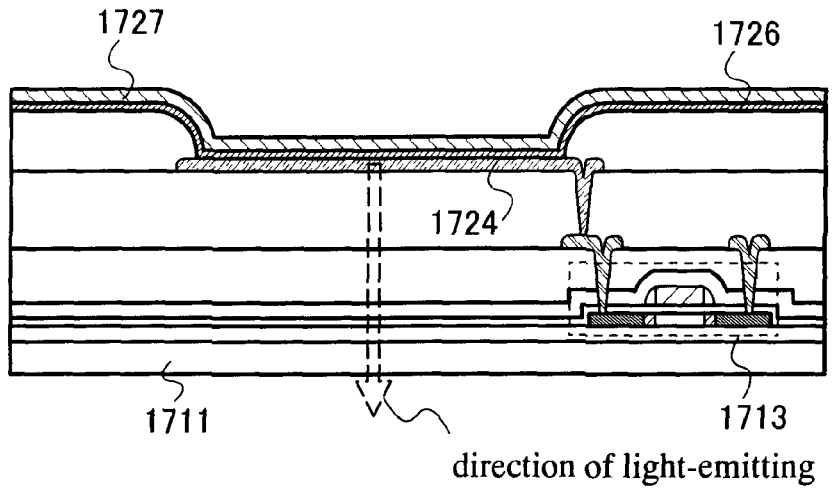
FIGS. 19A to 19C are diagrams each showing an extraction direction of light shown in Embodiment Mode 7.
Figure 19B:
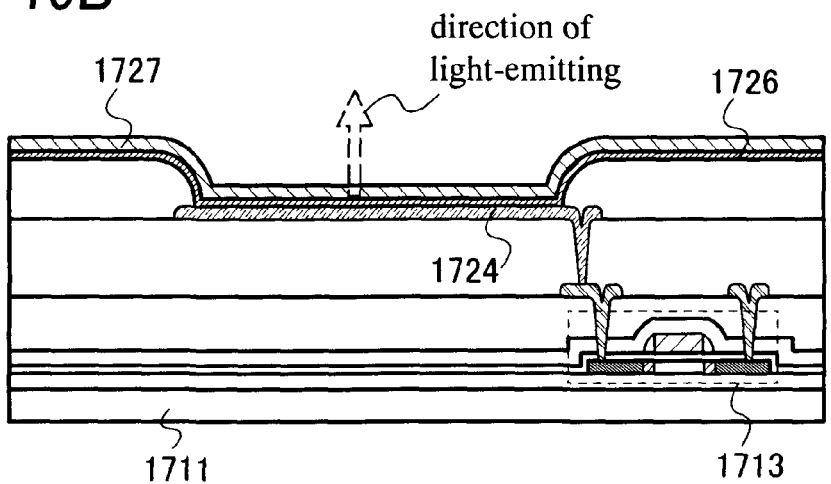
Figure 19C:
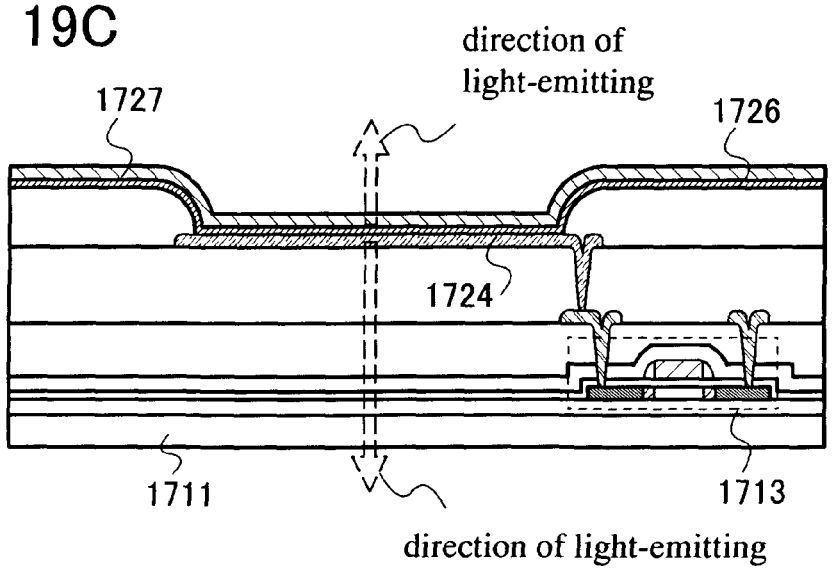

When only the opposite electrode 1727 is formed of a light-transmitting substance, light emission is extracted from a side opposite to the substrate through the opposite electrode 1727 as shown in FIG. 19A. When only the pixel electrode 1724 is formed of a light-transmitting substance, light emission is extracted from the substrate side through the pixel electrode 1724 as shown in FIG. 19B. When both of the pixel electrode 1724 and the opposite electrode 1727 are formed of light-transmitting substances, light emission is extracted from both of the substrate side and the opposite side thereof through the pixel electrode 1724 and the opposite electrode 1727 as shown in FIG. 19C.

The material of each wiring or electrode is not limited to the above-described materials, and one element or a plurality of elements selected from aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), and tin (Sn), a compound or an alloy material containing one element or a plurality of elements selected from the above ones (e.g., Indium Tin Oxide (ITO), Indium Zinc Oxide (IZO), ITO containing silicon oxide (ITSO), zinc oxide (ZnO), aluminum-neodymium (Al—Nd), or magnesium-silver (Mg—Ag)), a substance combining any of the above-described compounds, or the like can be used. Further, a compound of silicon and any of the above-described ones (silicide) (e.g., aluminum-silicon, molybdenum-silicon, or nickel silicide) or a compound of nitrogen (e.g., titanium nitride, tantalum nitride, or molybdenum nitride) can also be used. Note that the silicon (Si) may contain an N-type impurity (e.g., phosphorus) or a P-type impurity (e.g., boron) at a high concentration; by containing the impurity, the conductivity is improved such that the similar action to a general conductor is performed, thereby utilizing the silicon as a wiring or an electrode more easily. Note that any of single crystalline silicon, polycrystalline silicon (polysilicon), and amorphous silicon can be used as the silicon; the resistance can be reduced in the case of using single crystalline silicon or polycrystalline silicon, and it becomes possible to manufacture through a simple manufacturing process in the case of using amorphous silicon.

Further, in the case of using aluminum or silver, signal delay can be reduced because of its high conductivity. In addition, since it is easy to be etched, patterning can be easily performed and microfabrication can be performed. Further, also in the case of using copper, signal delay can be reduced because of its high conductivity. In the case of using molybdenum, a problem such as a material defect does not occur in the manufacturing process even if molybdenum is in contact with an oxide semiconductor such as ITO or IZO, or silicon. In addition, patterning or etching can be performed easily and the heat resistance is high. In the case of using titanium also, a problem such as a material defect does not occur in the manufacturing process even if titanium is in contact with an oxide semiconductor such as ITO or IZO or silicon, and the heat resistance is high. Further, tungsten or neodymium is also preferable because of its high heat resistance. Note that when neodymium is combined with aluminum to be an alloy, the heat resistance is improved and a hillock of aluminum can be suppressed. Further, silicon can be formed at the same time as a semiconductor layer included in a transistor, and has a high heat resistance. Further, Indium Tin Oxide (ITO), Indium Zinc Oxide (IZO), ITO containing silicon oxide (ITSO), zinc oxide (ZnO), or silicon (Si) each having a light-transmitting property is particularly preferable when it is used for a portion though which light is transmitted; for example, they can be used for a pixel electrode or a common electrode.

Note that the wiring or the electrode may have a single layer structure or a multi-layer structure formed using any of the above-described materials. For example, in the case of employing a single layer structure, the manufacturing process can be simplified and cost can be reduced. In the case of employing a multi-layer structure, advantages of the materials can be utilized while disadvantages thereof can be decreased, thereby a wiring or an electrode which is superior in performance can be formed. For example, by containing a low-resistance material (e.g., aluminum) in the multi-layer structure, the resistance of the wiring can be reduced. Further, by containing a high heat resistance material in the multi-layer structure (e.g., a stacked-layer structure in which a low heat resistance material having an advantage is sandwiched using a high heat resistance material), the heat resistance can be improved and an advantage which is not utilized in a single layer can be utilized. For example, it is preferable to use a wiring or an electrode having a structure in which a layer containing aluminum is sandwiched using a layer containing molybdenum or titanium. Note that when a wiring or an electrode has a portion which is directly in contact with a wiring or an electrode formed of another material, they may have an adverse effect on each other. For example, one material is mixed into the other material to change properties of both the materials, thereby, for example, an original purpose cannot be achieved or a problem occurs at the time of manufacturing so that normal manufacturing cannot be performed. In this case, such a problem can be solved by sandwiching or covering one layer by another layer. For example, when Indium Tin Oxide (ITO) and aluminum are in contact with each other, titanium or molybdenum is preferably sandwiched therebetween. Similarly, also when silicon and aluminum are made to be in contact with each other, titanium or molybdenum is preferably sandwiched therebetween.

Next, a transistor having a staggered structure using a non-crystalline semiconductor film for a semiconductor layer of the transistor 1713 is described. Partial sectional views of a pixel are shown in FIGS. 20A and 20B. Note that in each of FIGS. 20A and 20B, in addition to a transistor having a staggered structure, a capacitor included in a pixel is described.

As shown in FIGS. 20A and 20B, a base film 2012 is formed over a substrate 2011. Further, a pixel electrode 2013 is formed over the base film 2012. In addition, a first electrode 2014 is formed of the same material in the same layer as the pixel electrode 2013.

Further, a wiring 2015 and a wiring 2016 are formed over the base film 2012, and an end portion of the pixel electrode 2013 is covered with the wiring 2015. An N-type semiconductor layer 2017 and an N-type semiconductor layer 2018 each having N-type conductivity are formed over the wiring 2015 and the wiring 2016. In addition, a semiconductor layer 2019 is formed over the base film 2012 between the wiring 2015 and the wiring 2016. A part of the semiconductor layer 2019 is extended so as to overlap with the N-type semiconductor layer 2017 and the N-type semiconductor layer 2018. Note that this semiconductor layer is formed of a non-crystalline semiconductor film made of an amorphous semiconductor such as amorphous silicon (a-Si:H), a semi-amorphous semiconductor, a microcrystalline semiconductor, or the like. In addition, a gate insulating film 2020 is formed over the semiconductor layer 2019. An insulating film 2021 made of the same material in the same layer as the gate insulating film 2020 is also formed over the first electrode 2014.

Furthermore, a gate electrode 2022 is formed over the gate insulating film 2020; thus, a transistor 2025 is formed. In addition, a second electrode 2023 made of the same material in the same layer as the gate electrode 2022 is formed over the first electrode 2014 with the insulating film 2021 interposed therebetween, and a capacitor 2024 is formed in which the insulating film 2021 is sandwiched between the first electrode 2014 and the second electrode 2023. An interlayer insulating film 2026 is formed so as to cover the end portion of the pixel electrode 2013, the transistor 2025, and the capacitor 2024.

A layer 2027 containing a light-emitting substance and an opposite electrode 2028 are formed over the interlayer insulating film 2026 and the pixel electrode 2013 located in an opening of the interlayer insulating film 2026, and a light-emitting element 2029 is formed in a region where the layer 2027 containing a light-emitting substance is sandwiched between the pixel electrode 2013 and the opposite electrode 2028.

The first electrode 2014 shown in FIG. 20A may be formed of the same material in the same layer as the wirings 2015 and 2016 as shown in FIG. 20B, and a capacitor 2031 may be formed in which the insulating film 2021 is sandwiched between a first electrode 2030 and the second electrode 2023. Although an N-channel transistor is used as the transistor 2025 in FIGS. 20A and 20B, a P-channel transistor may also be used.

Materials of the substrate 2011, the base film 2012, the pixel electrode 2013, the gate insulating film 2020, the gate electrode 2022, the interlayer insulating film 2026, the layer 2027 containing a light-emitting substance, and the opposite electrode 2028 may be similar to those of the substrate 1711, the base film 1712, the pixel electrode 1724, the gate insulating film 1715, the gate electrode 1716, the interlayer insulating films 1730 and 1731, the layer 1726 containing a light-emitting substance, and the opposite electrode 1727 shown in FIG. 17, respectively. The wirings 2015 and 2016 may be formed by using a material similar to those of the source and drain electrodes 1723 in FIG. 17.

Next, partial sectional views of a pixel having a transistor with a structure in which a gate electrode is sandwiched between a substrate and a semiconductor layer, namely a bottom-gate transistor in which a gate electrode is located below a semiconductor layer are FIGS. 21A and 21B, as another structure of a transistor using a non-crystalline semiconductor film as a semiconductor layer.

A base film 2112 is formed over a substrate 2111. A gate electrode 2113 is formed over the base film 2112. In addition, a first electrode 2114 is formed of the same material in the same layer as the gate electrode 2113. As a material of the gate electrode 2113, polycrystalline silicon to which phosphorus is added or silicide that is a compound of metal and silicon may be used as well as the material used for the gate electrode 1716 shown in FIG. 17.

A gate insulating film 2115 is formed so as to cover the gate electrode 2113 and the first electrode 2114.

A semiconductor layer 2116 is formed over the gate insulating film 2115. A semiconductor layer 2117 made of the same material in the same layer as the semiconductor layer 2116 is formed over the first electrode 2114. Note that this semiconductor layer is formed of a non-crystalline semiconductor film of an amorphous semiconductor such as amorphous silicon (a-Si:H), a semi-amorphous semiconductor, a microcrystalline semiconductor, or the like.

An N-type semiconductor layer 2118 and an N-type semiconductor layer 2119 having N-type conductivity are formed over the semiconductor layer 2116, and an N-type semiconductor layer 2120 is formed over the semiconductor layer 2117.

A wiring 2121 and a wiring 2122 are formed over the N-type semiconductor layer 2118 and the N-type semiconductor layer 2119; thus a transistor 2129 is formed. A conductive layer 2123 made of the same material in the same layer as the wiring 2121 and the wiring 2122 is formed over the N-type semiconductor layer 2120; thus a second electrode includes the conductive layer 2123, the N-type semiconductor layer 2120, and the semiconductor layer 2117. Note that a capacitor 2130 is formed with a structure in which the gate insulating film 2115 is sandwiched between the second electrode and the first electrode 2114.

One end of the wiring 2121 is extended, and a pixel electrode 2124 is formed in contact with the top portion of the extended wiring 2121.

An insulator 2125 is formed so as to cover an end portion of the pixel electrode 2124, the transistor 2129, and the capacitor 2130.

A layer 2126 containing a light-emitting substance and an opposite electrode 2127 are formed over the pixel electrode 2124 and the insulator 2125, and a light-emitting element 2128 is formed in a region where the layer 2126 containing a light-emitting substance is sandwiched between the pixel electrode 2124 and the opposite electrode 2127.

The semiconductor layer 2117 and the N-type semiconductor layer 2120 which serve as a part of the second electrode of the capacitor 2130 do not particularly need to be provided. In other words, a capacitor may be formed with a structure in which the conductive layer 2123 is used as the second electrode and the gate insulating film 2115 is sandwiched between the first electrode 2114 and the conductive layer 2123.

Although an N-channel transistor is used as the transistor 2129, a P-channel transistor may also be used.

Note that by forming the pixel electrode 2124 before the wiring 2121 is formed in FIG. 21A, a capacitor 2132 having a structure in which the gate insulating film 2115 is sandwiched between the first electrode 2114 and a second electrode 2131 made of the same material in the same layer as the pixel electrode 2124 can also be formed as shown in FIG. 21B.

Although the description is made on a channel-etch type inverted staggered transistor, a channel protection type transistor may also be formed of course. Next, the case of a channel protection type transistor is described with reference to FIGS. 22A and 22B. Note that the same reference numerals are used in FIGS. 22A and 22B to denote the same portions as those in FIGS. 21A and 21B.

A channel protection type transistor 2201 shown in FIG. 22A is different from the channel-etch type transistor 2129 shown in FIG. 21A in that an insulator 2202 serving as an etching mask is provided over a region for forming a channel in the semiconductor layer 2116.

Similarly, the channel protection type transistor 2201 shown in FIG. 22B is different from the channel-etch type transistor 2129 shown in FIG. 21B in that the insulator 2202 serving as an etching mask is provided over a region for forming a channel in the semiconductor layer 2116.

Manufacturing cost can be reduced by using a non-crystalline semiconductor film for a semiconductor layer of a transistor included in the pixel of the invention. Note that the materials described with reference to FIG. 17 can be used as respective materials.

Further, structures of a transistor and a capacitor are not limited to those described above, and transistors and capacitors having various structures can be used.

Further, a crystalline semiconductor film of polysilicon (p-Si:H) or the like may also be used for a semiconductor layer of a transistor, as well as a non-crystalline semiconductor film of an amorphous semiconductor such as amorphous silicon (a-Si:H), a semi-amorphous semiconductor, a microcrystalline semiconductor, or the like.

Figure 23:
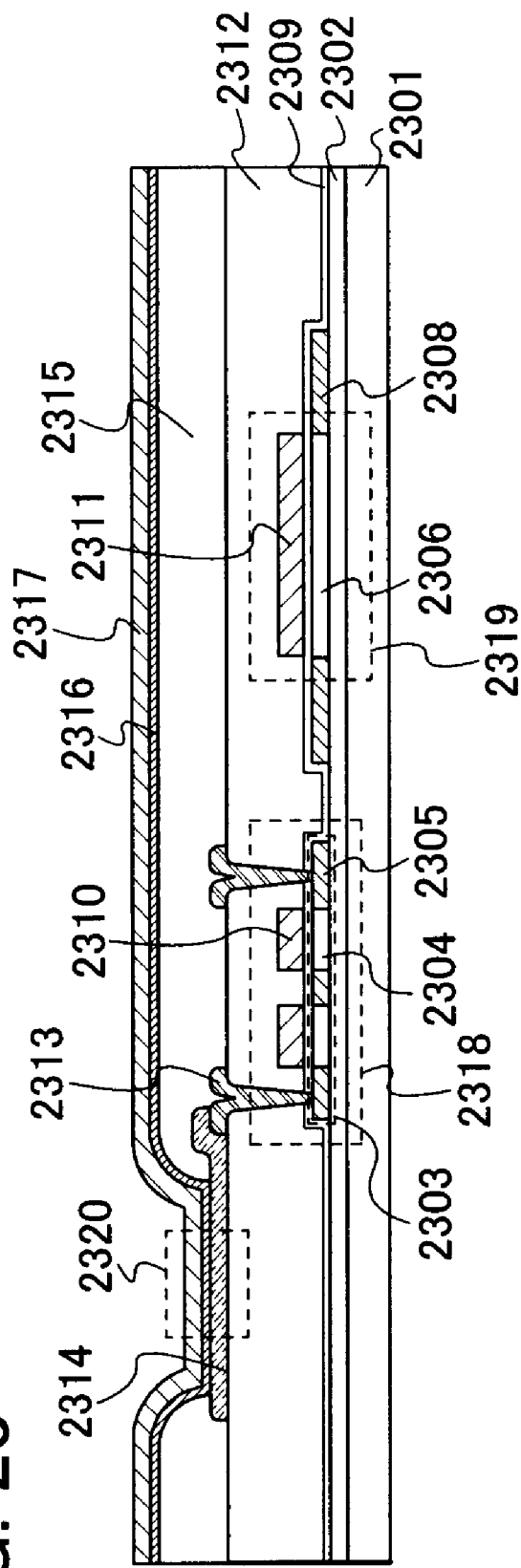
FIG. 23 is a partial sectional view showing a pixel shown in Embodiment Mode 7.

FIG. 23 is a partial sectional view of a pixel including a transistor using a crystalline semiconductor film for a semiconductor layer, and is described below. Note that a transistor 2318 shown in FIG. 23 is the multi-gate transistor shown in FIG. 29.

As shown in FIG. 23, a base film 2302 is formed over a substrate 2301, and a semiconductor layer 2303 is formed thereover. Note that the semiconductor layer 2303 is formed by patterning a crystalline semiconductor film into a desired shape.

An example of a manufacturing method of the crystalline semiconductor film is described below. First, an amorphous silicon film is formed over the substrate 2301 by sputtering, CVD, or the like. A film formation material does not need to be limited to an amorphous silicon film as long as it is a non-crystalline semiconductor film of an amorphous semiconductor, a semi-amorphous semiconductor, a microcrystalline semiconductor, or the like. Further, a compound semiconductor film having an amorphous structure such as an amorphous silicon germanium film may also be used.

Then, the formed amorphous silicon film is crystallized using a thermal crystallization method, a laser crystallization method, a thermal crystallization method using a catalytic element such as nickel, or the like, thereby obtaining a crystalline semiconductor film. Note that crystallization may also be performed by a combination of these crystallization methods.

In the case of forming the crystalline semiconductor film by a thermal crystallization method, a heating furnace, laser irradiation, RTA (Rapid Thermal Annealing), or a combination thereof can be used.

In the case of forming the crystalline semiconductor film by a laser crystallization method, a continuous wave laser beam (a CW laser beam) or a pulsed laser beam can be used. As a laser beam that can be used here, a laser beam emitted from one or more kinds of the following can be used: a gas laser such as an Ar laser, a Kr laser, or an excimer laser; a laser using, as a medium, single-crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. A crystal having a large grain diameter can be obtained by irradiation with the fundamental wave of the above laser beam or the second harmonic to the fourth harmonic of the laser beam. For example, the second harmonic (532 nm) or the third harmonic (355 nm) of a Nd:YVO$_4$ laser (the fundamental wave: 1064 nm) can be used. At this time, the energy density of the laser is required to be approximately 0.01 MW/cm$^2$ to 100 MW/cm$^2$ (preferably, 0.1 MW/cm$^2$ to 10 MW/cm$^2$). The scanning rate is set to approximately 10 cm/sec to 2000 cm/sec for irradiation.

Note that continuous wave oscillation can be performed with a laser using, as a medium, single-crystal YAG, YVO$_4$, forsterite (Mg$_2$SiO$_4$), YAlO$_3$, or GdVO$_4$, or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti:sapphire laser. Further, it can be pulsed at a repetition rate of 10 MHz or more by performing Q-switch operation, mode locking, or the like. When the laser beam is pulsed at a repetition rate of 10 MHz or more, the semiconductor film is irradiated with the next pulsed laser after being melted by the preceding laser before being solidified. Therefore, unlike the case of using a pulsed laser having a low repetition rate, the interface between solid phase and liquid phase can be moved continuously in the semiconductor film, so that crystal grains grown continuously in the scanning direction can be obtained.

In the case of forming a crystalline semiconductor film by a thermal crystallization method using a catalytic element such as nickel, it is preferable to perform gettering treatment for removing the catalytic element such as nickel after the crystallization.

By the above-described crystallization, a crystallized region is formed partially in the amorphous semiconductor film. This partly crystallized crystalline semiconductor film is patterned into a desired shape, thereby forming an island-shaped semiconductor film. This semiconductor film is used for the semiconductor layer 2303 of the transistor.

The crystalline semiconductor layer is used for a channel forming region 2304 and an impurity region 2305 serving as a source region or a drain region of the transistor 2318 and also for a semiconductor layer 2306 and an impurity region 2308 serving as a lower electrode of a capacitor 2319. Note that the impurity region 2308 does not particularly need to be provided. Channel doping may be performed to the channel forming region 2304 and the semiconductor layer 2306.

Next, a gate insulating film 2309 is formed over the semiconductor layer 2303 and the lower electrode of the capacitor 2319. Further, a gate electrode 2310 is formed over the semiconductor layer 2303 with the gate insulating film 2309 interposed therebetween, and an upper electrode 2311 made of the same material in the same layer as the gate electrode 2310 is formed over the semiconductor layer 2306 of the capacitor 2319 with the gate insulating film 2309 interposed therebetween. In this manner, the transistor 2318 and the capacitor 2319 are manufactured.

Next, an interlayer insulating film 2312 is formed so as to cover the transistor 2318 and the capacitor 2319, and a wiring 2313 is formed over the interlayer insulating film 2312 so as to be in contact with the impurity region 2305 through a contact hole. Then, a pixel electrode 2314 is formed in contact with the wiring 2313 over the interlayer insulating film 2312, and an insulator 2315 is formed so as to cover an end portion of the pixel electrode 2314 and the wiring 2313. Further, a layer 2316 containing a light-emitting substance and an opposite electrode 2317 are formed over the pixel electrode 2314, and a light-emitting element 2320 is formed in a region where the layer 2316 containing a light-emitting substance is sandwiched between the pixel electrode 2314 and the opposite electrode 2317.

Figure 24:
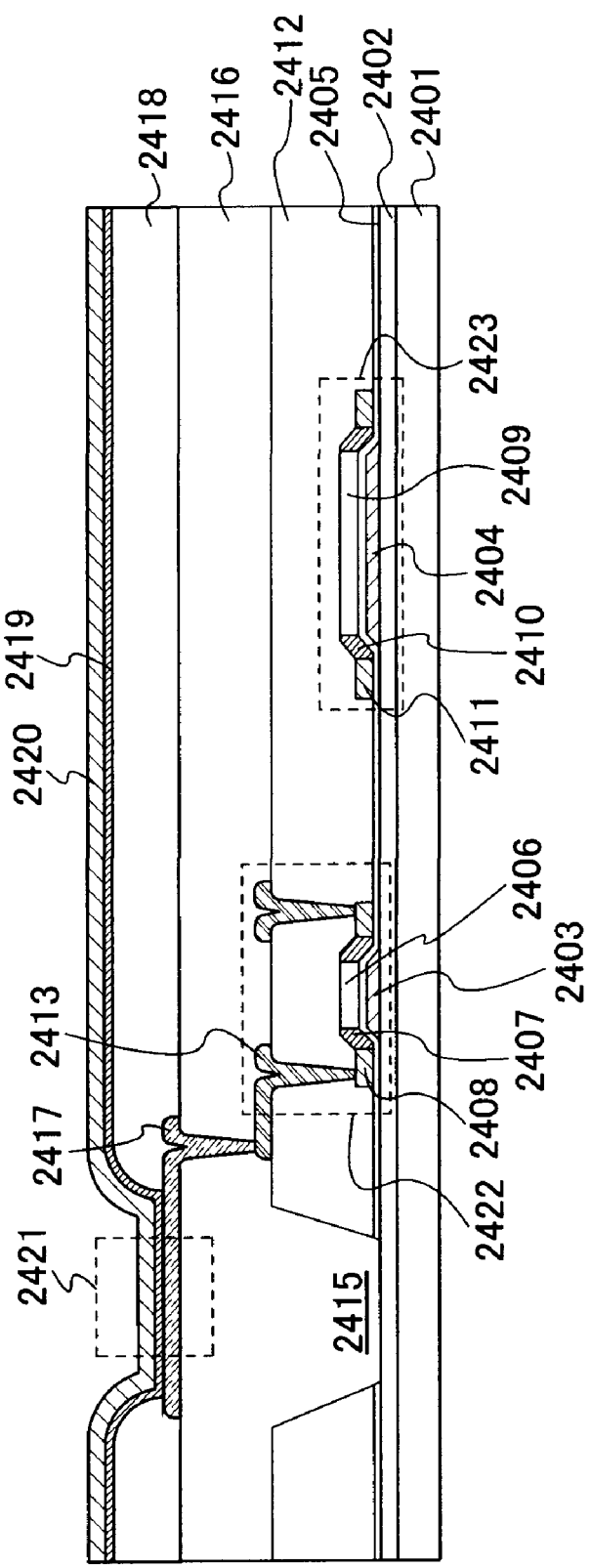
FIG. 24 is a partial sectional view showing a pixel shown in Embodiment Mode 7.

A partial cross section of a pixel including a bottom-gate transistor using a crystalline semiconductor film of polysilicon (p-Si:H) or the like for a semiconductor layer is shown in FIG. 24.

A base film 2402 is formed over a substrate 2401, and a gate electrode 2403 is formed thereover. In addition, a first electrode 2404 of a capacitor 2423 is formed of the same material in the same layer as the gate electrode 2403.

A gate insulating film 2405 is formed so as to cover the gate electrode 2403 and the first electrode 2404.

A semiconductor layer is formed over the gate insulating film 2405. Note that the semiconductor layer is formed by crystallizing a non-crystalline semiconductor film of an amorphous semiconductor, a semi-amorphous semiconductor, a microcrystalline semiconductor, or the like by using a thermal crystallization method, a laser crystallization method, a thermal crystallization method using a catalytic element such as nickel, or the like and patterning into a desired shape.

Note that the channel forming region 2406, an LDD region 2407, and an impurity region 2408 serving as a source region or a drain region of a transistor 2422, and a region 2409 serving as a second electrode, and impurity regions 2410 and 2411 of the capacitor 2423 are formed using the semiconductor layer. Note that the impurity regions 2410 and 2411 are not particularly required to be provided. In addition, the channel forming region 2406 and the region 2409 may be doped with an impurity.

Note that the capacitor 2423 has a structure in which the gate insulating film 2405 is sandwiched between the first electrode 2404 and the second electrode including the region 2409 and the like formed of the semiconductor layer.

Next, a first interlayer insulating film 2412 is formed so as to cover the semiconductor layer, and a wiring 2413 is formed over the first interlayer insulating film 2412 so as to be in contact with the impurity region 2408 through a contact hole.

An opening 2415 is formed in the first interlayer insulating film 2412. A second interlayer insulating film 2416 is formed so as to cover the transistor 2422, the capacitor 2423, and the opening 2415, and a pixel electrode 2417 is formed over the second interlayer insulating film 2416 so as to be connected to the wiring 2413 through a contact hole. In addition, an insulator 2418 is formed so as to cover an end portion of the pixel electrode 2417. Then, a layer 2419 containing a light-emitting substance and an opposite electrode 2420 are formed over the pixel electrode 2417, and a light-emitting element 2421 is formed in a region where the layer 2419 containing a light-emitting substance is sandwiched between the pixel electrode 2417 and the opposite electrode 2420. Note that the opening 2415 is located below the light-emitting element 2421. That is, since the first interlayer insulating film 2412 has the opening 2415, transmittance can be increased when light emission from the light-emitting element 2421 is extracted from the substrate side.

By using a crystalline semiconductor film for the semiconductor layer of the transistor included in the pixel of the invention, the scan line driver circuit 912 and the signal line driver circuit 911 in FIG. 9 can be easily formed over the same substrate as the pixel portion 913, for example.

Note that the structure of the transistor using the crystalline semiconductor film for the semiconductor layer is also not limited to that described above, and various structures can be employed. This is also true for a capacitor. In this embodiment mode, the materials in FIG. 17 can be used as appropriate unless stated otherwise.

The transistor described in this embodiment mode can be used as the transistor of controlling a current value supplied to the light-emitting element in each pixel described in Embodiment Modes 1 to 6. Therefore, variations of the current value caused by variations in threshold voltage of the transistor can be suppressed by operating the pixel as the described manner in any of Embodiment Modes 1 to 6. Accordingly, a current in accordance with luminance data can be supplied to a light-emitting element, so that variations in luminance can be suppressed. In addition, since operation is performed with the potential of the opposite electrode fixed, power consumption can be reduced.

Further, by applying such a pixel to the display device shown in FIG. 9, since each pixel can emit light except in its address period, a ratio of a light-emitting period in one frame period (i.e., a duty ratio) can be extremely raised and can also be approximately 100%. Accordingly, a display device with few variations in luminance and a high duty ratio can be obtained.

In addition, since the threshold voltage writing period can be set long, the threshold voltage of the transistor of controlling a current value supplied to the light-emitting element can be written in the capacitor more accurately. Therefore, reliability as a display device can be improved.

Embodiment Mode 8

In this embodiment mode, an element having a structure which is different from the light-emitting element described in Embodiment Mode 7 is described.

A light-emitting element utilizing electroluminescence is distinguished by whether a light-emitting material is an organic compound or an inorganic compound. In general, the former is called an organic EL element, and the latter is called an inorganic EL element.

The inorganic EL element is classified into a dispersion type inorganic EL element and a thin-film type inorganic EL element, depending on its element structure. The former and the latter are different in that the former has a light-emitting layer where particles of a light-emitting material are dispersed in a binder whereas the latter has a light-emitting layer formed of a thin film of a light-emitting material. However, the former and the latter have in common that electrons accelerated by a high electric field are required. Note that, as a mechanism of light emission that is obtained, there are donor-acceptor recombination type light emission that utilizes a donor level and an acceptor level, and localized type light emission that utilizes inner-shell electron transition of a metal ion. In general, in many cases, a dispersion type inorganic EL element has donor-acceptor recombination type light emission, and a thin-film type inorganic EL element has localized type light emission.

The light-emitting material used in this embodiment mode includes at least a host material and an impurity element to be a light-emission center (also called a light-emitting substance). By changing an impurity element that is contained, light emission of various colors can be obtained. As a manufacturing method of the light-emitting material, various methods such as a solid phase method and a liquid phase method (a coprecipitation method) can be used. Further, an evaporative decomposition method, a double decomposition method, a method by heat decomposition reaction of a precursor, a reversed micelle method, a method in which such a method is combined with high temperature baking, a liquid phase method such as a lyophilization method, or the like can also be used.

A solid phase method is a method in which a host material, and an impurity element or a compound containing an impurity element are weighed, mixed in a mortar, heated in an electric furnace, and baked to be reacted, thereby containing the impurity element in the host material. The baking temperature is preferably 700° C. to 1500° C. This is because the solid reaction does not progress when the temperature is too low, whereas the host material is decomposed when the temperature is too high. The baking may be performed in a powder state; however, it is preferable to perform the baking in a pellet state. Although the baking has to be performed at a comparatively high temperature, the solid phase method is easy; thus, the solid phase method is suitable for mass production with high productivity.

A liquid phase method (a coprecipitation method) is a method in which a host material or a compound containing a host material is reacted with an impurity element or a compound containing an impurity element in a solution, dried, and then baked. Particles of a light-emitting material are distributed uniformly, and the reaction can progress even when the grain size is small and the baking temperature is low.

As a host material used for a light-emitting material, hydrosulfide, oxide, or nitride can be used. As hydrosulfide, for example, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As oxide, for example, zinc oxide (ZnO), yttrium oxide ($Y_2O_3$), or the like can be used. As nitride, for example, aluminum nitride (AlN), gallium nitride (GaN), indium nitride (InN), or the like can be used. Further, zinc selenide (ZnSe), zinc telluride (ZnTe), or the like can also be used, and a ternary mixed crystal such as calcium sulfide-gallium ($CaGa_2S_4$), strontium sulfide-gallium ($SrGa_2S_4$), or barium sulfide-gallium ($BaGa_2S_4$) may also be used.

As a light-emission center of localized type light emission, manganese (Mn), copper (Cu), samarium (Sm), terbium (Tb), erbium (Er), thulium (Tm), europium (Eu), cerium (Ce), praseodymium (Pr), or the like can be used. Note that a halogen element such as fluorine (F) or chlorine (Cl) may be added as charge compensation.

On the other hand, as a light-emission center of donor-acceptor recombination type light emission, a light-emitting material containing a first impurity element which forms a donor level and a second impurity element which forms an acceptor level can be used. As the first impurity element, for example, fluorine (F), chlorine (Cl), aluminum (Al), or the like can be used. As the second impurity element, for example, copper (Cu), silver (Ag), or the like can be used.

In the case of synthesizing the light-emitting material of donor-acceptor recombination type light emission by a solid phase method, a host material, the first impurity element or a compound containing the first impurity element, and the second impurity element or a compound containing the second impurity element are each measured, mixed in a mortar, heated in an electric furnace, and baked. As the host material, any of the above described host materials can be used. As the first impurity element or the compound containing the first impurity element, for example, fluorine (F), chlorine (Cl), aluminum sulfate ($Al_2S_3$), or the like can be used. As the second impurity element or the compound containing the second impurity element, for example, copper (Cu), silver (Ag), copper sulfide ($Cu_2S$), silver sulfide ($Ag_2S$), or the like can be used. The baking temperature is preferably 700° C. to 1500° C. This is because the solid reaction does not progress when the temperature is too low, whereas the host material is decomposed when the temperature is too high. Note that although the baking may be performed in a powder state, it is preferable to perform the baking in a pellet state.

As the impurity element in the case of utilizing solid reaction, the compound containing the first impurity element and the second impurity element may be combined. In this case, since the impurity element is easily diffused and solid reaction progresses easily, a uniform light-emitting material can be obtained. Further, since an unnecessary impurity element does not enter, a light-emitting material having high purity can be obtained. As the compound containing the first impurity element and the second impurity element, for example, copper chloride (CuCl), silver chloride (AgCl), or the like can be used.

Note that the concentration of these impurity elements may be 0.01 to 10 atom % with respect to the host material, and is preferably 0.05 to 5 atom %.

In the case of a thin-film type inorganic EL element, a light-emitting layer is a layer containing the above light-emitting material, which can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as an organic metal CVD method or a hydride transport low-pressure CVD method, an atomic layer epitaxy method (ALE), or the like.

Figure 46A:
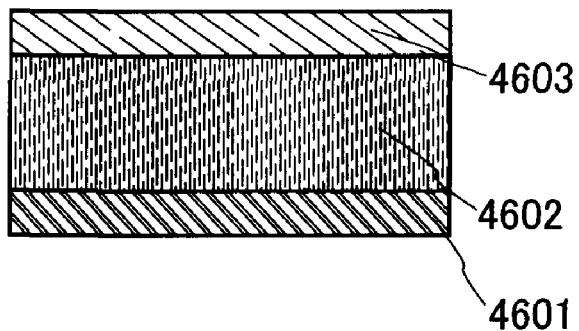
FIGS. 46A to 46C are diagrams each showing a light-emitting element shown in Embodiment Mode 8.
Figure 46B:
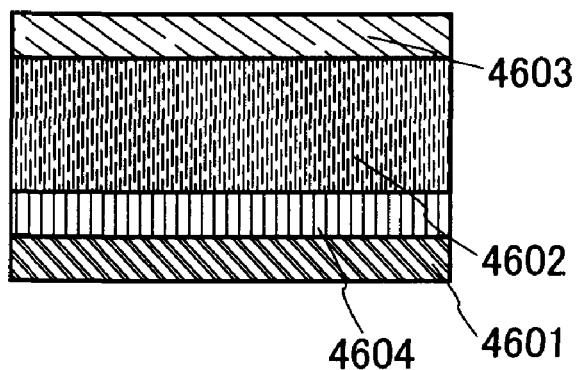
Figure 46C:
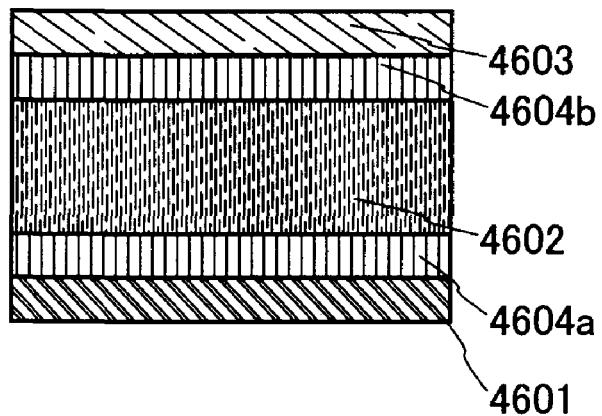

FIGS. 46A to 46C each show an example of a thin-film type inorganic EL element that can be used as a light-emitting element. In FIGS. 46A to 46C, each light-emitting element includes a first electrode 4601, a light-emitting layer 4602, and a second electrode 4603.

The light-emitting elements shown in FIGS. 46B and 46C each have a structure where an insulating layer is provided between the electrode and the light-emitting layer of the light-emitting element of FIG. 46A. The light-emitting element shown in FIG. 46B has an insulating layer 4604 between the first electrode 4601 and the light-emitting layer 4602. The light-emitting element shown in FIG. 46C includes an insulating layer 4604a between the first electrode 4601 and the light-emitting layer 4602, and an insulating layer 4604b between the second electrode 4603 and the light-emitting layer 4602. In this manner, the insulating layer may be provided between the light-emitting layer and one electrode of a pair of electrodes that sandwiches the light-emitting layer, or may be provided between the light-emitting layer and the first electrode and between the light-emitting layer and the second electrode. Moreover, the insulating layer may be a single layer or a stacked layer including a plurality of layers.

In addition, although the insulating layer 4604 is provided so as to be in contact with the first electrode 4601 in FIG. 46B, the insulating layer 4604 may be provided so as to be in contact with the second electrode 4603 by reversing the order of the insulating layer and the light-emitting layer.

In the case of a dispersion type inorganic EL element, a light-emitting layer film where particles of a light-emitting material are dispersed in a binder is formed. When particles with desired grain sizes cannot be obtained by a manufacturing method of a light-emitting material, processing into a particle state may be performed by being crushed with a mortar or the like. The binder refers to a substance for fixing a light-emitting material in a particle state in a dispersed state to keep a shape as a light-emitting layer. The light-emitting material is uniformly dispersed and fixed in the light-emitting layer by the binder.

In the case of a dispersion type inorganic EL element, as a forming method of a light-emitting layer, a droplet-discharging method which can selectively form a light-emitting layer, a printing method (e.g., screen printing or offset printing), a coating method such as a spin coating method, a dipping method, a dispenser method, or the like can be used. There are no particular limitations on the film thickness of the light-emitting layer; however, a film thickness of 10 nm to 1000 nm is preferable. In addition, in the light-emitting layer containing a light-emitting material and a binder, a ratio of the light-emitting material is preferably set to be equal to or more than 50 wt % and equal to or less than 80 wt %.

Figure 47A:
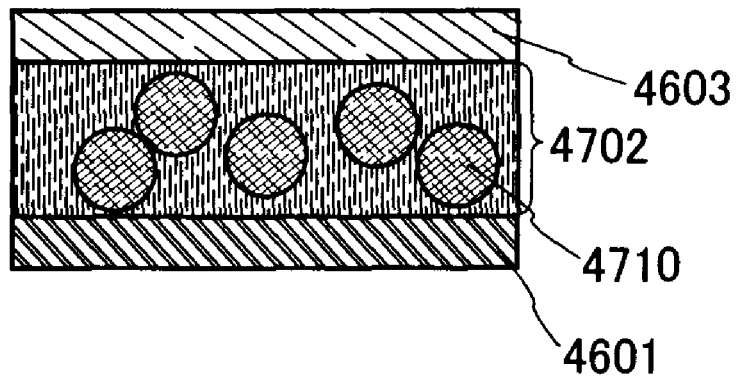
FIGS. 47A to 47C are diagrams each showing a light-emitting element shown in Embodiment Mode 8.
Figure 47B:
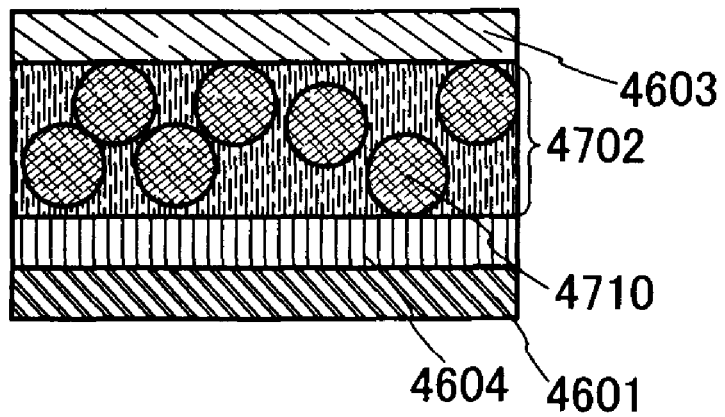
Figure 47C:
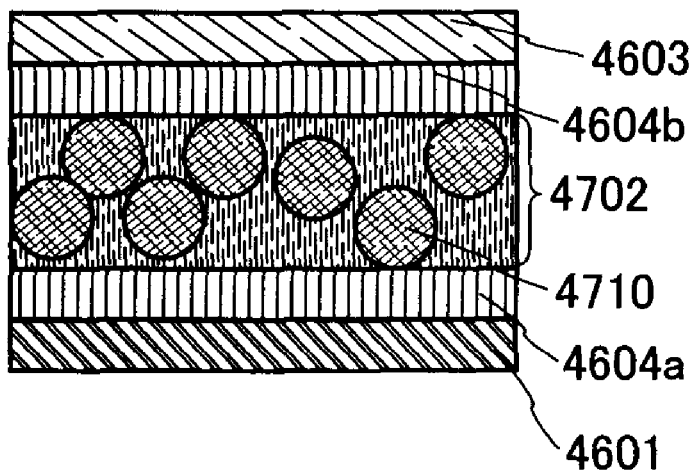

FIGS. 47A to 47C each show an example of a dispersion type inorganic EL element that can be used as a light-emitting element. In FIG. 47A, the light-emitting element has a stacked-layer structure of the first electrode 4601, a light-emitting layer 4702, and the second electrode 4603, where a light-emitting material 4710 held by a binder is contained in the light-emitting layer 4702.

As the binder that can be used in this embodiment mode, an organic material having insulating properties or an inorganic material can be used, or a mixed material of an organic material and an inorganic material may also be used. As the organic material, a resin such as a polymer, polyethylene, polypropylene, a polystyrene-based resin, a silicone resin, an epoxy resin, or vinylidene fluoride having a comparatively high dielectric constant like a cyanoethyl cellulose-based resin can be used. In addition, a heat-resistant high molecule such as aromatic polyamide or polybenzimidazole, or a siloxane resin may be used. A siloxane resin corresponds to a resin containing a Si—O—Si bond. Siloxane is composed of a skeleton structure formed by the bond of silicon (Si) and oxygen (O). As a substituent thereof, an organic group containing at least hydrogen (e.g., an alkyl group or aryl group) is used. In addition, a fluoro group may be used as the substituent. Further, an organic group containing at least hydrogen and a fluoro group may be used as the substituent. Moreover, a vinyl resin such as polyvinyl alcohol or polyvinyl butyral, or a resin material such as a phenol resin, a novolac resin, an acrylic resin, a melamine resin, a urethane resin, an oxazole resin (polybenzoxazole) may also be used as the organic material as well as the above-described materials. A dielectric constant can also be controlled by mixing these resins with microparticles having a high dielectric constant such as barium titanate ($BaTiO_3$) or strontium titanate ($SrTiO_3$) as appropriate.

As the inorganic material contained in the binder, a material selected from silicon oxide ($SiO_x$), silicon nitride ($SiN_x$), silicon containing oxygen and nitrogen, aluminum nitride (AlN), aluminum containing oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), zinc sulfide (ZnS) and other substances containing an inorganic material can be used. By mixing the organic material with an inorganic material having a high dielectric constant (by adding or the like), a dielectric constant of a light-emitting layer including a light-emitting material and a binder can be further increased.

In a manufacturing process, the light-emitting material is dispersed in a solution containing a binder. As a solvent of the solution containing a binder that can be used in this embodiment mode, it is preferable to select such a solvent that dissolves a binder material and that can make a solution with the viscosity of which is appropriate for a method for forming the light-emitting layer (various wet processes) and a desired film thickness. An organic solvent or the like can be used and, for example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used.

The light-emitting elements shown in FIGS. 47B and 47C each have a structure where an insulating layer is provided between the electrode and the light-emitting layer of the light-emitting element of FIG. 47A. The light-emitting element shown in FIG. 47B has the insulating layer 4604 between the first electrode 4601 and the light-emitting layer 4702. The light-emitting element shown in FIG. 47C has the insulating layer 4604a between the first electrode 4601 and the light-emitting layer 4702, and the insulating layer 4604b between the second electrode 4603 and the light-emitting layer 4702. In this manner, the insulating layer may be provided between the light-emitting layer and one electrode of a pair of electrodes that sandwiches the light-emitting layer, or may be provided between the light-emitting layer and the first electrode 4601 and between the light-emitting layer and the second electrode 4603. Moreover, the insulating layer may be a single layer or a stacked layer including a plurality of layers.

In addition, although the insulating layer 4604 is provided so as to be in contact with the first electrode 4601 in FIG. 47B, the insulating layer 4604 may be provided so as to be in contact with the second electrode 4603 by reversing the order of the insulating layer and the light-emitting layer.

Although the insulating layers 4604, 4604a and 4604b in FIGS. 46B, 46C, 47B, and 47C are not particularly limited, such insulating layers preferably have high dielectric strength and dense film qualities, and more preferably have high dielectric constants. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two kinds or more thereof can be used. These insulating films can be formed by sputtering, evaporation, CVD, or the like. In addition, the insulating layers may be formed by dispersing particles of these insulating materials in the binder. The binder material may be formed with the same material and by the same method as the binder contained in the light-emitting layer. A film thickness of such an insulating layer is not particularly limited, and a film thickness of 10 nm to 1000 nm is preferable.

For the first electrode 4601 and the second electrode 4603, a metal, an alloy, a conductive compound, a mixture thereof, or the like can be used. For example, each material can be selected as appropriate from the materials used for the pixel electrode 1801 and the opposite electrode 1802 described in Embodiment Mode 7.

Note that the light-emitting element described in this embodiment mode can emits light when a voltage is applied between the pair of electrodes which sandwiches the light-emitting layer, namely to the first electrode 4601 and the second electrode 4603.

An inorganic EL element thus obtained can be used as the light-emitting element in Embodiment Mode 7, and can be combined freely with the other embodiment modes.

Embodiment Mode 9

In this embodiment mode, one mode of a display device of the invention is described with reference to FIGS. 25A and 25B.

FIG. 25A is a top plan view showing a display device, and FIG. 25B is an A-A' line cross sectional view (cross sectional view taken along a line A-A') of FIG. 25A. The display device includes a signal line driver circuit 2501, a pixel portion 2502, a first scan line driver circuit 2503, and a second scan line driver circuit 2506 over a substrate 2510 which are indicated by dotted lines in the drawing. The display device also includes a sealing substrate 2504 and a sealant 2505, and an inside portion of the display device surrounded by them is a space 2507.

Note that a wiring 2508 is a wiring for transmitting signals to be inputted to the first scan line driver circuit 2503, the second scan line driver circuit 2506, and the signal line driver circuit 2501 and receives a video signal, a clock signal, a start signal, and the like through an FPC (Flexible Printed Circuit) 2509 that serves as an external input terminal. IC chips (semiconductor chips provided with a memory circuit, a buffer circuit, and the like) 2518 and 2519 are mounted on a connection portion of the FPC 2509 and the display device by COG (Chip On Glass) or the like. Note that although only the FPC is shown here, a printed wiring board (PWB) may also be attached to the FPC. The display device of the invention includes not only a main body of a display device but also a display device with an FPC or a PWB attached thereto. In addition, it also includes a display device on which an IC chip or the like is mounted.

A cross-sectional structure is described with reference to FIG. 25B. Although the pixel portion 2502 and its peripheral driver circuits (the first scan line driver circuit 2503, the second scan line driver circuit 2506, and the signal line driver circuit 2501) are formed over the substrate 2510, only the signal line driver circuit 2501 and the pixel portion 2502 are shown here.

Note that the signal line driver circuit 2501 includes transistors with the same conductivity type such as N-channel transistors 2520 and 2521. It is needless to say that only P-channel transistors may be used or a CMOS circuit may be formed using both an N-channel transistor and a P-channel transistor. Although this embodiment mode describes a display panel in which the peripheral driver circuits are formed over the same substrate as the pixel portion, the invention is not limited to this. All or part of the peripheral driver circuits may be formed on an IC chip or the like and mounted by COG or the like.

The pixel described in any of Embodiment Modes 1 to 6 is used for the pixel portion 2502. Note that a transistor 2511 which functions as a switch, a transistor 2512 which controls a current value supplied to a light-emitting element, and a light-emitting element 2528 are shown in FIG. 25B. Note that a first electrode of the transistor 2512 is connected to a pixel electrode 2513 of the light-emitting element 2528. In addition, an insulator 2514 is formed so as to cover an end portion of the pixel electrode 2513. Here, the insulator 2514 is formed using a positive photosensitive acrylic resin film.

The insulator 2514 is formed to have a curved surface with a curvature at an upper end portion or a lower end portion thereof in order to obtain excellent coverage. For example, in the case of using positive photosensitive acrylic as a material of the insulator 2514, the insulator 2514 is preferably formed to have a curved surface with a curvature radius (0.2 μm to 3 μm) only at the upper end portion. Either a negative resist which becomes insoluble in an etchant by light irradiation or a positive resist which becomes soluble in an etchant by light irradiation can be used as the insulator 2514.

A layer 2516 containing a light-emitting substance and an opposite electrode 2517 are formed over the pixel electrode 2513. As for the layer 2516 containing a light-emitting substance, as long as at least a light-emitting layer is provided, there is no particular limitation on layers other than the light-emitting layer and they can be selected as appropriate.

By attaching the sealing substrate 2504 to the substrate 2510 using the sealant 2505, a structure is obtained in which the light-emitting element 2528 is provided in the space 2507 surrounded by the substrate 2510, the sealing substrate 2504, and the sealant 2505. Note that there is also a case where the space 2507 is filled with the sealant 2505 other than an inert gas (e.g., nitrogen or argon).

Note that an epoxy-based resin is preferably used as the sealant 2505. The material preferably allows as little moisture and oxygen as possible to penetrate. As the sealing substrate 2504, a plastic substrate formed of FRP (Fiberglass-Reinforced Plastics), PVF (polyvinyl fluoride), Mylar, polyester, acrylic, or the like can be used as well as a glass substrate or a quartz substrate.

Variations in luminance among pixels or fluctuation in luminance of a pixel over time can be suppressed by using and operating any of the pixels described in Embodiment Modes 1 to 6 in the pixel portion 2502, and thus a high quality display device with a higher duty ratio can be obtained. In addition, power consumption can be reduced in the invention because operation is performed with the potential of the opposite electrode fixed.

By forming the signal line driver circuit 2501, the pixel portion 2502, the first scan line driver circuit 2503, and the second scan line driver circuit 2506 over the same substrate as shown in FIGS. 25A and 25B, cost of the display device can be reduced. In this case, a manufacturing process can be simplified by using transistors with the same conductivity type for the signal line driver circuit 2501, the pixel portion 2502, the first scan line driver circuit 2503, and the second scan line driver circuit 2506; accordingly, further cost reduction can be achieved.

In this manner, the display device of the invention can be obtained. Note that the above-described structure is one example and a structure of the display device of the invention is not limited to this.

Figure 26A:
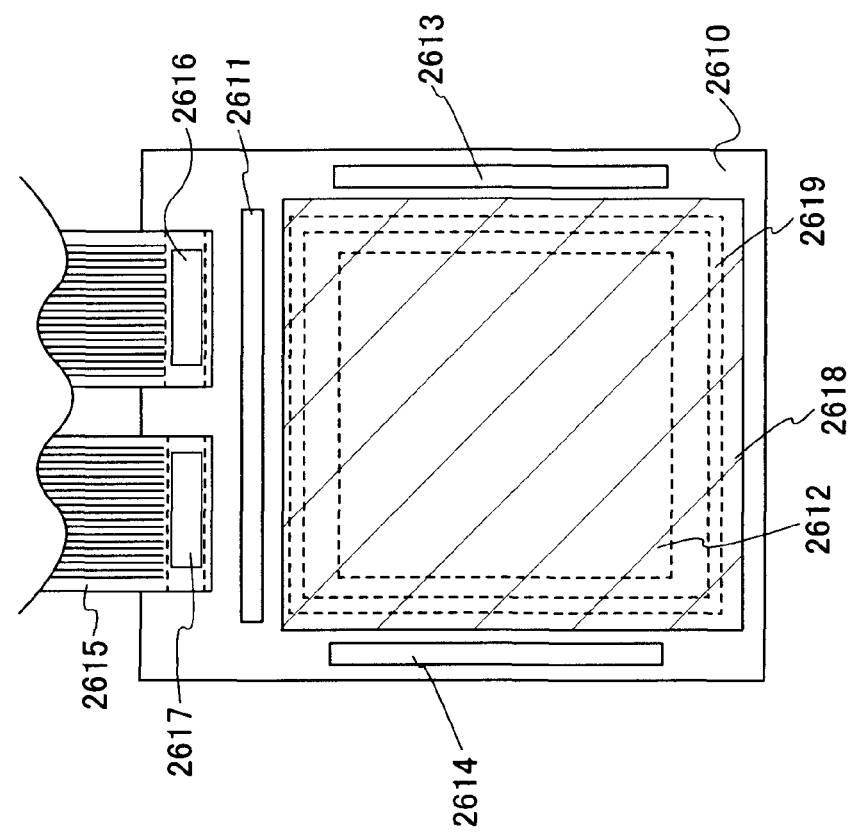
FIGS. 26A and 26B are diagrams each showing a display device shown in Embodiment Mode 9.

Note that as the structure of the display device, there may be a structure in which a signal line driver circuit 2601 is formed on an IC chip and the IC chip is mounted on a display device by COG or the like as shown in FIG. 26A. Note that a substrate 2600, a pixel portion 2602, a first scan line driver circuit 2603, a second scan line driver circuit 2604, an FPC 2605, an IC chip 2606, an IC chip 2607, a sealing substrate 2608, and a sealant 2609 of FIG. 26A correspond to the substrate 2510, the pixel portion 2502, the first scan line driver circuit 2503, the second scan line driver circuit 2506, the FPC 2509, the IC chip 2518, the IC chip 2519, the sealing substrate 2504, and the sealant 2505 in FIG. 25A, respectively.

That is, only a signal line driver circuit of which high speed operation is required is formed on an IC chip by using a CMOS or the like to reduce power consumption. In addition, higher-speed operation and lower power consumption can be achieved by using a semiconductor chip made of a silicon wafer or the like as the IC chip.

Note that cost reduction can be achieved by forming the first scan line driver circuit 2603 and the second scan line driver circuit 2604 over the same substrate as the pixel portion 2602. A further cost reduction can be achieved by forming the first scan line driver circuit 2603, the second scan line driver circuit 2604, and the pixel portion 2602 using transistors with the same conductivity type. At this time, decrease in output potential can be prevented by using boot trap circuits for the first scan line driver circuit 2603 and the second scan line driver circuit 2604. In addition, in the case of using amorphous silicon for semiconductor layers of transistors included in the first scan line driver circuit 2603 and the second scan line driver circuit 2604, since the threshold voltage of each transistor fluctuates due to deterioration, it is preferable to provide a function to correct the fluctuation.

Variations in luminance among pixels or fluctuation in luminance of a pixel over time can be suppressed by using and operating any of the pixels described in Embodiment Modes 1 to 6 in the pixel portion 2602, and thus a high quality display device with a higher duty ratio can be obtained. In addition, power consumption can be reduced in the invention because operation is performed with the potential of the opposite electrode fixed. In addition, a substrate area can be used efficiently by mounting an IC chip provided with a functional circuit (a memory or a buffer) on a connection portion of the FPC 2605 and the substrate 2600.

Figure 26B:
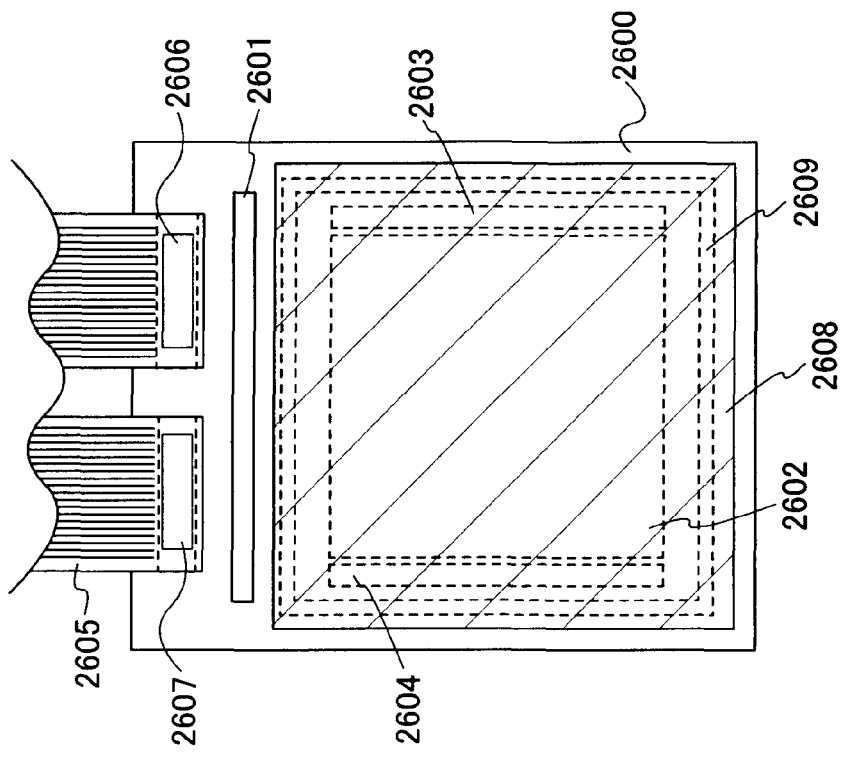

Further, a structure may also be employed in which a signal line driver circuit 2611, a first scan line driver circuit 2613, and a second scan line driver circuit 2614 corresponding to the signal line driver circuit 2501, the first scan line driver circuit 2503, and the second scan line driver circuit 2506 of FIG. 25A are formed on IC chips and the IC chips are mounted on a display device by COG or the like as shown in FIG. 26B. Note that a substrate 2610, a pixel portion 2612, an FPC 2615, an IC chip 2616, an IC chip 2617, a sealing substrate 2618, and a sealant 2619 of FIG. 26B correspond to the substrate 2510, the pixel portion 2502, the FPC 2509, the IC chip 2518, the IC chip 2519, the sealing substrate 2504, and the sealant 2505 of FIG. 25A, respectively.

Further, cost reduction can be achieved by using a non-crystalline semiconductor film, e.g., an amorphous silicon (a-Si:H) film for a semiconductor layer of a transistor of the pixel portion 2612. Further, a large-sized display panel can also be manufactured.

Figure 27A:
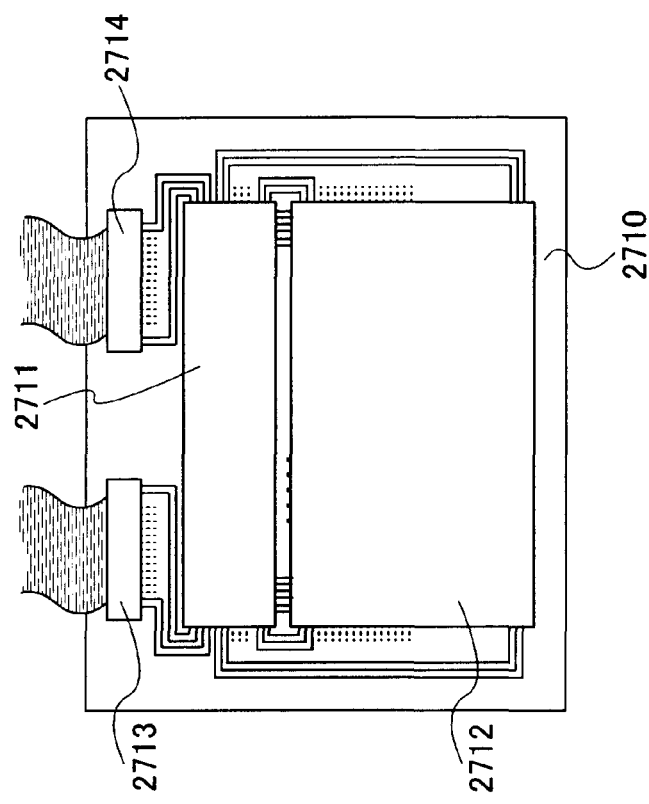
FIGS. 27A and 27B are diagrams each showing a display device shown in Embodiment Mode 9.

Further, the first scan line driver circuit, the second scan line driver circuit, and the signal line driver circuit are not necessarily provided in a row direction and a column direction of pixels. For example, as shown in FIG. 27A, a peripheral driver circuit 2701 formed on an IC chip may have functions of the first scan line driver circuit 2613, the second scan line driver circuit 2614, and the signal line driver circuit 2611 shown in FIG. 26B. Note that a substrate 2700, a pixel portion 2702, an FPC 2704, an IC chip 2705, an IC chip 2706, a sealing substrate 2707, and a sealant 2708 of FIG. 27A correspond to the substrate 2510, the pixel portion 2502, the FPC 2509, the IC chip 2518, the IC chip 2519, the sealing substrate 2504, and the sealant 2505 of FIG. 25A, respectively.

Figure 27B:
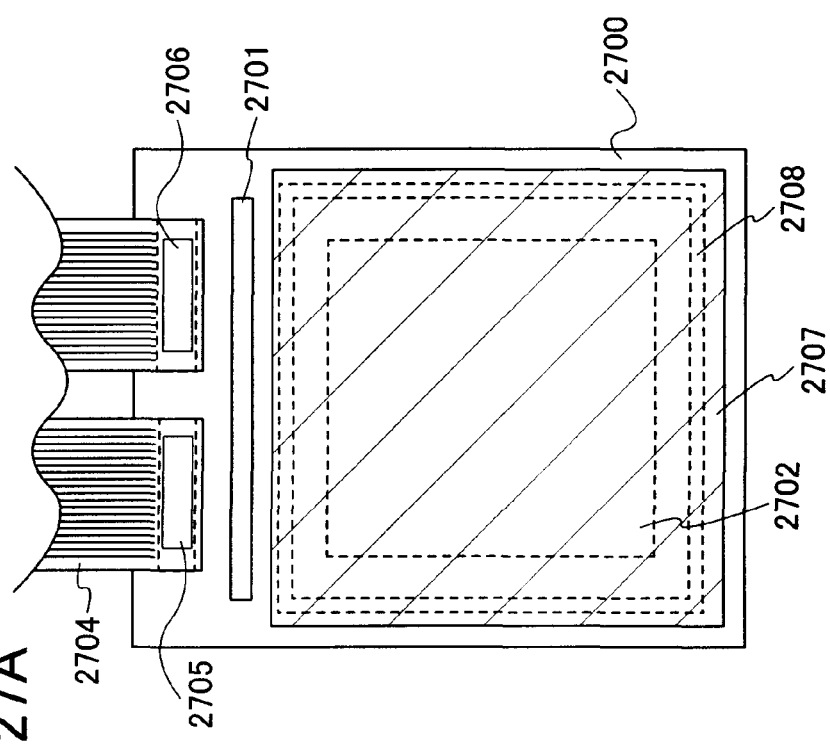

Note that a schematic diagram illustrating the connection of wirings of the display device of FIG. 27A is shown in FIG. 27B. A substrate 2710, a peripheral driver circuit 2711, a pixel portion 2712, an FPC 2713, and an FPC 2714 are shown in FIG. 27B.

The FPC 2713 and the FPC 2714 input signals and power supply potentials from outside to the peripheral driver circuit 2711. Then, an output from the peripheral driver circuit 2711 is inputted to wirings in row and column directions connected to pixels included in the pixel portion 2712.

Figure 28:
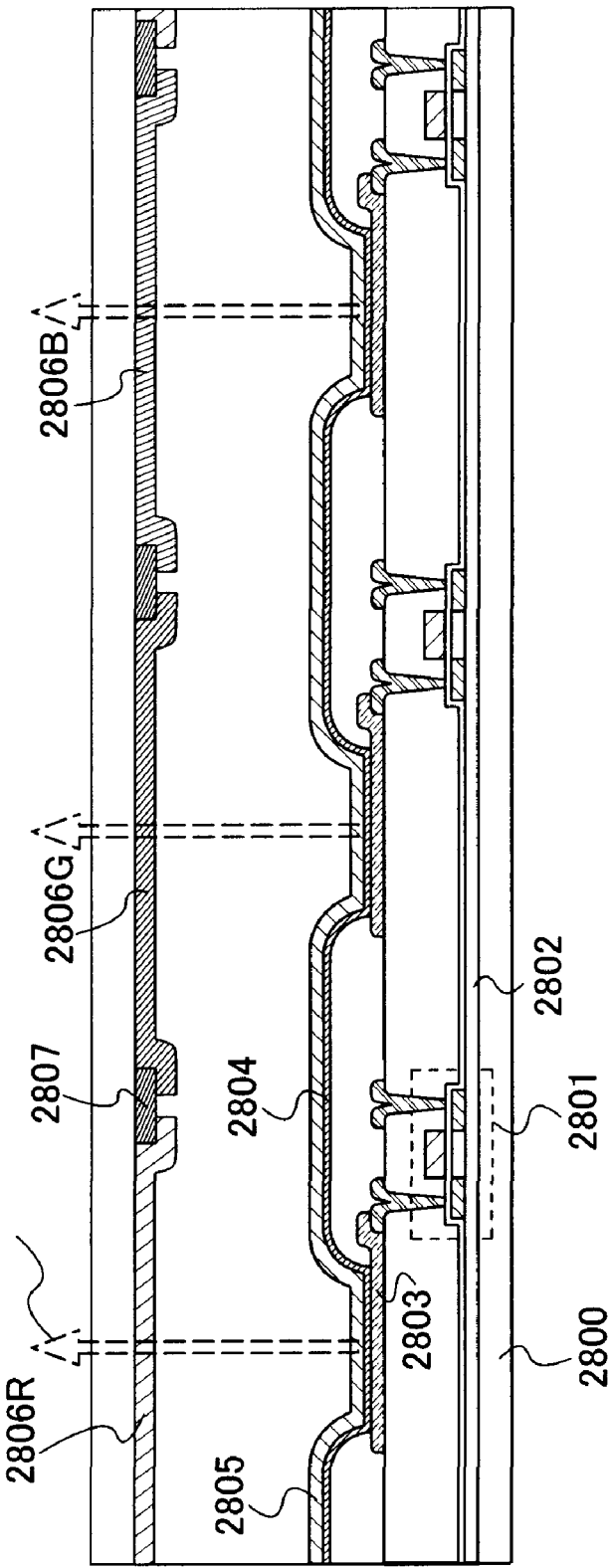
FIG. 28 is a partial sectional view showing a pixel shown in Embodiment Mode 9.

Further, in the case of using a white light-emitting element as the light-emitting element, full color display can be realized by providing the sealing substrate with color filters. The invention can also be applied to such a display device. FIG. 28 shows one example of a partial sectional view of a pixel portion.

As shown in FIG. 28, a base film 2802 is formed over a substrate 2800; a transistor 2801 which controls a current value supplied to a light-emitting element is formed thereover; and a pixel electrode 2803 is formed in contact with a first electrode of the transistor 2801. A layer 2804 containing a light-emitting substance and an opposite electrode 2805 are formed thereover.

Note that a portion where the layer 2804 containing a light-emitting substance is sandwiched between the pixel electrode 2803 and the opposite electrode 2805 serves as the light-emitting element. Note that white light is emitted in FIG. 28. A red color filter 2806R, a green color filter 2806G, and a blue color filter 2806B are provided above the light-emitting elements to achieve full-color display. In addition, a black matrix (also referred to as a BM) 2807 is provided to separate these color filters.

The display device of this embodiment mode can be combined with the structure described in Embodiment Mode 7 or 8 as appropriate as well as those in Embodiment Modes 1 to 6. In addition, the structure of the display device is not limited to that described above, and the invention can also be applied to a display device having another structure.

Embodiment Mode 10

The display device of the invention can be applied to various electronic devices. Specifically, it can be applied to a display portion of an electronic device. Note that examples of the electronic devices are as follows: a camera such as a video camera or a digital camera, a goggle type display, a navigation system, an audio-reproducing device (e.g., car audio or an audio component), a computer, a game machine, a portable information terminal (e.g., a mobile computer, a mobile phone, a mobile game machine, or an electronic book), an image-reproducing device having a recording medium (specifically, a device for reproducing a content of a recording medium such as a digital versatile disc (DVD) and having a display for displaying a reproduced image), and the like.

Figure 33A:
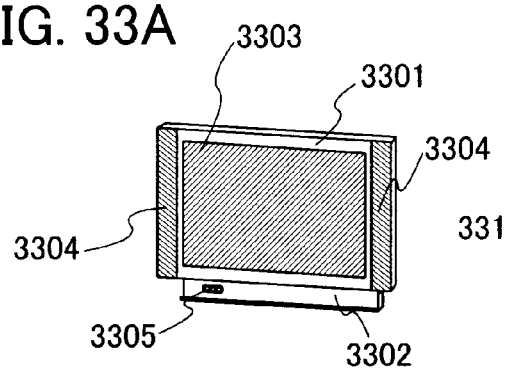
FIGS. 33A to 33H are diagrams showing electronic devices to which the invention can be applied.

FIG. 33A shows a display which includes a housing 3301, a support 3302, a display portion 3303, a speaker portion 3304, a video input terminal 3305, and the like.

Note that the pixel described in any of Embodiment Modes 1 to 6 is used for the display portion 3303. By employing the invention, variations in luminance among pixels or fluctuation in luminance of a pixel over time can be suppressed and a display including a high quality display portion with a higher duty ratio can be obtained. Further, power consumption can be reduced in the invention because operation is performed with the potential of an opposite electrode fixed. Note that the display includes in its category all display devices used for displaying information, e.g., for a personal computer, for TV broadcast reception, or for advertisement display.

Note that while needs for increase in display size have been increasing, an increase in price associated with the increase in display size has become an issue. Therefore, it is an issue to reduce manufacturing cost as much as possible and set the price of a high-quality product as low as possible.

Since the pixel of the invention can be manufactured using transistors with the same conductivity type, the number of steps can be reduced and manufacturing cost can be reduced. Moreover, a process can be simplified and further cost reduction can be achieved by using a non-crystalline semiconductor film, e.g., an amorphous silicon (a-Si:H) film for a semiconductor layer of each transistor included in the pixel. In this case, a driver circuit at the periphery of a pixel portion is preferably formed on an IC chip and the IC chip is mounted on a display panel by COG (Chip On Glass) or the like. Note that a signal line driver circuit with high operation speed may be formed on an IC chip, and a scan line driver circuit with relatively low operation speed may be formed using a circuit including transistors with the same conductivity type over the same substrate as the pixel portion.

Figure 33B:
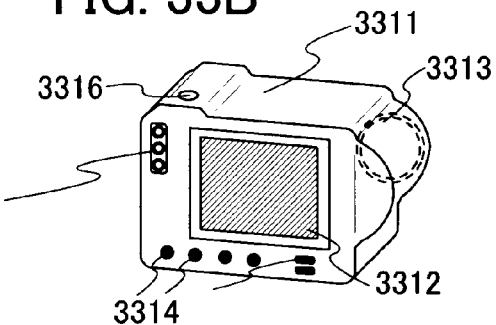

FIG. 33B shows a camera which includes a main body 3311, a display portion 3312, an image receiving portion 3313, operation keys 3314, an external connection port 3315, a shutter 3316, and the like.

Note that the pixel described in any of Embodiment Modes 1 to 6 is used for the display portion 3312. By employing the invention, variations in luminance among pixels or fluctuation in luminance of a pixel over time can be suppressed, and a camera including a high quality display portion with a higher duty ratio can be obtained. Further, power consumption can be reduced in the invention because operation is performed with the potential of the opposite electrode fixed.

In addition, competitive manufacturing of a digital camera or the like has been intensified along with improvement in performance. Therefore, it is important to set the price of a high-performance product as low as possible.

Since the pixel of the invention can be manufactured using transistors with the same conductivity type, the number of steps can be reduced and manufacturing cost can be reduced. Further, a process can be simplified and further cost reduction can be achieved by using a non-crystalline semiconductor film, e.g., an amorphous silicon (a-Si:H) film for a semiconductor layer of each transistor included in the pixel. In this case, a driver circuit at the periphery of a pixel portion is preferably formed on an IC chip and the IC chip is mounted on a display panel by COG or the like. Note that a signal line driver circuit with high operation speed may be formed on an IC chip, and a scan line driver circuit with relatively low operation speed may be formed using a circuit including transistors with the same conductivity type over the same substrate as the pixel portion.

Figure 33C:
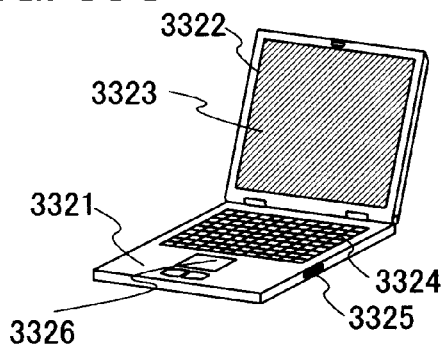

FIG. 33C shows a computer which includes a main body 3321, a chassis 3322, a display portion 3323, a keyboard 3324, an external connection port 3325, a pointing device 3326, and the like. Note that the pixel described in any of Embodiment Modes 1 to 6 is used for the display portion 3323. By employing the invention, variations in luminance among pixels or fluctuation in luminance of a pixel over time can be suppressed and a computer including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

Figure 33D:
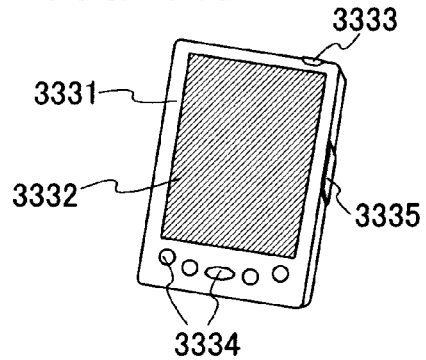

FIG. 33D shows a mobile computer which includes a main body 3331, a display portion 3332, a switch 3333, operation keys 3334, an infrared port 3335, and the like. Note that the pixel described in any of Embodiment Modes 1 to 6 is used for the display portion 3332. By employing the invention, variations in luminance among pixels or fluctuation in luminance of a pixel over time can be suppressed and a mobile computer including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

Figure 33E:
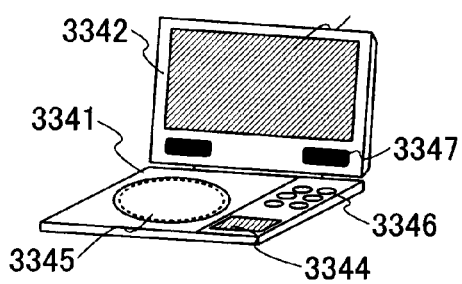

FIG. 33E shows a portable image reproducing device provided with a recording medium (specifically, a DVD player) which includes a main body 3341, a chassis 3342, a display portion A 3343, a display portion B 3344, a recording medium (e.g., DVD) reading portion 3345, operation keys 3346, a speaker portion 3347, and the like. The display portion A 3343 mainly displays image information, and the display portion B 3344 mainly displays character information. Note that the pixel described in any of Embodiment Modes 1 to 6 is used for the display portion A 3343 and the display portion B 3344. By employing the invention, variations in luminance among pixels or fluctuation in luminance of a pixel over time can be suppressed and an image reproducing device including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

Figure 33F:
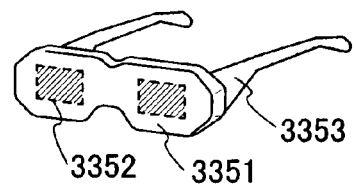

FIG. 33F shows a goggle type display which includes a main body 3351, a display portion 3352, an arm portion 3353, and the like. Note that the pixel described in any of Embodiment Modes 1 to 6 is used for the display portion 3352. By employing the invention, variations in luminance among pixels or fluctuation in luminance of a pixel over time can be suppressed and a goggle type display including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

Figure 33G:
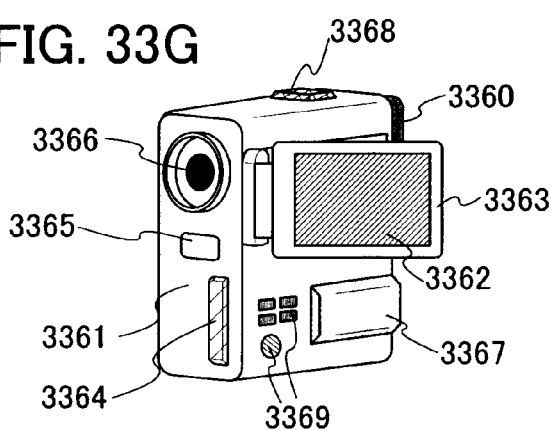

FIG. 33G shows a video camera which includes a main body 3361, a display portion 3362, a chassis 3363, an external connection port 3364, a remote control receiving portion 3365, an image receiving portion 3366, a battery 3367, an audio input portion 3368, operation keys 3369, an eye piece portion 3360, and the like. Note that the pixel described in any of Embodiment Modes 1 to 6 is used for the display portion 3362. By employing the invention, variations in luminance among pixels or fluctuation in luminance of a pixel over time can be suppressed and a video camera including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

Figure 33H:
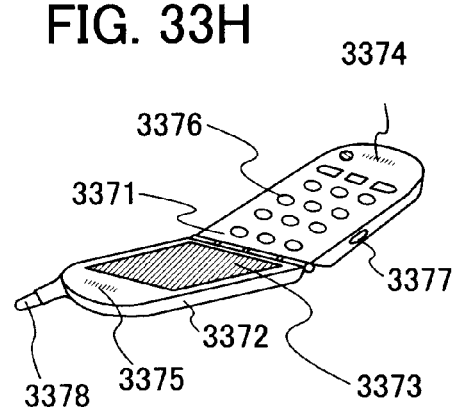

FIG. 33H shows a mobile phone which includes a main body 3371, a chassis 3372, a display portion 3373, an audio input portion 3374, an audio output portion 3375, operation keys 3376, an external connection port 3377, an antenna 3378, and the like. Note that the pixel described in any of Embodiment Modes 1 to 6 is used for the display portion 3373. By employing the invention, variations in luminance among pixels or fluctuation in luminance of a pixel over time can be suppressed and a mobile phone including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

As described above, the invention can be applied to any electronic device.

Embodiment Mode 11

Figure 34:
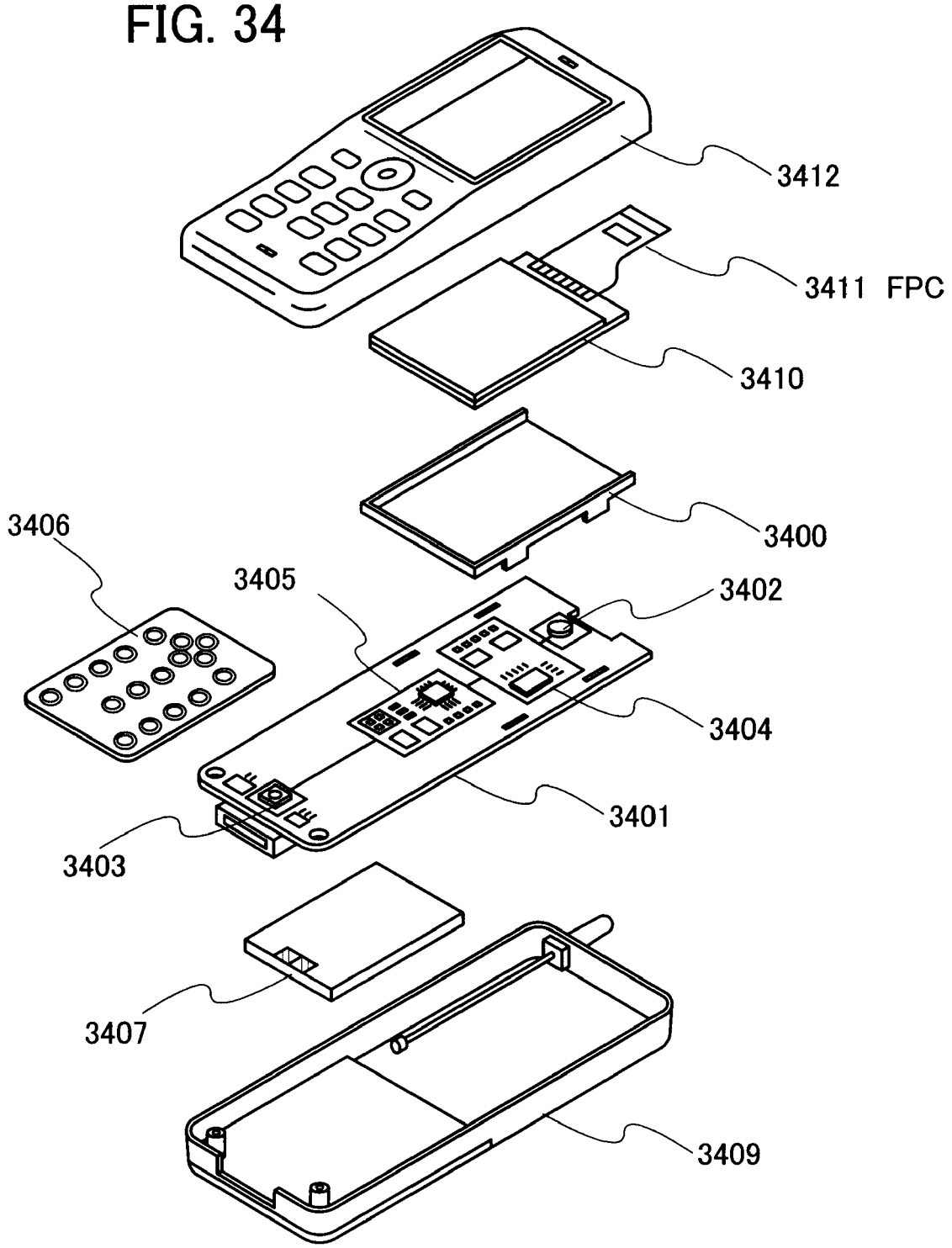
FIG. 34 is a view showing a structural example of a mobile phone.

In this embodiment mode, a structure example of a mobile phone including the display device of the invention in a display portion is described with reference to FIG. 34.

A display panel 3410 is incorporated in a housing 3400 so as to be detachable. The shape and size of the housing 3400 can be changed as appropriate in accordance with the size of the display panel 3410. The housing 3400 to which the display panel 3410 is fixed is fitted in a printed circuit board 3401 and assembled as a module.

The display panel 3410 is connected to the printed circuit board 3401 through an FPC 3411. The printed circuit board 3401 is provided with a speaker 3402, a microphone 3403, a transmitting/receiving circuit 3404, and a signal processing circuit 3405 including a CPU, a controller, and the like. Such a module, an input unit 3406, and a buttery 3407 are combined and stored in a chassis 3409 and a chassis 3412. Note that a pixel portion of the display panel 3410 is arranged so as to be seen from a window formed in the chassis 3412.

In the display panel 3410, the pixel portion and a part of peripheral driver circuits (a driver circuit having a low operation frequency among a plurality of driver circuits) may be formed using transistors over a substrate, and another part of the peripheral driver circuits (a driver circuit having a high operation frequency among the plurality of driver circuits) may be formed on an IC chip. The IC chip may be mounted on the display panel 3410 by COG (Chip On Glass). The IC chip may alternatively be connected to a glass substrate by using TAB (Tape Automated Bonding) or a printed circuit board. Further, all of the peripheral driver circuits may be formed on an IC chip and the IC chip may be mounted on the display panel by COG or the like.

Note that the pixel described in any of Embodiment Modes 1 to 6 is used for the pixel portion. By employing the invention, variations in luminance among pixels or fluctuation in luminance of a pixel over time can be suppressed and the display panel 3410 including a high quality display portion with a higher duty ratio can be obtained. Further, power consumption can be reduced in the invention because operation is performed with the potential of the opposite electrode fixed. Further, cost reduction can be achieved by using transistors with the same conductivity type, as transistors included in the pixel portion or using a non-crystalline semiconductor film for semiconductor layers of the transistors.

The structure of the mobile phone described in this embodiment mode is just one example, and the display device of the invention can be applied not only to the mobile phone having the above-described structure but also to mobile phones having various kinds of structures.

Embodiment Mode 12

In this embodiment mode, an EL module obtained by combining a display panel and a circuit board is described with reference to FIGS. 35 and 36.

Figure 35:
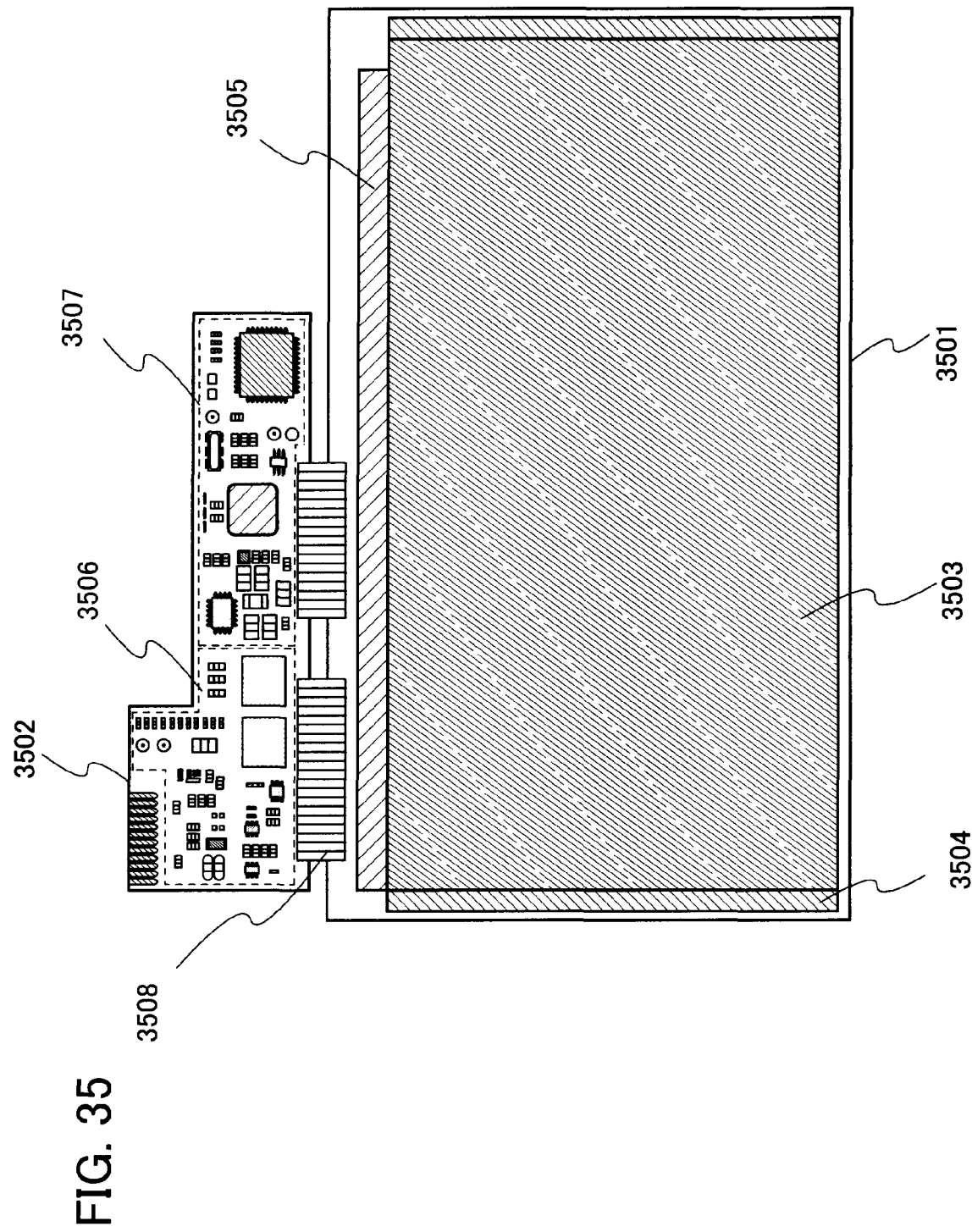
FIG. 35 is a view showing an example of an EL module.
Figure 36:
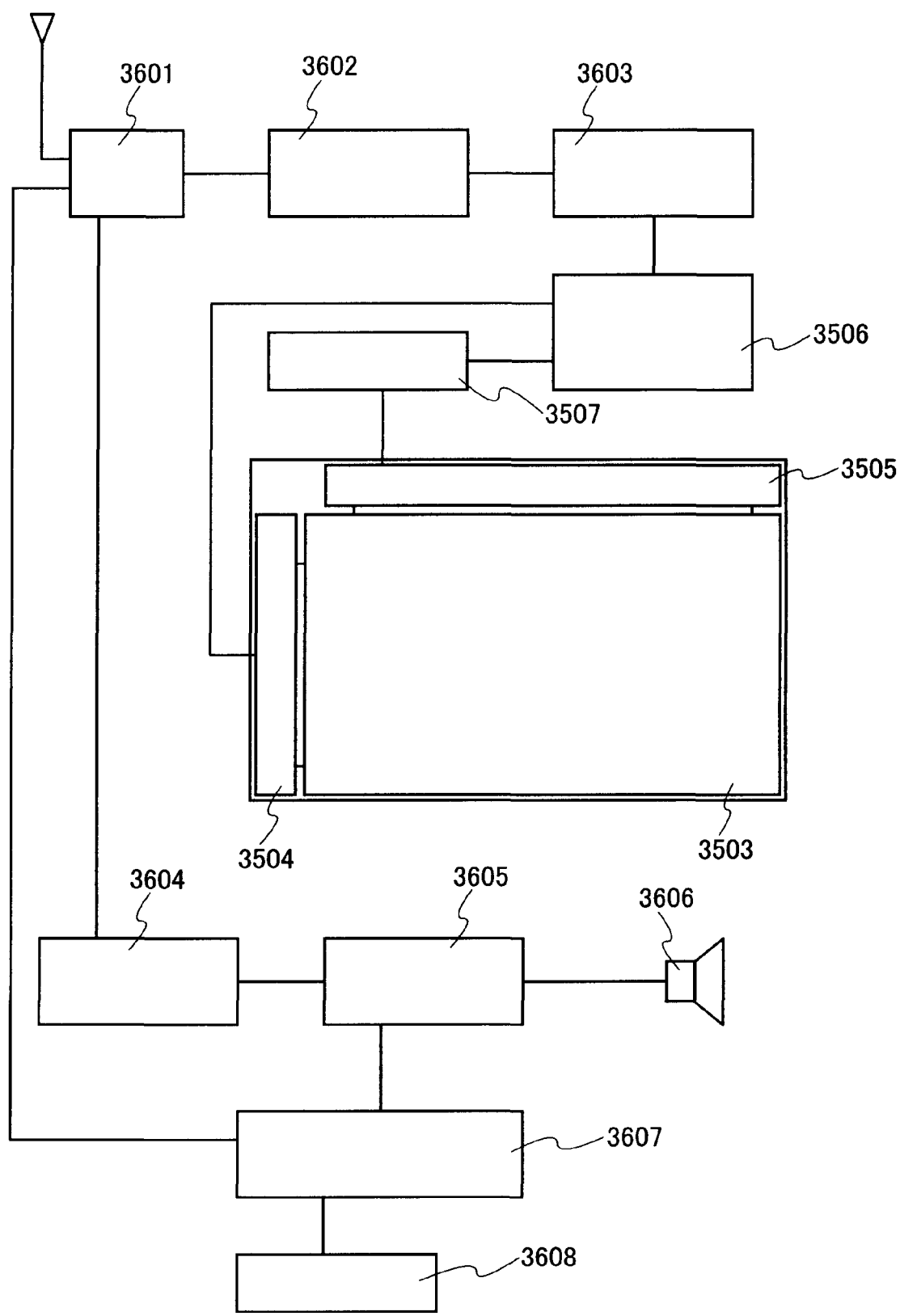
FIG. 36 is a block diagram showing a main configuration of an EL television receiver.

As shown in FIG. 35, a display panel 3501 includes a pixel portion 3503, a scan line driver circuit 3504, and a signal line driver circuit 3505. Over a circuit board 3502, for example, a control circuit 3506, a signal dividing circuit 3507, and the like are formed. Note that the display panel 3501 and the circuit board 3502 are connected to each other by a connection wiring 3508. As the connection wiring 3508, an FPC or the like can be used.

In the display panel 3501, the pixel portion and a part of peripheral driver circuits (a driver circuit having a low operation frequency among a plurality of driver circuits) may be formed using transistors over a substrate, and another part of the peripheral driver circuits (a driver circuit having a high operation frequency among the plurality of driver circuits) may be formed on an IC chip. The IC chip may be mounted on the display panel 3501 by COG (Chip On Glass). The IC chip may alternatively be connected to a glass substrate by using TAB (Tape Automated Bonding) or a printed circuit board. Further, all of the peripheral driver circuits may be formed on an IC chip and the IC chip may be mounted on the display panel by COG or the like.

Note that the pixel described in any of Embodiment Modes 1 to 6 is used for the pixel portion. By employing the invention, variations in luminance among pixels or fluctuation in luminance of a pixel over time can be suppressed and the high quality display panel 3501 with a higher duty ratio can be obtained. Further, power consumption can be reduced in the invention because operation is performed with the potential of an opposite electrode fixed. Further, cost reduction can be achieved by using transistors with the same conductivity type, as transistors included in the pixel portion or using a non-crystalline semiconductor film for semiconductor layers of the transistors.

An EL TV receiver can be completed with such an EL module. FIG. 36 is a block diagram showing a main structure of an EL TV receiver. A tuner 3601 receives a video signal and an audio signal. The video signal is processed by a video signal amplifier circuit 3602, a video signal processing circuit 3603 for converting a signal output from the video signal amplifier circuit 3602 into a color signal corresponding to each color of red, green, and blue, and a control circuit 3506 for converting the video signal into a signal which meets input specifications of a driver circuit. The control circuit 3506 outputs signals to a scan line side and a signal line side. In the case of performing a digital drive, a structure can be employed in which the signal dividing circuit 3507 is provided on the signal line side to supply an input digital signal divided into m pieces.

The audio signal among the signals received by the tuner 3601 is transmitted to an audio signal amplifier circuit 3604, and an output of the audio signal amplifier circuit 3604 is supplied to a speaker 3606 through an audio signal processing circuit 3605. A control circuit 3607 receives control information of a receiving station (reception frequency) or sound volume from an input portion 3608, and transmits signals to the tuner 3601 and the audio signal processing circuit 3605.

By incorporating the EL module in FIG. 35 into the chassis 3301 of FIG. 33A described in Embodiment Mode 10, a TV receiver can be completed.

Needless to say, the invention is not limited to the TV receiver, and can be applied to various uses particularly as a large-sized display medium such as an information display board at a train station, an airport, or the like, or an advertisement display board on the street, as well as a monitor of a personal computer.

This application is based on Japanese Patent Application Serial No. 2006-104191 filed in Japan Patent Office on 5, Apr., 2006, the entire contents of which are hereby incorporated by reference.

What is claimed is:

1. A semiconductor device comprising:
   a transistor, a storage capacitor, a first switch, a second switch, a third switch, and a fourth switch,
   wherein one of a source electrode or a drain electrode of the transistor is electrically connected to a pixel electrode,
   wherein the one of the source electrode or the drain electrode of the transistor is electrically connected to a second wiring through the third switch;
   wherein another one of the source electrode or the drain electrode of the transistor is electrically connected to a first wiring;
   wherein a gate electrode of the transistor is electrically connected to the first wiring through the fourth switch and the second switch;
   wherein the gate electrode of the transistor is electrically connected to a third wiring through the fourth switch and the first switch; and
   wherein the gate electrode of the transistor is electrically connected to the one of the source electrode or the drain electrode of the transistor through the fourth switch and the storage capacitor.

2. A semiconductor device comprising:
   a transistor, a storage capacitor, a first switch, a second switch, a third switch, and a fourth switch,
   wherein one of a source electrode or a drain electrode of the transistor is electrically connected to a pixel electrode,
   wherein the one of the source electrode or the drain electrode of the transistor is electrically connected to a second wiring through the third switch;
   wherein another one of the source electrode or the drain electrode of the transistor is electrically connected to a first wiring;
   wherein a gate electrode of the transistor is electrically connected to the first wiring through the second switch;
   wherein the gate electrode of the transistor is electrically connected to a third wiring through the fourth switch and the first switch; and
   wherein the gate electrode of the transistor is electrically connected to the one of the source electrode or the drain electrode of the transistor through the fourth switch and the storage capacitor.

3. A semiconductor device comprising:
   a transistor, a storage capacitor, a first switch, a second switch, a third switch, and a fourth switch,
   wherein one of a source electrode or a drain electrode of the transistor is electrically connected to a pixel electrode,
   wherein the one of the source electrode or the drain electrode of the transistor is electrically connected to a second wiring through the third switch;
   wherein another one of the source electrode or the drain electrode of the transistor is electrically connected to a first wiring through the fourth switch;
   wherein a gate electrode of the transistor is electrically connected to the first wiring through the second switch;
   wherein the gate electrode of the transistor is electrically connected to a third wiring through the first switch; and
   wherein the gate electrode of the transistor is electrically connected to the one of the source electrode or the drain electrode of the transistor through the storage capacitor.

4. A semiconductor device comprising:
   a transistor, a storage capacitor, a first switch, a second switch, a third switch, and a fourth switch,
   wherein one of a source electrode or a drain electrode of the transistor is electrically connected to a pixel electrode through the fourth switch,
   wherein the one of the source electrode or the drain electrode of the transistor is electrically connected to a second wiring through the fourth switch and the third switch;
   wherein another one of the source electrode or the drain electrode of the transistor is electrically connected to a first wiring;

wherein a gate electrode of the transistor is electrically connected to the first wiring through the second switch;

wherein the gate electrode of the transistor is electrically connected to a third wiring through the first switch; and wherein the gate electrode of the transistor is electrically connected to the one of the source electrode or the drain electrode of the transistor through the storage capacitor and the fourth switch.

5. The semiconductor device according to claim 1, wherein the second wiring is the same as a wiring which controls the third switch.

6. The semiconductor device according to claim 2, wherein the second wiring is the same as a wiring which controls the third switch.

7. The semiconductor device according to claim 3, wherein the second wiring is the same as a wiring which controls the third switch.

8. The semiconductor device according to claim 4, wherein the second wiring is the same as a wiring which controls the third switch.

9. The semiconductor device according to claim 1, wherein the second wiring is any one of scan lines which controls the first to fourth switches of a previous row and a following row.

10. The semiconductor device according to claim 2, wherein the second wiring is any one of scan lines which controls the first to fourth switches of a previous row and a following row.

11. The semiconductor device according to claim 3, wherein the second wiring is any one of scan lines which controls the first to fourth switches of a previous row and a following row.

12. The semiconductor device according to claim 4, wherein the second wiring is any one of scan lines which controls the first to fourth switches of a previous row and a following row.

13. The semiconductor device according to claim 1, wherein the transistor is a thin film transistor.

14. The semiconductor device according to claim 2, wherein the transistor is a thin film transistor.

15. The semiconductor device according to claim 3, wherein the transistor is a thin film transistor.

16. The semiconductor device according to claim 4, wherein the transistor is a thin film transistor.

17. The semiconductor device according to claim 1, wherein the transistor is an N-channel transistor.

18. The semiconductor device according to claim 2, wherein the transistor is an N-channel transistor.

19. The semiconductor device according to claim 3, wherein the transistor is an N-channel transistor.

20. The semiconductor device according to claim 4, wherein the transistor is an N-channel transistor.

21. The semiconductor device according to claim 1, wherein a semiconductor layer of the transistor is formed of a non-crystalline semiconductor film.

22. The semiconductor device according to claim 2, wherein a semiconductor layer of the transistor is formed of a non-crystalline semiconductor film.

23. The semiconductor device according to claim 3, wherein a semiconductor layer of the transistor is formed of a non-crystalline semiconductor film.

24. The semiconductor device according to claim 4, wherein a semiconductor layer of the transistor is formed of a non-crystalline semiconductor film.

25. The semiconductor device according to claim 1, wherein a semiconductor layer of the transistor is formed of amorphous silicon.

26. The semiconductor device according to claim 2, wherein a semiconductor layer of the transistor is formed of amorphous silicon.

27. The semiconductor device according to claim 3, wherein a semiconductor layer of the transistor is formed of amorphous silicon.

28. The semiconductor device according to claim 4, wherein a semiconductor layer of the transistor is formed of amorphous silicon.

29. The semiconductor device according to claim 1, wherein a semiconductor layer of the transistor is formed of a crystalline semiconductor film.

30. The semiconductor device according to claim 2, wherein a semiconductor layer of the transistor is formed of a crystalline semiconductor film.

31. The semiconductor device according to claim 3, wherein a semiconductor layer of the transistor is formed of a crystalline semiconductor film.

32. The semiconductor device according to claim 4, wherein a semiconductor layer of the transistor is formed of a crystalline semiconductor film.

33. The semiconductor device according to claim 1, wherein a potential inputted to the first wiring is a value of V1 or a value of V2;

wherein the potential inputted to the first wiring is the value of V2 only when the first to third switches are turned off and the fourth switch is turned on;

wherein the value of V1 is higher than a potential inputted to the second wiring;

wherein a difference between the potential of V1 and the potential inputted to the second wiring is larger than a threshold voltage of the transistor; and wherein the value of V2 is larger than the value of V1.

34. The semiconductor device according to claim 2, wherein a potential inputted to the first wiring is a value of V1 or a value of V2;

wherein the potential inputted to the first wiring is the value of V2 only when the first to third switches are turned off and the fourth switch is turned on;

wherein the value of V1 is higher than a potential inputted to the second wiring;

wherein a difference between the potential of V1 and the potential inputted to the second wiring is larger than a threshold voltage of the transistor; and wherein the value of V2 is larger than the value of V1.

35. The semiconductor device according to claim 3, wherein a potential inputted to the first wiring is a value of V1 or a value of V2;

wherein the potential inputted to the first wiring is the value of V2 only when the first to third switches are turned off and the fourth switch is turned on;

wherein the value of V1 is higher than a potential inputted to the second wiring;

wherein a difference between the potential of V1 and the potential inputted to the second wiring is larger than a threshold voltage of the transistor; and wherein the value of V2 is larger than the value of V1.

36. The semiconductor device according to claim 4, wherein a potential inputted to the first wiring is a value of V1 or a value of lnposelstartlnposelendlnposelstartlnposelendV2;

wherein the potential inputted to the first wiring is the value of V2 only when the first to third switches are turned off and the fourth switch is turned on;

wherein the value of V1 is higher than a potential inputted to the second wiring;

wherein a difference between the potential of V1 and the potential inputted to the second wiring is larger than a threshold voltage of the transistor; and wherein the value of V2 is larger than the value of V1.

37. The semiconductor device according to claim 1, wherein the transistor is a P-channel transistor.

38. The semiconductor device according to claim 2, wherein the transistor is a P-channel transistor.

39. The semiconductor device according to claim 3, wherein the transistor is a P-channel transistor.

40. The semiconductor device according to claim 4, wherein the transistor is a P-channel transistor.

41. The semiconductor device according to claim 1,
wherein a potential inputted to the first wiring is a value of V1 or a value of V2;
wherein the potential inputted to the first wiring is the value of V2 only when the first to third switches are turned off and the fourth switch is turned on;
wherein the value of V1 is lower than a potential inputted to the second wiring;
wherein a difference between the potential of V1 and the potential inputted to the second wiring is larger than an absolute value of a threshold voltage of the transistor; and
wherein the value of V2 is smaller than the value of V1.

42. The semiconductor device according to claim 2,
wherein a potential inputted to the first wiring is a value of V1 or a value of V2;
wherein the potential inputted to the first wiring is the value of V2 only when the first to third switches are turned off and the fourth switch is turned on;
wherein the value of V1 is lower than a potential inputted to the second wiring;
wherein a difference between the potential of V1 and the potential inputted to the second wiring is larger than an absolute value of a threshold voltage of the transistor; and
wherein the value of V2 is smaller than the value of V1.

43. The semiconductor device according to claim 3,
wherein a potential inputted to the first wiring is a value of V1 or a value of V2;
wherein the potential inputted to the first wiring is the value of V2 only when the first to third switches are turned off and the fourth switch is turned on;
wherein the value of V1 is lower than a potential inputted to the second wiring;
wherein a difference between the potential of V1 and the potential inputted to the second wiring is larger than an absolute value of a threshold voltage of the transistor; and
wherein the value of V2 is smaller than the value of V1.

44. The semiconductor device according to claim 4,
wherein a potential inputted to the first wiring is a value of V1 or a value of V2;
wherein the potential inputted to the first wiring is the value of V2 only when the first to third switches are turned off and the fourth switch is turned on;
wherein the value of V1 is lower than a potential inputted to the second wiring;
wherein a difference between the potential of V1 and the potential inputted to the second wiring is larger than an absolute value of a threshold voltage of the transistor; and
wherein the value of V2 is smaller than the value of V1.

45. The semiconductor device according to claim 1, wherein the first to fourth switches are transistors.

46. The semiconductor device according to claim 2, wherein the first to fourth switches are transistors.

47. The semiconductor device according to claim 3, wherein the first to fourth switches are transistors.

48. The semiconductor device according to claim 4, wherein the first to fourth switches are transistors.

49. A semiconductor device comprising:
a transistor, one of a source electrode and a drain electrode of which is electrically connected to a first wiring and another one of the source electrode and the drain electrode of which is electrically connected to a second wiring;
a storage capacitor which holds a gate-source voltage of the transistor;
means which makes the storage capacitor hold a first voltage by applying a first potential inputted to the first wiring to one of electrodes of the storage capacitor and applying a second potential inputted to the second wiring to another one of the electrodes of the storage capacitor, wherein a gate of the transistor is in a floating state;
means which lowers a voltage of the storage capacitor down to a second voltage;
means which makes the storage capacitor hold a fifth voltage which is a sum of the second voltage and a fourth voltage by applying a potential which is a sum of the first potential and a third voltage to the one of the electrodes of the storage capacitor; and
means which supplies a current flowing the transistor to a load by inputting a third potential which is different from the first potential to the first wiring.

50. A semiconductor device comprising:
a transistor, one of a source electrode and a drain electrode of which is electrically connected to a first wiring and another one of the source electrode and the drain electrode of which is electrically connected to a second wiring;
a storage capacitor which holds a gate-source voltage of the transistor;
means which makes the storage capacitor hold a first voltage by applying a first potential inputted to the first wiring to one of electrodes of the storage capacitor and applying a second potential inputted to the second wiring to another one of the electrodes of the storage capacitor, wherein a gate of the transistor is a floating state;
means which lowers a voltage of the storage capacitor down to a threshold voltage of the transistor;
means which makes the storage capacitor hold a fourth voltage which is a sum of the threshold voltage of the transistor and a third voltage by applying a potential which is the sum of the first potential and a second voltage to one of the electrodes of the storage capacitor; and
means which supplies a current flowing the transistor to a load by inputting a third potential which is different from the first potential to the first wiring.

51. The semiconductor device according to claim 49, wherein the transistor is a thin film transistor.

52. The semiconductor device according to claim 50, wherein the transistor is a thin film transistor.

53. The semiconductor device according to claim 49, wherein the transistor is an N-channel transistor.

54. The semiconductor device according to claim 50, wherein the transistor is an N-channel transistor.

55. The semiconductor device according to claim 49, wherein a semiconductor layer of the transistor is formed of a non-crystalline semiconductor film.

56. The semiconductor device according to claim 50, wherein a semiconductor layer of the transistor is formed of a non-crystalline semiconductor film.

57. The semiconductor device according to claim 49, wherein a semiconductor layer of the transistor is formed of amorphous silicon.

58. The semiconductor device according to claim 50, wherein a semiconductor layer of the transistor is formed of amorphous silicon.

59. The semiconductor device according to claim 49, wherein a semiconductor layer of the transistor is formed of a crystalline semiconductor film.

60. The semiconductor device according to claim 50, wherein a semiconductor layer of the transistor is formed of a crystalline semiconductor film.

61. The semiconductor device according to claim 49, wherein the first potential is higher than the second potential;
   wherein a difference between the first potential and the second potential is larger than a threshold voltage of the transistor; and
   wherein the first potential is lower than the third potential.

62. The semiconductor device according to claim 50,
   wherein the first potential is higher than the second potential;
   wherein a difference between the first potential and the second potential is larger than the threshold voltage of the transistor; and
   wherein the first potential is lower than the third potential.

63. The semiconductor device according to claim 49, wherein the transistor is a P-channel transistor.

64. The semiconductor device according to claim 50, wherein the transistor is a P-channel transistor.

65. The semiconductor device according to claim 49,
   wherein the first potential is lower than the second potential;
   wherein a difference between the first potential and the second potential is larger than an absolute value of a threshold voltage of the transistor; and
   wherein the first potential is higher than the third potential.

66. The semiconductor device according to claim 50,
   wherein the first potential is lower than the second potential;
   wherein a difference between the first potential and the second potential is larger than an absolute value of the threshold voltage of the transistor; and
   wherein the first potential is higher than the third potential.

67. A display device comprising the semiconductor device according to claim 1.

68. A display device comprising the semiconductor device according to claim 2.

69. A display device comprising the semiconductor device according to claim 3.

70. A display device comprising the semiconductor device according to claim 4.

71. A display device comprising the semiconductor device according to claim 49.

72. A display device comprising the semiconductor device according to claim 50.

73. An electronic device comprising the display device according to claim 67 in a display portion.

74. An electronic device comprising the display device according to claim 68 in a display portion.

75. An electronic device comprising the display device according to claim 69 in a display portion.

76. An electronic device comprising the display device according to claim 70 in a display portion.

77. An electronic device comprising the display device according to claim 71 in a display portion.

78. An electronic device comprising the display device according to claim 72 in a display portion.

* * * * *